(12) United States Patent
Shibazaki et al.

(10) Patent No.: US 8,023,106 B2
(45) Date of Patent: Sep. 20, 2011

(54) MOVABLE BODY DRIVE METHOD AND MOVABLE BODY DRIVE SYSTEM, PATTERN FORMATION METHOD AND APPARATUS, EXPOSURE METHOD AND APPARATUS, AND DEVICE MANUFACTURING METHOD

(75) Inventors: Yuichi Shibazaki, Kumagaya (JP); Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 562 days.

(21) Appl. No.: 12/196,013

(22) Filed: Aug. 21, 2008

(65) Prior Publication Data

US 2009/0053629 A1 Feb. 26, 2009

Related U.S. Application Data

(60) Provisional application No. 60/935,666, filed on Aug. 24, 2007.

(51) Int. Cl.
*G03B 27/58* (2006.01)
*G03B 27/42* (2006.01)
(52) U.S. Cl. ............................................ 355/72; 355/53
(58) Field of Classification Search ................... 355/53, 355/72–76; 310/10, 12; 318/640, 649
See application file for complete search history.

(56) References Cited

U.S. PATENT DOCUMENTS

| | | | |
|---|---|---|---|
| 4,465,368 A | 8/1984 | Matsuura et al. | |
| 4,780,617 A | 10/1988 | Umatate et al. | |
| 5,003,342 A | 3/1991 | Nishi | |
| 5,448,332 A | 9/1995 | Sakakibara et al. | |
| 5,969,441 A | 10/1999 | Loopstra et al. | |
| 6,208,407 B1 | 3/2001 | Loopstra | |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,819,433 B2 | 11/2004 | Takai et al. | |
| 6,897,963 B1 * | 5/2005 | Taniguchi et al. | 356/500 |
| 6,952,253 B2 | 10/2005 | Lof et al. | |
| 7,023,610 B2 | 4/2006 | Ohtsuki et al. | |

(Continued)

FOREIGN PATENT DOCUMENTS

EP 0 834 773 A2 4/1998

(Continued)

OTHER PUBLICATIONS

Dec. 5, 2008 Written Opinion of the International Searching Authority in Application No. PCT/JP2008/065610).

(Continued)

*Primary Examiner* — Hung Henry Nguyen
(74) *Attorney, Agent, or Firm* — Oliff & Berridge, PLC

(57) ABSTRACT

Positional information of a wafer stage in a Z-axis direction and a tilt direction with respect to the XY plane (for example, a θy direction) is measured, using a surface position measurement system, such as, for example, a Z head and the like, and the wafer stage is driven based on the measurement results. At the same time, positional information of the wafer stage is measured using an interferometer system such as, for example, a Z interferometer. When abnormality of the surface position measurement system is detected or when the wafer stage moves off from a measurement area of the surface position measurement system, drive control is switched to a drive control based on the measurement results of the interferometer system. Accordingly, the wafer stage can be driven continuously even at the time of abnormality generation in the surface position measurement system.

27 Claims, 31 Drawing Sheets

U.S. PATENT DOCUMENTS

| | | | |
|---|---|---|---|
| 2002/0041377 A1 | 4/2002 | Hagiwara et al. |
| 2002/0061469 A1 | 5/2002 | Tanaka |
| 2003/0025890 A1 | 2/2003 | Nishinaga |
| 2003/0165265 A1 | 9/2003 | Kurosawa |
| 2005/0248856 A1 | 11/2005 | Omura et al. |
| 2005/0280791 A1 | 12/2005 | Nagasaka et al. |
| 2006/0231206 A1 | 10/2006 | Nagasaka et al. |
| 2006/0238731 A1 | 10/2006 | Beems et al. |
| 2007/0051160 A1 | 3/2007 | Pril et al. |
| 2007/0263191 A1 | 11/2007 | Shibazaki |
| 2008/0043212 A1 | 2/2008 | Shibazaki |
| 2008/0088843 A1 | 4/2008 | Shibazaki |

FOREIGN PATENT DOCUMENTS

| | | |
|---|---|---|
| EP | 1 079 223 A1 | 2/2001 |
| EP | 1 420 298 A2 | 5/2004 |
| EP | 1 582 933 A2 | 10/2005 |
| EP | 1 621 933 A2 | 2/2006 |
| EP | 1 630 585 A1 | 3/2006 |
| EP | 1 715 384 A2 | 10/2006 |
| JP | A-57-117238 | 7/1982 |
| JP | A-61-044429 | 3/1986 |
| JP | A-06-241720 | 9/1994 |
| JP | A-06-283403 | 10/1994 |
| JP | A-10-163099 | 6/1998 |
| JP | A-10-214783 | 8/1998 |
| JP | A-11-016816 | 1/1999 |
| JP | A-2000-505958 | 5/2000 |
| JP | A-2001-313250 | 11/2001 |
| JP | A-2002-014005 | 1/2002 |
| JP | A-2004-519850 | 7/2004 |
| JP | A-2004-289126 | 10/2004 |
| WO | WO 99/46835 A1 | 9/1999 |
| WO | WO 99/49504 A1 | 9/1999 |
| WO | WO 99/60361 A1 | 11/1999 |
| WO | WO 01/35168 A1 | 5/2001 |
| WO | WO 03/065428 A1 | 8/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057590 A1 | 7/2004 |
| WO | WO 2004/086468 A1 | 10/2004 |
| WO | WO 2004/107011 A1 | 12/2004 |
| WO | WO 2005/029559 A1 | 3/2005 |
| WO | WO 2005/059617 A2 | 6/2005 |
| WO | WO 2005/059618 A2 | 6/2005 |
| WO | WO 2005/124834 A1 | 12/2005 |
| WO | WO 2006/038952 A2 | 4/2006 |

OTHER PUBLICATIONS

English translation of WO 2004/053955 A1.
English translation of WO 03/065428.
English translation of WO 2005/124834.

* cited by examiner

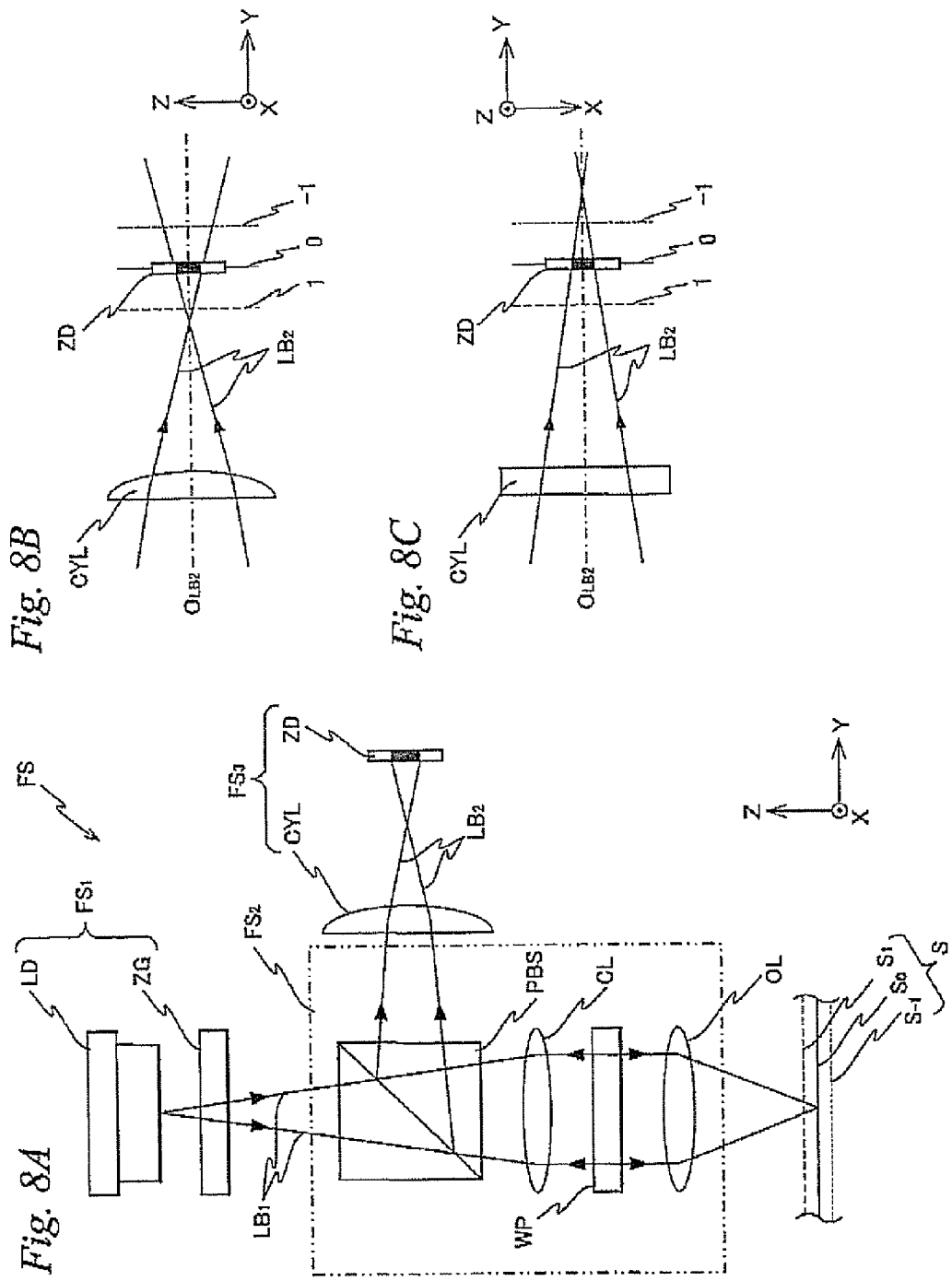

Fig. 9A
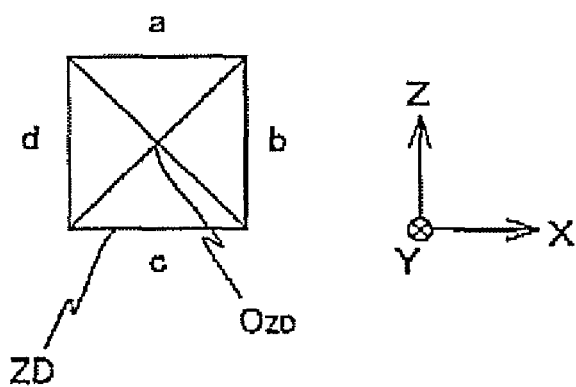
Fig. 9B      Fig. 9C      Fig. 9D
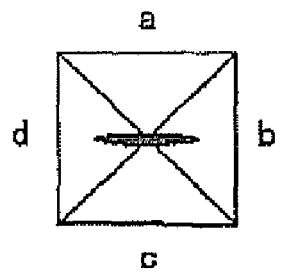 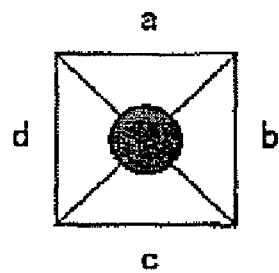 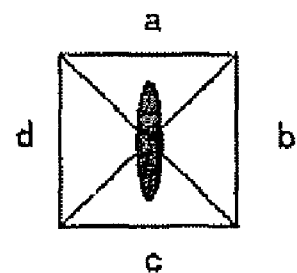

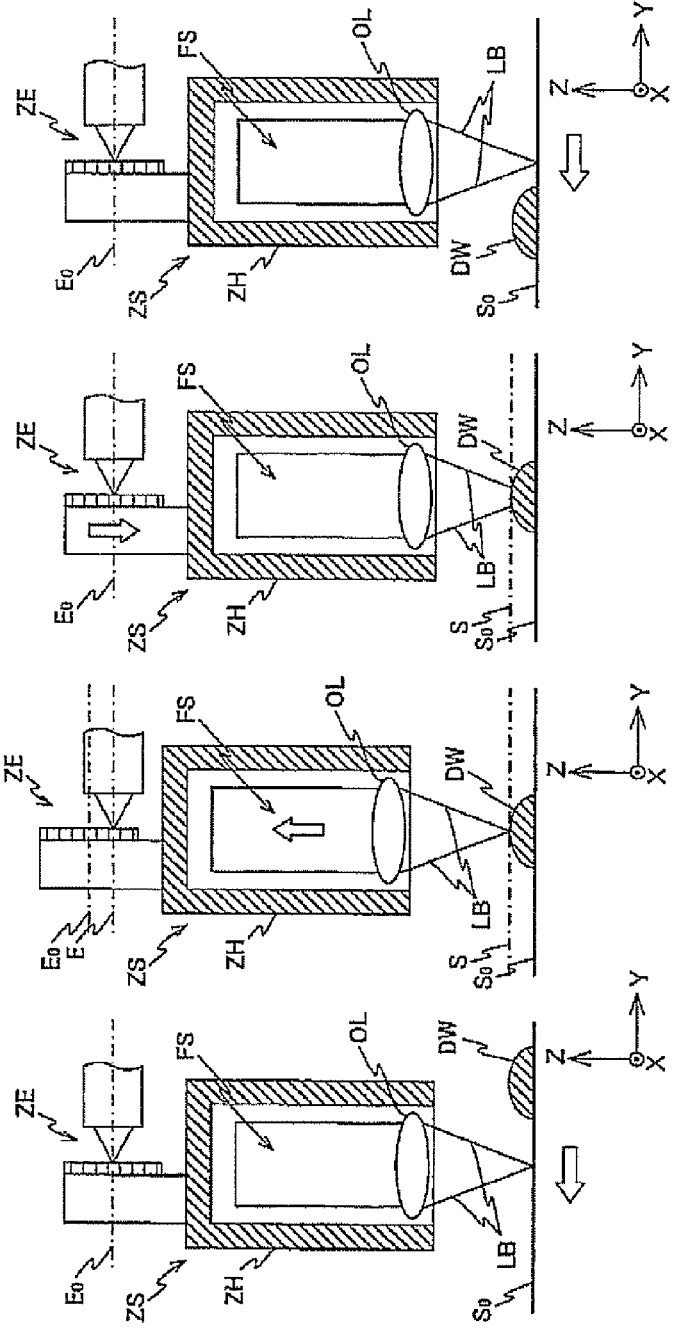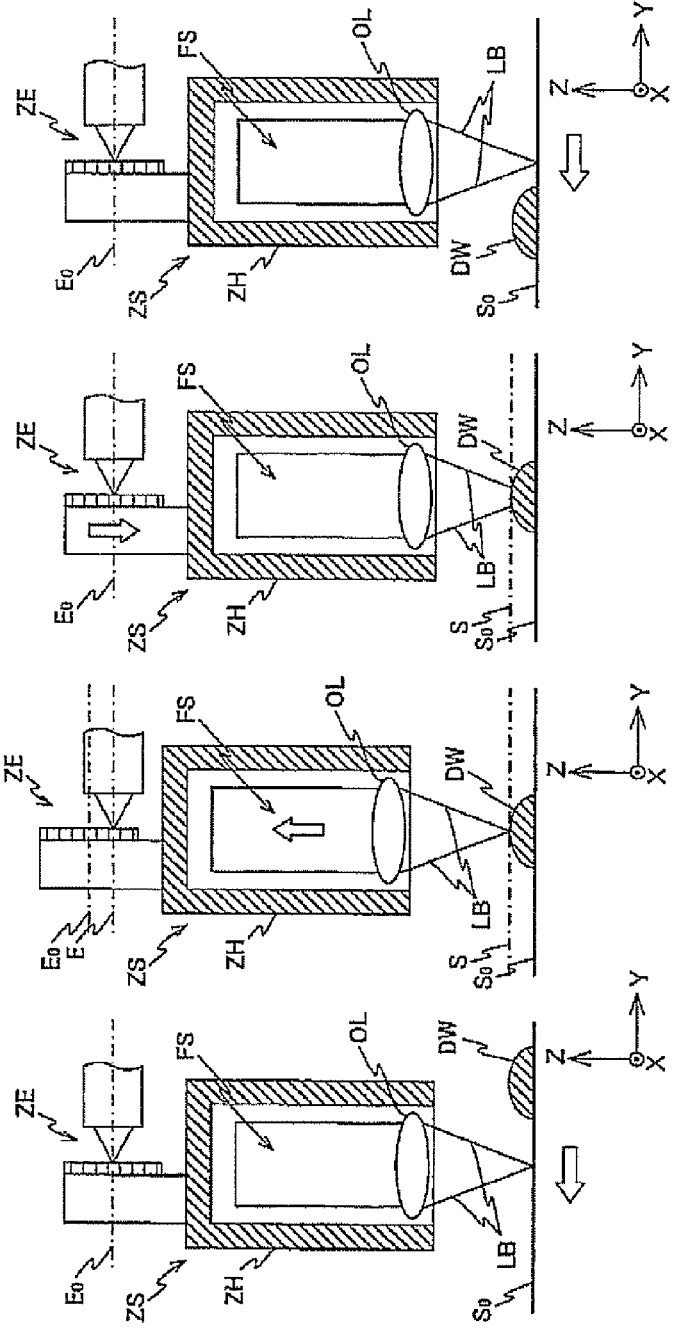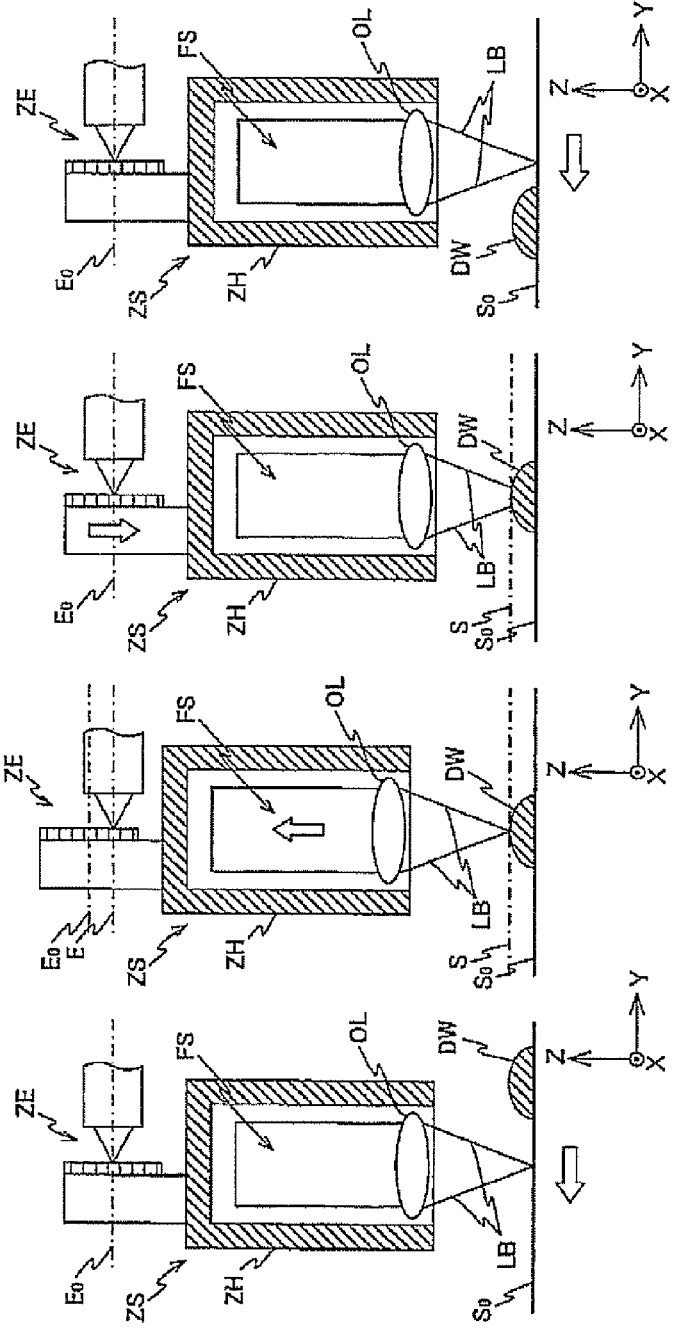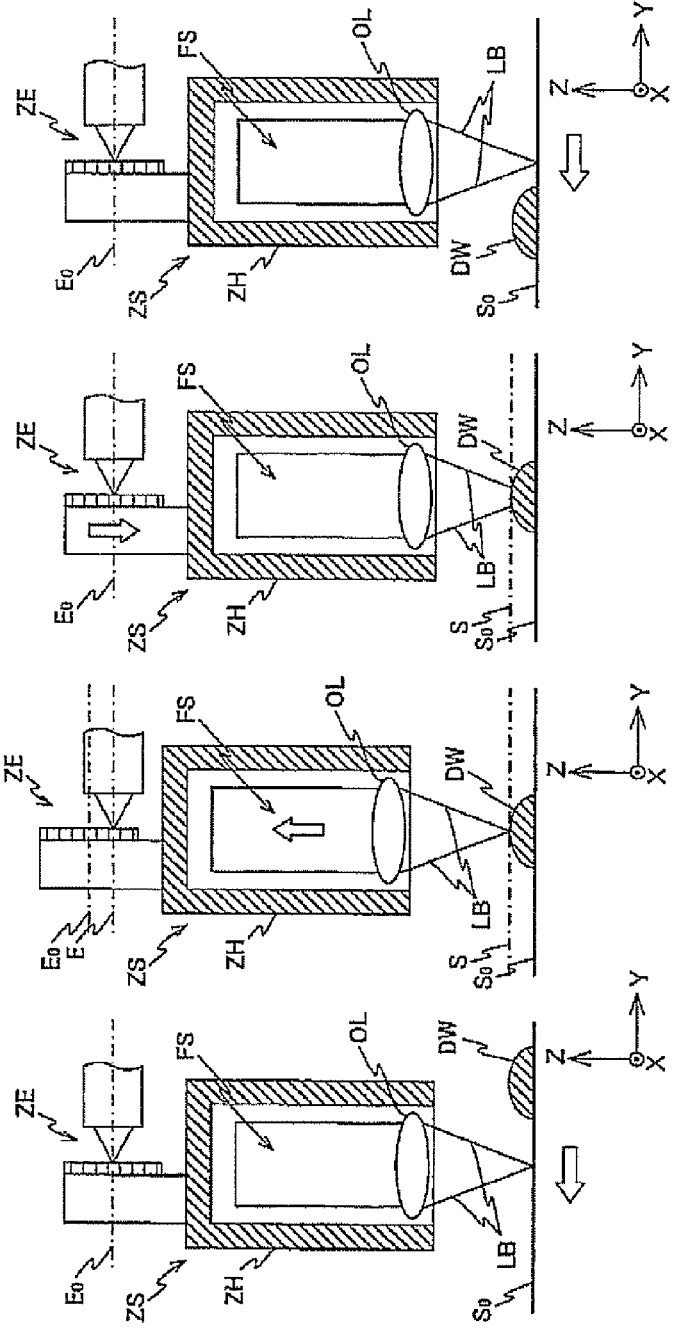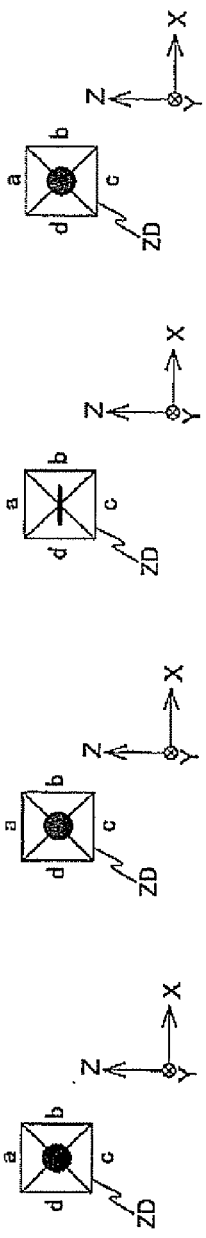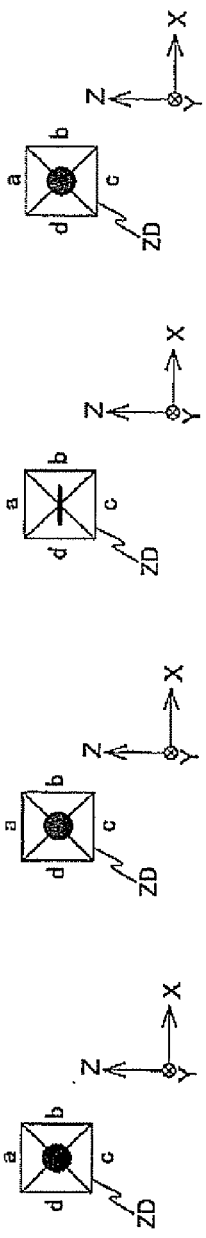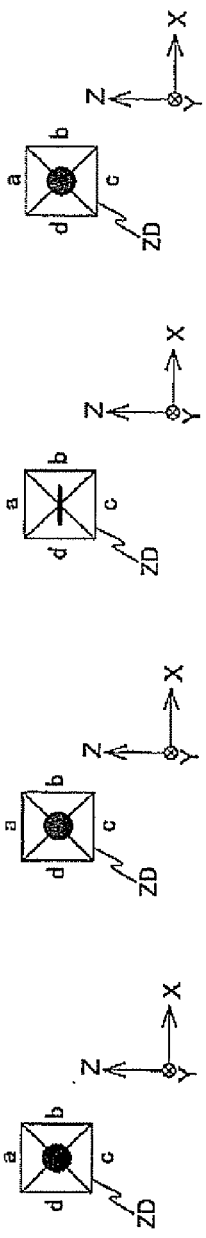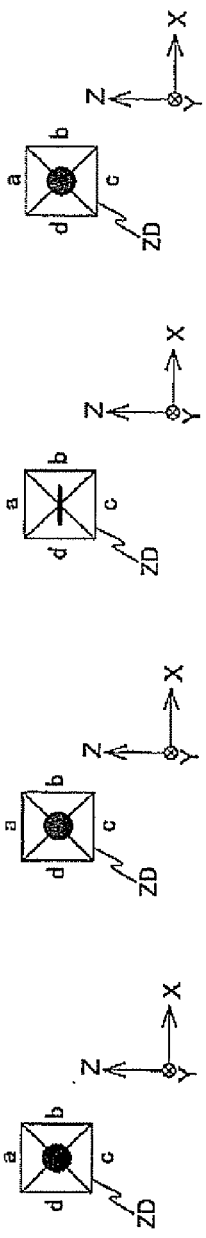

MOVABLE BODY DRIVE METHOD AND MOVABLE BODY DRIVE SYSTEM, PATTERN FORMATION METHOD AND APPARATUS, EXPOSURE METHOD AND APPARATUS, AND DEVICE MANUFACTURING METHOD

CROSS-REFERENCE TO RELATED APPLICATIONS

This non-provisional application claims the benefit of Provisional Application No. 60/935,666 filed Aug. 24, 2007, the disclosure of which is hereby incorporated herein by reference in its entirety.

BACKGROUND OF THE INVENTION

1. Field of the Invention

The present invention relates to movable body drive methods and movable body drive systems, pattern formation methods and apparatuses, exposure methods and apparatuses, and device manufacturing methods, and more particularly, to a movable body drive method and a movable body drive system that drives a movable body along a substantially two-dimensional plane, a pattern formation method using the movable body drive method and a pattern formation apparatus equipped with the movable body drive system, an exposure method using the movable body drive method, and an exposure apparatus equipped with the movable body drive system, and a device manufacturing method using the pattern formation method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

However, the surface of a wafer serving as a substrate subject to exposure is not always flat, for example, by undulation and the like of the wafer. Therefore, especially in a scanning exposure apparatus such as a scanner and the like, when a reticle pattern is transferred onto a shot area on a wafer by a scanning exposure method, positional information (surface position information) related to an optical axis direction of a projection optical system of the wafer surface is detected at a plurality of detection points set in an exposure area, for example, using a multiple point focal point position detection system (hereinafter also referred to as a "multipoint AF system") and the like, and based on the detection results, a so-called focus leveling control is performed (refer to, for example, U.S. Pat. No. 5,448,332) to control the position in the optical axis direction and the inclination of a table (or a stage) holding a wafer so that the wafer surface constantly coincides with an image plane of the projection optical system in the exposure area (the wafer surface is within the focal depth of the image plane).

Further, with the stepper or the scanner or the like, wavelength of exposure light used with finer integrated circuits is becoming shorter year by year, and numerical aperture of the projection optical system is also gradually increasing (higher NA), which improves the resolution. Meanwhile, due to shorter wavelength of the exposure light and higher NA in the projection optical system, the depth of focus had become extremely small, which caused a risk of focus margin shortage during the exposure operation. Therefore, as a method of substantially shortening the exposure wavelength while substantially increasing (widening) the depth of focus when compared with the depth of focus in the air, the exposure apparatus that uses the immersion method has recently begun to gather attention (refer to, for example, the pamphlet of International Publication No. 2004/053955).

However, in the exposure apparatus using this liquid immersion method or other exposure apparatus whose distance (working distance) between the lower end surface of the projection optical system and the wafer is small, it is difficult to place the multipoint AF system in the vicinity of the projection optical system. Meanwhile, in the exposure apparatus, in order to realize exposure with high precision, realizing surface position control of the wafer with high precision is required.

Further, with the stepper or the scanner or the like, position measurement of the stage (the table) which holds a substrate (for example, a wafer) subject to exposure was performed in general, using a laser interferometer having a high resolution. However, the optical path length of the laser interferometry beam which measures the position of the stage is around several hundred mm or more, and furthermore, due to finer patterns owing to higher integration of semiconductor devices, position control of the stage with higher precision is becoming required. Therefore, short-term variation of measurement values which is caused by air fluctuation which occurs due to the influence of temperature fluctuation or temperature gradient of the atmosphere on the beam optical path of the laser interferometer can no longer be ignored.

Therefore, it can be considered that position control of the table in the optical axis direction and in a tilt direction with respect to the surface orthogonal to the optical axis, including the focus leveling control of the wafer during exposure, using a detection device which detects the surface position information of the table, is to be performed together with the interferometer. However, in such a case, countermeasures against times such as sudden output abnormality of the detection device are required.

SUMMARY OF THE INVENTION

According to a first aspect of the present invention, there is provided a first movable body drive method in which a movable body is driven substantially along a two-dimensional planet the method comprising: a first process in which positional information of the movable body related to at least one of a direction perpendicular to the two-dimensional plane and a tilt direction with respect to the two-dimensional plane is detected, using a first detection device that has one, or more than one detection positions placed in at least a part of an operating area of the movable body, and detects positional information of the movable body in the direction perpendicular to the two-dimensional plane using detection information detected when the movable body is positioned at any one of the detection points, and a second detection device that detects positional information of the movable body in the direction perpendicular to the two-dimensional plane from measurement results using a measurement beam irradiated along the two-dimensional plane between the outside of the operating area of the movable body and the movable body, and the movable body is driven in at least one of the direction perpendicular to the two-dimensional plane and the tilt direction with respect to the two-dimensional plane based on detection results of the first detection device; a second process in which relation information between a first positional information of the movable body computed from detection information of the first detection device and a second positional information of the movable body computed from detection information of the second detection device is updated at every predetermined timing; and a third process in which when abnormality occurring in an output of the first detection device has been detected, the detection device used for drive control of the movable body in at least one of the direction perpendicular to the two-dimensional plane and the tilt direction with respect to the two-dimensional plane is switched from the first detection device to the second detection device.

According to this method, when abnormality occurring in the output of the first detection device has been detected, the detection device used for drive control of at least one of the direction perpendicular to the two-dimensional plane and the tilt direction with respect to the two-dimensional plane is switched from the first detection device to the second detection device. Accordingly, backup by the second detection device in which output abnormality is remarkably hard to occur when compared with the first detection device from the measurement principle, becomes possible at the time of generation of output abnormality in the first detection device.

According to a second aspect of the present invention, there is provided a second movable body drive method in which a movable body is driven substantially along a two-dimensional plane, the method comprising: a first process in which positional information of the movable body in directions of three degrees of freedom within a plane parallel to the two-dimensional plane is detected, using a first detection device which detects positional information in directions of three degrees of freedom within the plane parallel to the two-dimensional plane from measurement results using a measurement beam irradiated along the two-dimensional plane between the outside of the operating area of the movable body and the movable body, and positional information of the movable body in a direction perpendicular to the two-dimensional plane and a tilt direction with respect to the two-dimensional plane is also detected, using a second detection device which detects positional information of the movable body in a direction perpendicular to the two-dimensional plane and a tilt direction with respect to the two-dimensional plane from measurement results using a measurement beam irradiated along the two-dimensional plane between the outside of the operating area of the movable body and the movable body; and a second process in which on switching from servo control of the position in the directions of three degrees of freedom of the movable body using the first detection device to servo control of the position in the directions of three degrees of freedom of the movable body using an encoder system, a detection device that detects positional information of the movable body in the direction perpendicular to the two-dimensional plane and the tilt direction around at least one axis with respect to the two-dimensional plane is switched from the second detection device when the movable body is in a suspended state, to a third detection device that has a plurality of detection positions placed in at least a part of an operating area of the movable body, and detects positional information of the movable body in the direction perpendicular to the two-dimensional plane using detection information detected when the movable body is positioned at any one of the detection positions.

According to this method, the detection device which detects positional information of the movable body in the direction perpendicular to the two-dimensional plane and the tilt direction around at least one axis with respect to the two-dimensional plane is switched from the second detection device when the movable body is in a suspended state to the third detection device, on switching from servo control of the position in the directions of three degrees of freedom of the movable body using the first detection device to servo control of the position in the directions of three degrees of freedom of the movable body using the encoder system. Because the switching from the second detection device to the third detection device is performed with the movable body in a suspended state as described above, even if discontinuity occurs between the position of the movable body related to the direction perpendicular to the two-dimensional plane and the tilt direction around at least one axis with respect to the two-dimensional plane computed by the second detection device and the position of the movable body related to the direction perpendicular to the two-dimensional plane and the tilt direction around at least one axis with respect to the two-dimensional plane computed by the third detection device before and after the switching, switching from the second detection device to the third detection device can be performed without any trouble.

According to a third aspect of the present invention, there is provided a third movable body drive method in which a movable body is driven substantially along a two-dimensional plane, the method comprising: a first process in which the movable body is driven based on an output of a first detection device that has a plurality of detection positions placed in at least a part of an operating area of the movable body, and detects positional information of the movable body in a direction perpendicular to the two-dimensional plane using detection information detected when the movable body is positioned at any one of the detection positions, and the output of an encoder system that measures positional information of the movable body within a plane parallel to the two-dimensional plane in directions of three degrees of freedom; and a second process in which in the case of switching from servo control of the position of the movable body in the directions of three degrees of freedom using the encoder system, to a control of the position of the movable body in the directions of three degrees of freedom using a second detection device that detects positional information in directions of three degrees of freedom within a plane parallel to the two-dimensional plane from measurement results using a measurement beam irradiated along the two-dimensional plane between the outside of the operating are of the movable body and the movable body, a detection device used for control of the position of the movable body in the remaining directions of three degrees of freedom is switched from the first detection device to a third detection device that detects positional information of the movable body in the direction perpendicular to the two-dimensional plane and a tilt direction with respect to the two-dimensional plane from measurement results using a measurement beam irradiated along the two-dimensional plane between the outside of the operating area of the movable body and the movable body at the point where the movable body is suspended.

According to this method, in the case of switching from servo control of the position of the movable body in the directions of three degrees of freedom using the encoder system, to a control of the position of the movable body in the directions of three degrees of freedom using a second detection device, the detection device used for control of the remaining directions of three degrees of freedom is switched from the first detection device to the third detection device at the point where the movable body is suspended. Because the switching from the first detection device to the third detection device is performed at the point where the movable body is suspended in the manner described above, the switching from the first detection device to the third detection device can be performed without any trouble in particular, even if discontinuity occurs in the computed position of the movable body before and after the switching.

According to a fourth aspect of the present invention, there is provided a pattern formation method to form a pattern on an object wherein a movable body on which the object is mounted is driven using any one of the first to third movable body drive method of the present invention to perform pattern formation to the object.

According to this method, by forming a pattern on the object mounted on the movable body which is driven using one of the first to third movable body drive methods of the present invention, it becomes possible to form a pattern on the object with good accuracy.

According to a fifth aspect of the present invention, there is provided a device manufacturing method including a pattern formation process wherein in the pattern formation process, a pattern is formed on a substrate using the pattern formation method of the present invention.

According to a sixth aspect of the present invention, there is provided an exposure method in which a pattern is formed on an object by an irradiation of an energy beam wherein for relative movement of the energy beam and the object, a movable body on which the object is mounted is driven, using one of the first to third movable body drive methods of the present invention.

According to this method, for relative movement of the energy beam irradiated on the object and the object, the movable body on which the object is mounted is driven with good precision, using one of the first to third movable body drive methods of the present invention. Accordingly, it becomes possible to form a pattern on the object with good precision by scanning exposure.

According to a seventh aspect of the present invention, there is provided a first movable body drive system in which a movable body is driven substantially along a two-dimensional plane, the system comprising: a first detection device that has at least one detection position placed in at least a part of an operating area of the movable body, and detects positional information of the movable body in a direction perpendicular to the two-dimensional plane using detection information detected when the movable body is positioned at any one of the detection points; a second detection device that detects positional information of the movable body in the direction perpendicular to the two-dimensional plane from measurement results using a measurement beam irradiated along the two-dimensional plane between the outside of the operating area of the movable body and the movable body; and a controller that drives the movable body at least one of a direction perpendicular to the two-dimensional plane and a tilt direction with respect to the two-dimensional plane based on detection results of the first detection device, and also updates relation information between a first positional information computed from detection information of the first detection device and a second positional information computed from detection information of the second detection device at every predetermined timing, and when abnormality occurring in the output of the first detection device is detected, switches a detection device used for drive control of at least one of the direction perpendicular to the two-dimensional plane and a tilt direction with respect to the two-dimensional plane from the first detection device to the second detection device.

According to this system, when abnormality occurring in the output of the first detection device is detected by the controller, the detection device used for drive control of the movable body in at least one of the direction perpendicular to the two-dimensional plane and the tilt direction with respect to the two-dimensional plane is switched from the first detection device to the second detection device. Accordingly, backup by the second detection device in which output abnormality is remarkably hard to occur when compared with the first detection device from the measurement principle, becomes possible at the time of generation of output abnormality in the first detection device.

According to an eighth aspect of the present invention, there is provided a second movable body drive system in which a movable body is driven along a substantially two-dimensional plane, the system comprising: a first detection device that has a plurality of detection positions placed in at least a part of an operating area of the movable body, and detects positional information of the movable body in a direction perpendicular to the two-dimensional plane using detection information detected when the movable body is positioned at any one of the detection points; an encoder system that measures positional information of the movable body in directions of three degrees of freedom; a second detection device that detects positional information of the movable body in directions of three degrees of freedom within a plane parallel to the two-dimensional plane from measurement results using a measurement beam irradiated along the two-dimensional plane between the outside of the operating area of the movable body and the movable body; a third detection device that detects positional information of the movable body in a direction perpendicular to the two-dimensional plane and a tilt direction with respect to the two-dimensional plane from measurement results using a measurement beam irradiated along the two-dimensional plane between the outside of the operating area of the movable body and the movable body; and a controller that switches a detection device which detects positional information of the movable body in the direction perpendicular to the two-dimensional plane and the tilt direction around at least one axis with respect to the two-dimensional plane from the third detection device when the movable body is in a suspended state to the first detection device, on switching from servo control of the position in the directions of three degrees of freedom of the movable body using the second detection device to servo control of the position in the directions of three degrees of freedom of the movable body using the encoder system.

According to this system, because the switching from the second detection device to the third detection device is performed with the movable body in a suspended state as described above, even if discontinuity occurs between the position of the movable body related to the direction perpendicular to the two-dimensional plane and the tilt direction around at least one axis with respect to the two-dimensional plane computed by the first detection device and the position of the movable body related to the direction perpendicular to the two-dimensional plane and the tilt direction around at least one axis with respect to the two-dimensional plane computed by the third detection device before and after the switching, switching from the second detection device to the third detection device can be performed without any trouble.

According to a ninth aspect of the present invention, there is provided a third movable body drive system in which a movable body is driven along a substantially two-dimensional plane, the system comprising: a first detection device that has a plurality of detection positions placed in at least a part of an operating area of the movable body, and detects positional information of the movable body in a direction perpendicular to the two-dimensional plane using detection information detected when the movable body is positioned at any one of the detection points; an encoder system that measures positional information of the movable body within a plane parallel to the two-dimensional plane in directions of three degrees of freedom; a second detection device that detects positional information of the movable body in directions of three degrees of freedom within a plane parallel to the two-dimensional plane from measurement results using a measurement beam irradiated along the two-dimensional plane between the outside of the operating area of the movable body and the movable body; a third detection device that detects positional information of the movable body in a direction perpendicular to the two-dimensional plane and a tilt direction with respect to the two-dimensional plane from measurement results using a measurement beam irradiated along the two-dimensional plane between the outside of the operating area of the movable body and the movable body; and a controller that switches a measurement device used for controlling the position of the movable body in the remaining directions of three degrees of freedom from the first detection device to the third detection device at the point where the movable body is suspended, in the case of switching from servo control of the position of the movable body using the encoder system to control of the position of the movable body in the directions of three degrees of freedom using the second detection device.

According to this system, because the switching from the first detection device to the third detection device is performed at the point where the movable body is suspended in the manner described above, the switching from the first detection device to the third detection device can be performed without any trouble in particular, even if discontinuity occurs in the computed position of the movable body before and after the switching.

According to a tenth aspect of the present invention, there is provided a pattern forming apparatus that forms a pattern on an objects the apparatus comprising: a patterning device which generates a pattern on the object; and one of the first to third movable body drive systems of the present invention, wherein drive of a movable body on which the object is mounted is performed by the movable body drive system for pattern formation with respect to the object.

According to this apparatus, by generating a pattern with a patterning unit on the object on the movable body driven with good precision by any one of the first to third movable body drive systems of the present invention, it becomes possible to form a pattern on the object with good precision.

According to an eleventh aspect of the present invention, there is provided an exposure apparatus that forms a pattern on an object by an irradiation of an energy beam, the apparatus comprising: a patterning device that irradiates the energy beam on the object; and one of the first to third movable body drive systems of the present invention, wherein the movable body drive system drives the movable body on which the object is mounted for relative movement of the energy beam and the object.

According to this apparatus, for relative movement of the energy beam irradiated on the object from the patterning unit and the object, the movable body on which the object is mounted is driven with good precision by one of the first and second movable body drive system of the present invention. Accordingly, it becomes possible to form a pattern on the object with good precision by scanning exposure.

BRIEF DESCRIPTION OF THE DRAWINGS

In the accompanying drawings;

FIG. 8A is a view showing an example of a focus sensor, FIGS. 8B and 8C are views used to explain the shape and function of a cylindrical lens in FIG. 8A;

FIG. 9A is a view showing a divided state of a detection area of a tetrameric light receiving element, FIGS. 9B, 9C, and 9D are views respectively showing a cross-sectional shape of reflected beam $LB_2$ on a detection surface in a front-focused, an ideal focus, and a back-focused state;

FIGS. 30A to 30H are views to explain a handling procedure at the time of temporary abnormality output of the Z head, using the two states, which are scale servo and focus servo.

DESCRIPTION OF THE EMBODIMENTS

Hereinafter, an embodiment of the present invention will be described, referring to FIGS. 1 to 31.

Figure 1:
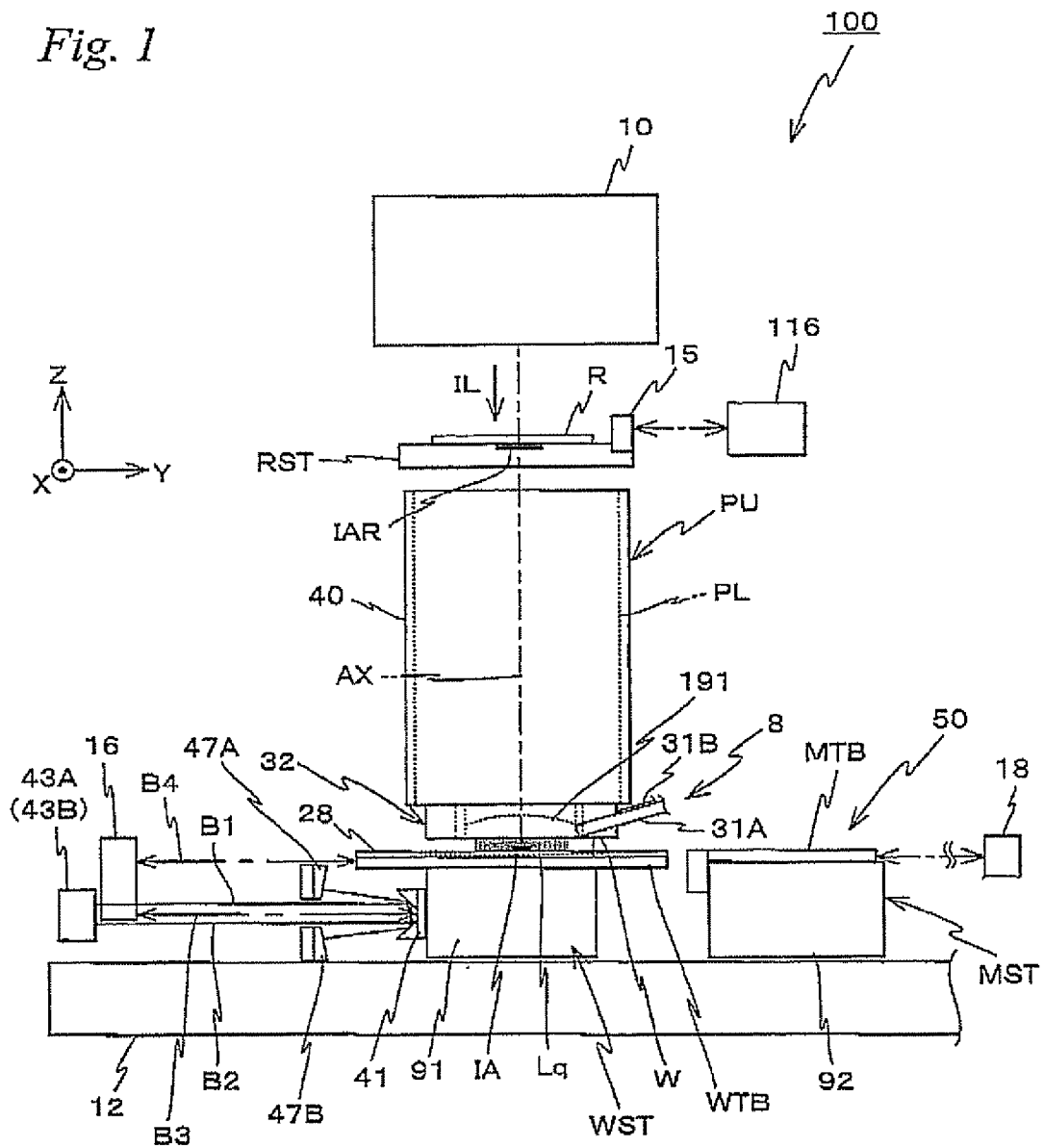
FIG. 1 is a view that schematically shows a configuration of an exposure apparatus of an embodiment.

FIG. 1 shows a schematic configuration of an exposure apparatus 100 in the embodiment. Exposure apparatus 100 is a scanning exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a water are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST that holds a reticle R that is illuminated by an illumination light for exposure (hereinafter, referred to as illumination light, or exposure light) IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025090 and the like. Illumination system 10 illuminates a slit-shaped illumination area IAR which is set on reticle R with a reticle blind (a masking system) by illumination light (exposure light) IL with a substantially uniform illuminance. In this case, as illumination light IL, for example, an ArF excimer laser beam (wavelength 193 nm) is used. Further, as the optical integrator, for example, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, For example, by vacuum chucking. Reticle stage RST is finely drivable or movable in within an XY plane by a reticle stage drive section 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a designated scanning speed.

The positional information (including position (rotation) information in the θz direction) of reticle stage RST in the XY plane (movement plane) is constantly detected, for example, at a resolution of around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 17 refer to FIG. 6). Main controller 20 computes the position of reticle stage RST in the X-axis direction, Y-axis direction, and the θz direction based on the measurement values of reticle interferometer 116, and also controls the position (and velocity) of reticle stage RST by controlling reticle stage drive section 11 based on the computation results. Incidentally, instead of movable mirror 15, the edge surface of reticle stage RSV can be mirror polished so as to form a reflection surface (corresponding to the reflection surface of movable mirror 15). Further, reticle interferometer 116 can measure positional information of reticle stage RST related to at least one of the Z-axis, θx, or θy directions.

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area TARP a reduced image of the circuit pattern (a reduced image of a part of the circuit pattern) of the reticle is formed within illumination area IAR, with illumination light IL that has passed through reticle R which is placed so that its pattern surface substantially coincides with a first plane (an object plane) of projection optical system PL, in an area conjugate to illumination area IAR on wafer W (exposure area) whose surface is coated with a resist (a photosensitive agent) and is placed on a second plane (an image plane) side, via projection optical system PL (projection unit PU). And by reticle stage RST and wafer stage WST being synchronously driven, the reticle is relatively moved in the scanning direction (the Y-axis direction) with respect to illumination area IAR (illumination light IL) while wafer W is relatively moved in the scanning direction (the Y-axis direction) with respect to the exposure area (illumination light IL), thus scanning exposure of a shot area (divided area) on wafer W is performed, and the pattern of the reticle is transferred onto the shot area. That is, in the embodiment, the pattern is generated on wafer W according to illumination system 10, the reticle, and projection optical system PL, and then by the exposure of the sensitive layer (resist layer) on wafer W with illumination light IL, the pattern is formed on wafer W.

Incidentally, although it is not shown, projection unit PU is installed in a barrel platform supported by three struts via a vibration isolation mechanism. However, as well as such a structure, as is disclosed in, for example, the pamphlet of International Publication WO2006/038952 and the like, projection unit PU can be supported by suspension with respect to a mainframe member (not shown) placed above projection unit PU or with respect to a base member on which reticle stage RST is placed.

Incidentally, in exposure apparatus 100 of the embodiment, because exposure is performed applying a liquid immersion method, an opening on the reticle side becomes larger with the substantial increase of the numerical aperture NA. Therefore, in order to satisfy Petzval's condition and to avoid an increase in size of the projection optical system, a reflection/refraction system (a catodioptric system) which is configured including a mirror and a lens can be employed as a projection optical system. Further, in wafer W, in addition to a sensitive layer (a resist layer), for example, a protection film (a topcoat film) or the like which protects the wafer or a photosensitive layer can also be formed.

Figure 3:
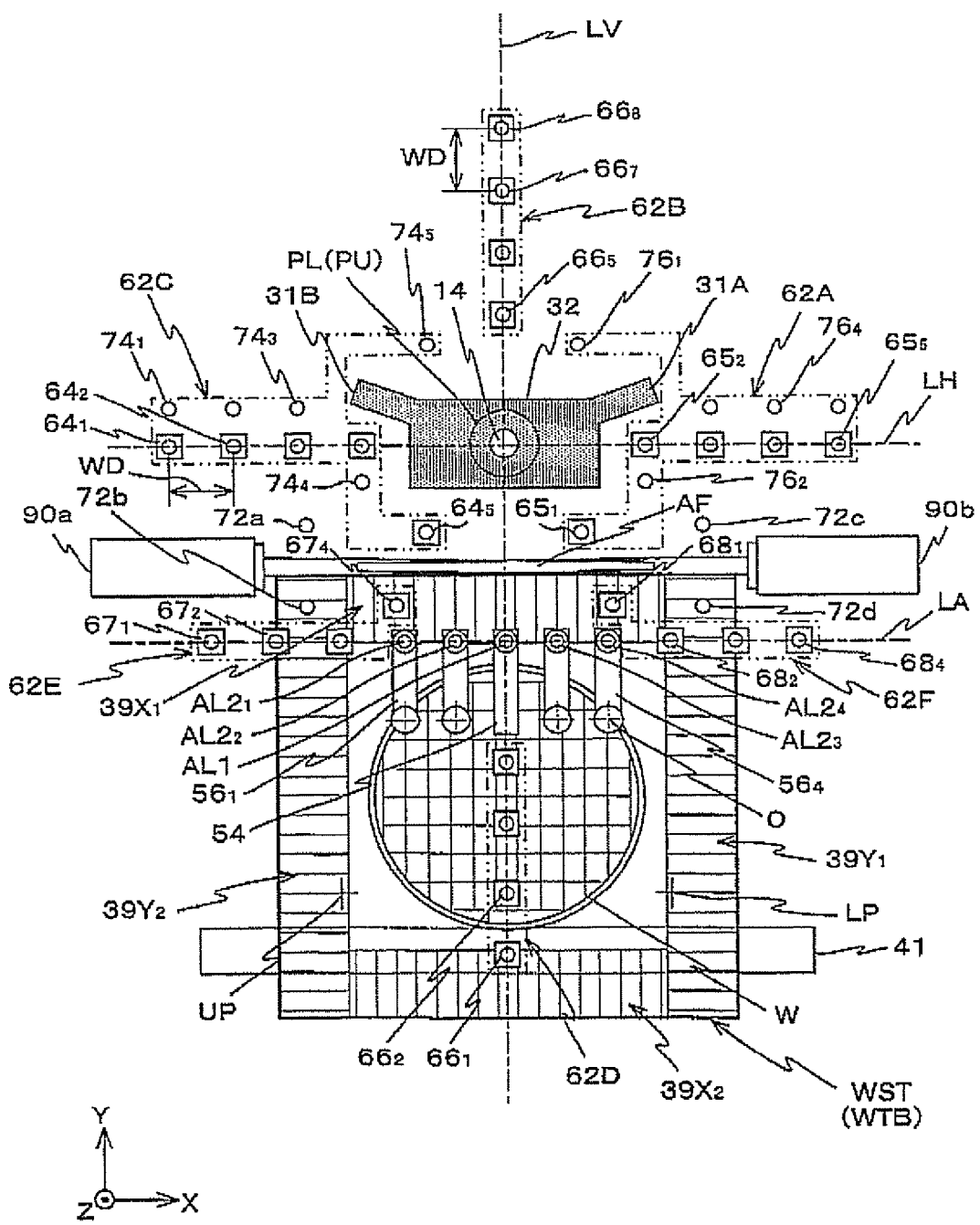
FIG. 3 is planar view showing placement of various measurement device (an encoder, alignment system, multipoint AF system, a Z head) which exposure apparatus of FIG. 1 comprises.

Further, in exposure apparatus 100 of the embodiment, in order to perform exposure applying the liquid immersion method, a nozzle unit 32 that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as shown in FIG. 1, the lower end surface of nozzle unit 32 is set to be substantially flush with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Liquid supply pipe 31A and liquid recovery pipe 31B are slanted by around 45 degrees relative to an X-axis direction and Y-axis direction in a planar view (when viewed from above) as shown in FIG. 3, and are placed symmetric to a straight line (a reference axis) LV which passes through the center (optical axis AX of projection optical system PL, coinciding with the center of exposure area IA previously described in the embodiment) of projection unit PU and is also parallel to the Y-axis.

Figure 6:
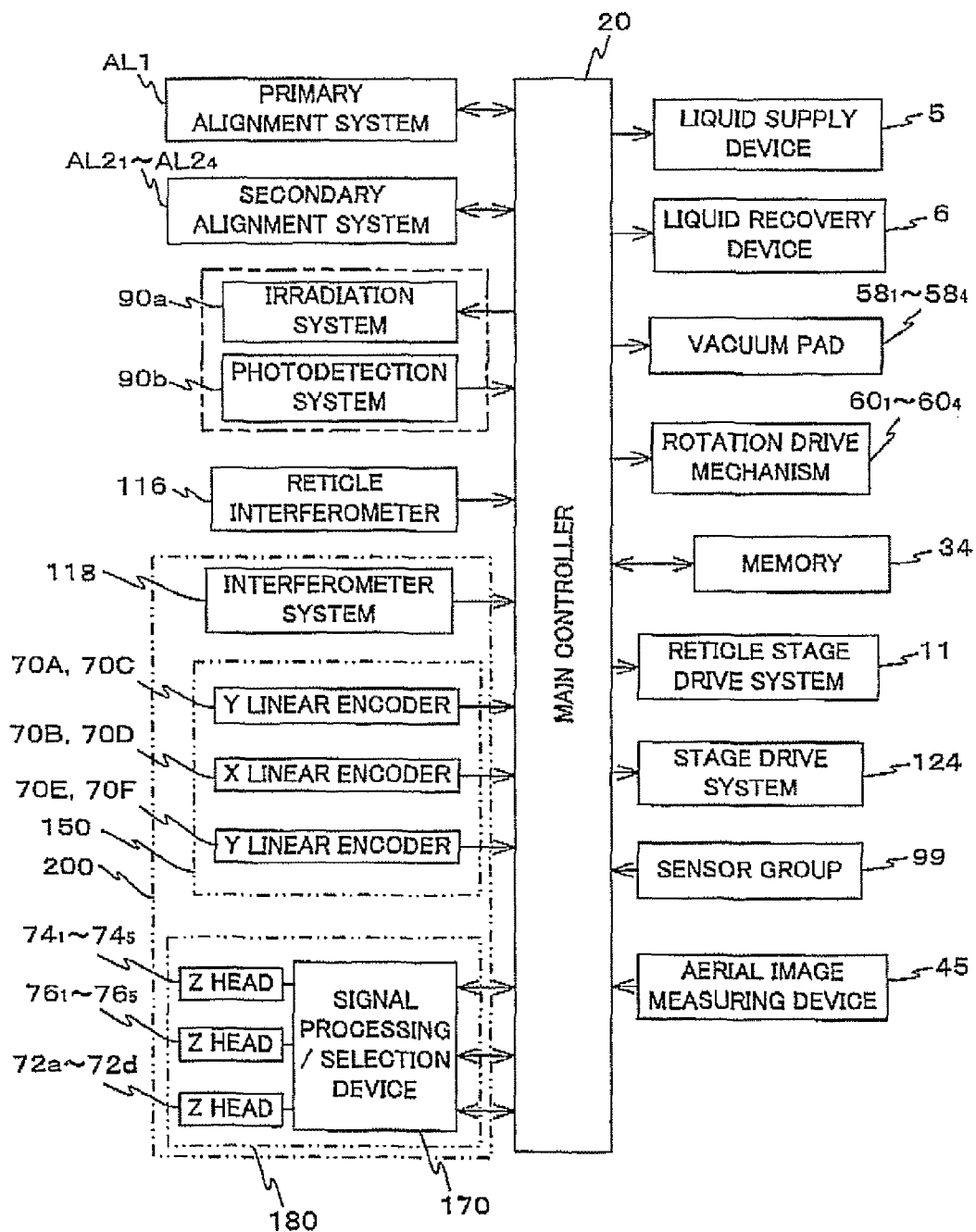
FIG. 6 is a block diagram showing a configuration of a control system of the exposure apparatus related to an embodiment.

One end of a supply pipe (not shown) is connected to liquid supply pipe 31A while the other end of the supply pipe is connected to a liquid supply unit 5 (not shown in FIG. 1, refer to FIG. 6), and one end of a recovery pipe (not shown) is connected to liquid recovery pipe 313 while the other end of the recovery pipe is connected to a liquid recovery device 6 (not shown in FIG. 1, refer to FIG. 6).

Liquid supply device 5 includes a liquid tank for supplying liquid, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the tanks for example, to nearly the same temperature as the temperature within the chamber (not shown) where the exposure apparatus is housed. Incidentally, the tank, the compression pump, the temperature controller, the valve, and the like do not all have to be equipped in exposure apparatus 100, and at least part of them can also be substituted by the equipment or the like available in the plant where exposure apparatus 100 is installed.

Liquid recovery device 6 includes a liquid tank for collecting liquid, a suction pump, a valve for controlling recovery/stop of the liquid via liquid recovery pipe 31B, and the like. As the valve, it is desirable to use a flow control valve similar to the valve of liquid supply device 5. Incidentally, the tank, the suction pump, the valve, and the like do not all have to be equipped in exposure apparatus 100, and at least part of them can also be substituted by the equipment or the like available in the plants where exposure apparatus 100 is installed.

In the embodiment, as liquid Lq described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shorted to around 134 nm.

Liquid supply device 5 and liquid recovery device 6 each, have a controller, and the respective controllers are controlled by main controller 20 (refer to FIG. 6). According to instructions from main controller 20, the controller of liquid supply device 5 opens the valve connected to liquid supply pipe 31A to a predetermined degree to supply liquid (water) to the space between tip lens 191 and wafer w via liquid supply pipe 31A, the supply flow channel and the supply opening. Further, when the water is supplied, according to instructions from main controller 20, the controller of liquid recovery device 6 opens the valve connected to liquid recovery pipe 31B to a predetermined degree to recover the liquid (water) from the space between tip lens 191 and water W into liquid recovery device 6 (the liquid tank) via the recovery opening, the recovery flow channel and liquid recovery pipe 31B. During the supply and recovery operations, main controller 20 gives commands to the controllers of liquid supply device 5 and liquid recovery device 6 so that the quantity of water supplied to the space between tip lens 191 and wafer W constantly equals the quantity of water recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced.

As is obvious from the above description, in the embodiment, local liquid immersion device 8 is configured including nozzle unit 32, liquid supply device 5, liquid recovery device 6, liquid supply pipe 31A and liquid recovery pipe 31B, and the like. Incidentally, part of local liquid immersion device 8, for example, at least nozzle unit 32 may also be supported in a suspended state by a main frame (including the barrel platform) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, but in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be Filled with water in the similar manner to the manner described above.

Incidentally, in the description above, one liquid supply pipe (nozzle) and one liquid recovery pipe (nozzle) were arranged as an example, however, the present invention is not limited to this, and a configuration having multiple nozzles as is disclosed in, for example, the pamphlet of International Publication No 99/49504, may also be employed, in the case such an arrangement is possible taking into consideration a relation with adjacent members. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. 2004/053955, or the liquid immersion mechanism disclosed in the EP Patent Application Publication No. 1 420 298 can also be applied to the exposure apparatus of the embodiment.

Referring back to FIG. 1, stage device 50 is equipped with a wafer stage WST and a measurement stage MST placed above a base board 12, a measurement system 200 (refer to FIG. 6) which measures positional information of the stages WST and MST, a stage drive system 124 (refer to FIG. 6) which drives stages WST and MST and the like. Measurement system 200 includes an interferometer system 118, an encoder system 150, and a surface position measurement system 180 and the like as shown in FIG. 6. Incidentally, details on interferometer system 118, encoder system 150 and the like will be described later in the description.

Referring back to FIG. 1, on the bottom surface of each of wafer stage WST and measurement stage MST, a noncontact bearing (not shown), for example, a vacuum preload type hydrostatic air bearing (hereinafter, referred to as an "air pad") is arranged at a plurality of points, and wafer stage WST and measurement stage MST are supported in a noncontact manner via a clearance of around several μm above base board 12, by static pressure of pressurized air that is blown out from the air pad toward the upper surface of base board 12. Further, stages WST and MST are drivable independently within the XY plane, by stage drive system 124 (refer to FIG. 6) which includes a linear motor and the like.

Wafer stage WST includes a stage main section 91, and a wafer table WTB that is mounted on stage main section 91. Wafer table WTB and stage main section 91 are configured drivable in directions of six degrees of freedom (X, Y, Z, θx, θy, and θz) with respect to base board 12 by a drive system including a linear motor and a Z leveling mechanism (for example, including a voice coil motor and the like).

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has the surface (liquid repellent surface) substantially flush with the surface of wafer W mounted on the wafer holder to which liquid repellent processing with respect to liquid Lq is performed, has a rectangular outer shape (contour), and has a circular opening that is formed in the center portion and is slightly larger than the wafer holder (a mounting area of the wafer). Plate 28 is made of materials with a low coefficient of thermal expansion, such as glass or ceramics (e.g., such as Zerodur (the brand name) of Schott AG, $Al_2O_3$, or Tic), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Further, as shown in a planer view of wafer table WTB (wafer stage WST) in FIG. 4A, plate 28 has a first liquid repellent area 28a whose outer shape (contour) is rectangular enclosing a circular opening, and a second liquid repellent area 28b that has a rectangular frame (annular) shape placed around the first liquid repellent area 28a. On the first liquid repellent area 28a, for example, at the time of an exposure operation, at least part of a liquid immersion area 14 (refer to FIG. 13) that is protruded from the surface of the wafer is formed, and on the second liquid repellent area 28b, scales for an encoder system (to be described later) are formed. Incidentally, at least part of the surface of plate 28 does not have to be on a flush surface with the surface of the wafer, that is, may have a different height from that of the surface of the wafer. Further, plate 28 may be a single plate, but in the embodiment, plate 28 is configured by combining a plurality of plates, for example, the first and second liquid repellent plates that correspond to the first liquid repellent area 28a and the second liquid repellent area 28b respectively. In the embodiment, water is used as liquid Lq as is described above, and therefore, hereinafter the first liquid repellent area 28a and the second liquid repellent area 28b are also referred to as a first water repellent plate 28a and a second water repellent plate 28b.

In this case, while exposure light IL is irradiated to the first water repellent plate 28a on the inner side, exposure light IL is hardly irradiated to the second water repellent plate 28b on the outer side. Taking this fact into consideration, in the embodiment, a first water repellent area to which water repellent coat having sufficient resistance to exposure light IL (light in a vacuum ultraviolet region, in this case) is applied is formed on the surface of the first water repellent plate 28a, and a second water repellent area to which water repellent coat having resistance to exposure light IL inferior to the first water repellent area is applied is formed on the surface of the second water repellent plate 28b. In general, since it is difficult to apply water repellent coat having sufficient resistance to exposure light IL (in this case, light in a vacuum ultraviolet region) to a glass plate, it is effective to separate the water repellent plate into two sections, the first water repellent plate 28a and the second water repellent plate 28b which is the periphery of the first water repellent plate, in the manner described above. Incidentally, the present invention is not limited to this, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Figure 4A:
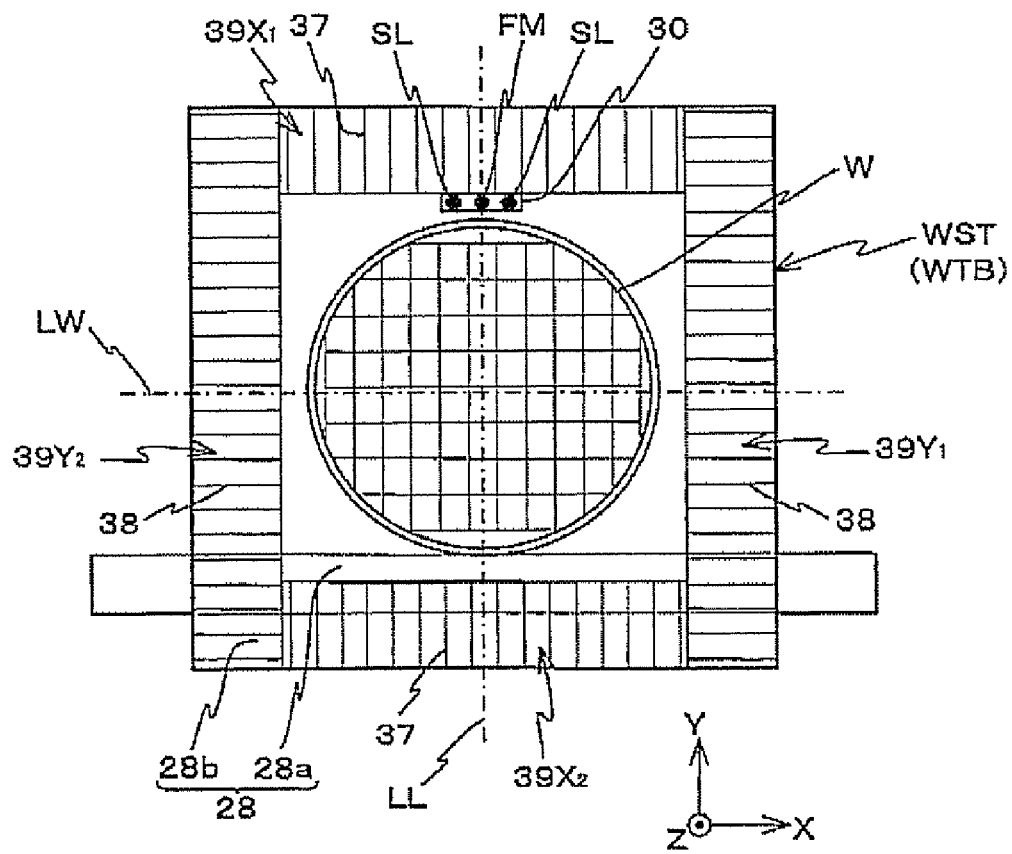
FIG. 4A is a planar view showing a wafer stage.

Further, as is obvious from FIG. 4A, at the end portion on the +Y side of the first water repellent plate 28a, a rectangular cutout is formed in the center portion in the X-axis direction, and a measurement plate 30 is embedded inside the rectangular space (inside the cutout) that is enclosed by the cutout and the second water repellent plate 28b. A fiducial mark FM is formed in the center in the longitudinal direction of measurement plate 30 (on a centerline LL of wafer table WTB), and a pair of aerial image measurement slit patterns (slit-shaped measurement patterns) SL are formed in the symmetrical placement with respect to the center of the fiducial mark on one side and the other side in the X-axis direction of fiducial mark FM. As each of aerial image measurement slit patterns SL, an L-shaped slit pattern having sides along the Y-axis direction and X-axis direction, or two linear slit patterns extending in the X-axis and Y-axis directions respectively can be used, as an example.

Figure 4B:
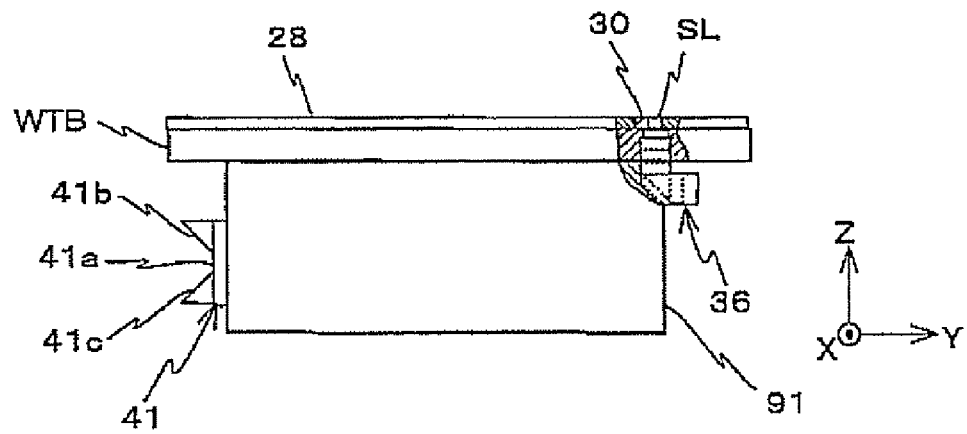
FIG. 4B is a schematic side view of a partially sectioned wafer stage WST.

Further, as is shown in FIG. 4B, inside wafer stage WST below each of aerial image measurement slit patterns SL, an L-shaped housing 36 in which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of the second water repellent plate 28b, multiple grid lines are directly formed in a predetermined pitch along each of four sides. More specifically, in areas on one side and the other side in the X-axis direction of second water repellent plate 28b (both sides in the horizontal direction in FIG. 4A), Y scales $39Y_1$ and $39Y_2$ are formed respectively, and Y scales $39Y_1$ and $39Y_2$ are each composed of a reflective grating (for example, a diffraction grating) having a periodic direction in the Y-axis direction in which grid lines 38 having the longitudinal direction in the X-axis direction are formed in a predetermined pitch along a direction parallel to the Y-axis (the Y-axis direction).

Similarly, in areas on one side and the other side in the Y-axis direction of second water repellent plate 28b (both sides in the vertical direction in FIG. 4A), X scales $39X_1$ and $39X_2$ are formed respectively in a state where the scales are placed between Y scales $39Y_1$ and $39Y_2$, and X scales $39X_1$ and $39X_2$ are each composed of a reflective grating (for example, a diffraction grating) having a periodic direction in the X-axis direction in which grid lines 37 having the longitudinal direction in the Y-axis direction are formed in a predetermined pitch along a direction parallel to the X-axis (the X-axis direction). As each of the scales, a scale is used that has a reflective diffraction grating made by, for example, hologram or the like, on the surface of the second water repellent plate 28b. In this case, each scale has grids made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing an interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since the second water repellent plate 28b itself constitutes the scales, a glass plate with low-thermal expansion is to be used as the second water repellent plate 28b. However, the present invention is not limited to this, and a scale member made up of a glass plate or the like with low-thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Incidentally, in order to protect the diffraction grating, it is also effective to cover the grating with a glass plate with low thermal expansion that has water repellency (liquid repellency). In this case, as the glass plate, a plate whose thickness is the same level as the wafer, such as for example, a plate 1 mm thick, can be used, and the plate is set on the upper surface of wafer table WTB so that the surface of the glass plate becomes the same height (surface position) as the wafer surface.

Incidentally, a pattern for positioning is arranged for deciding the relative position between an encoder head and a scale near the edge of each scale (to be described later). The pattern for positioning is configured, for example, from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

Figure 2:
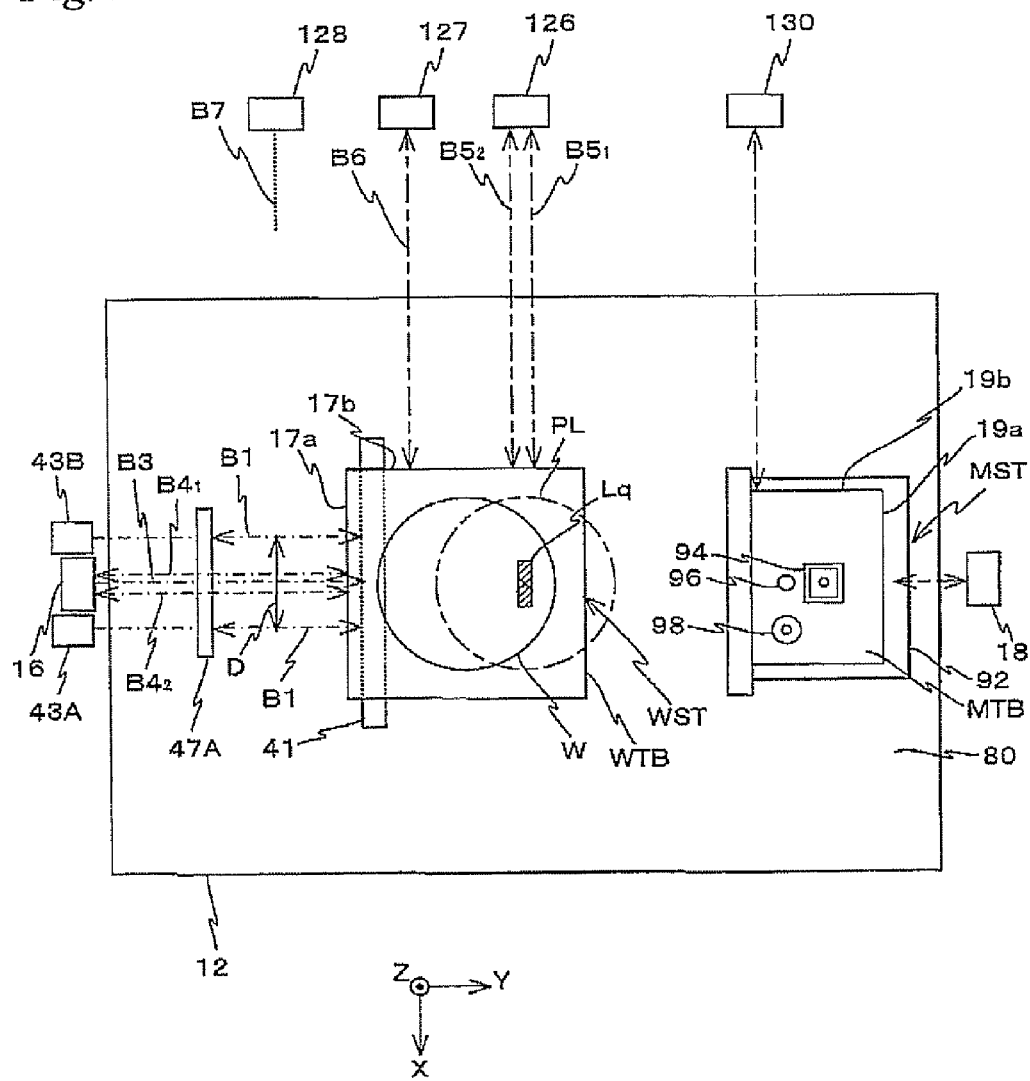
FIG. 2 is a planar view showing a stage device in FIG. 1.

Further, to the −Y edge surface and the −X edge surface of wafer table WTB, mirror-polishing is applied, respectively, and as shown in FIG. 2, a reflection surface 17a and a reflection surface 17b are formed for interferometer system 118 which will be described later in the description.

Measurement stage MST includes a stage main section 92 driven in the XY plane by a linear motor and the like (not shown), and a measurement table MTB mounted on stage main section 92. Measurement stage MST is configured drivable in at least directions of three degrees of freedom (X, Y, and θz) with respect to base board 12 by a drive system (not shown).

Incidentally, the drive system of wafer stage WST and the drive system of measurement stage MST are included in FIG. 6, and are shown as stage drive system 124.

Various measurement members are arranged at measurement table MTB (and stage main section 92). As such measurement members, for example, as shown in FIGS. 2 and 52, members such as an uneven illuminance measuring sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, the pamphlet of International Publication No. 2003/065428 and the like are employed. As wavefront aberration measuring instrument 98, the one disclosed in, for example, the pamphlet of International Publication No. 99/60361 (the corresponding EP Patent No. 1 079 223) can also be used.

As irregular illuminance sensor 94, the configuration similar to the one that is disclosed in, for example, U.S. Pat. No. 4,465,368 and the like can be used. Further, as aerial image measuring instrument 96, the configuration similar to the one that is disclosed in, for example, U.S. Patent Application Publication No. 2002/0041377 and the like can be used. Incidentally, in the embodiment, three measurement members (94, 96 and 98) were to be arranged at measurement stage MST, however, the type of the measurement member and/or the number is not limited to them. As the measurement members, for example, measurement members such as a transmittance measuring instrument that measures a transmittance of projection optical system PL, and/or a measuring instrument that observes local liquid immersion unit 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

Figure 5A:
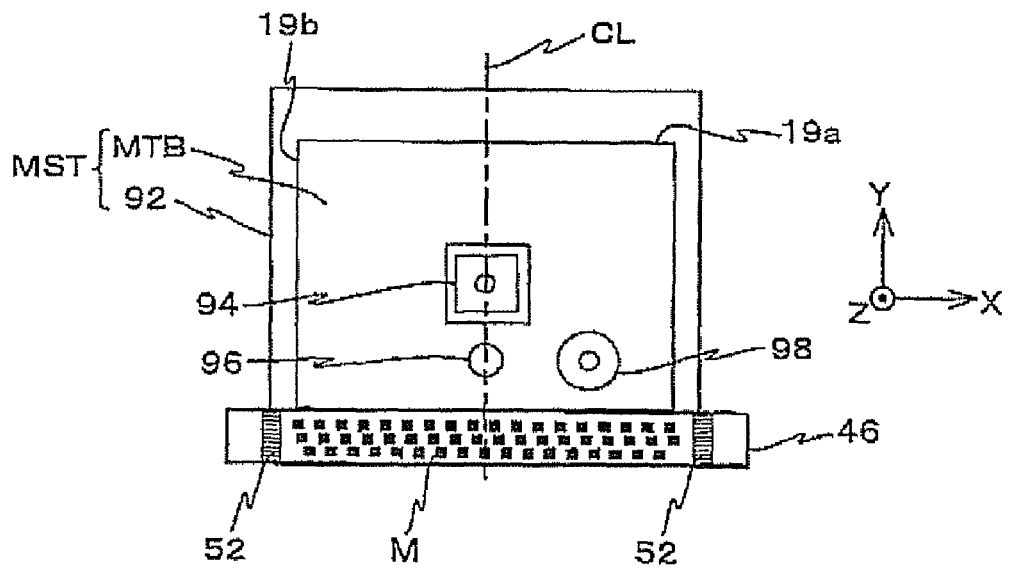
FIG. 5A is a planar view that shows a measurement stage MST.

In the embodiment, as can be seen from FIG. 5A, the sensors that are frequently used such as irregular illuminance sensor 94 and aerial image measuring instrument 96 are placed on a centerline CL (Y-axis passing through the center) of measurement stage MST. Therefore, in the embodiment, measurement using these sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, U.S. Patent Application Publication No. 2002/0061469 and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly irregular illuminance sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor such as the optical system may be mounted on measurement table MTB (and stage main section 92), or the entire sensor may be placed on measurement table MTB (and stage main section 92).

Further, on the +Y edge surface and the −X edge surface of measurement table MTB, reflection surfaces 19a and 19b are formed similar to wafer table WTB previously described (refer to FIGS. 2 and 5A).

Figure 5B:
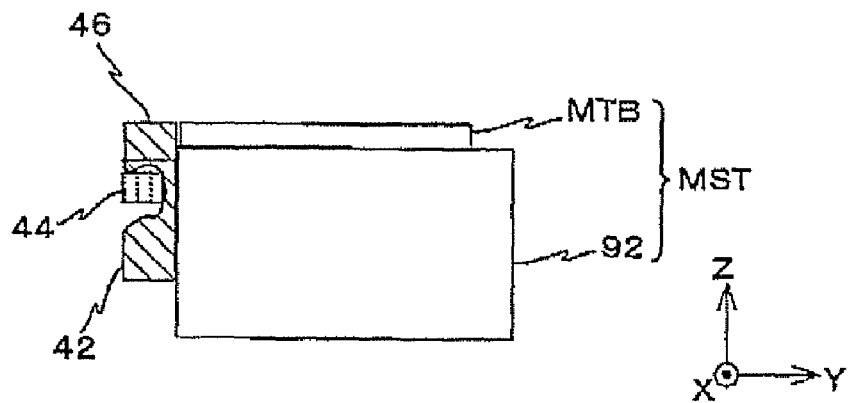
FIG. 5B is a partially sectioned schematic side view that shows measurement stage MST.

As shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light receiving element such as a photo-multiplier tube, and a housing that houses them. As is obvious from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element of each photodetection system 44. That is, measurement plate 30, light-transmitting systems 36 and photodetection systems 44 constitute an aerial image measuring unit 45 (refer to FIG. 6), which is similar to the one disclosed in, U.S. Patent Application Publication No. 2002/0041377 referred to previously, and the like.

On attachment member 42, a fiducial bar (hereinafter, shortly referred to as an "FD bar") which is made up of a bar-shaped member having a rectangular sectional shape is arranged extending in the X-axis direction. FD bar 46 is kinematically supported on measurement stage MST by a full-kinematic mount structure.

Since FD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of FD bar 46 is set high to be around the same level as a so-called datum plane plate. Further, as shown in FIG. 5A, a reference grating (for example, a diffraction grating) 52 whose periodic direction is the Y-axis direction is respectively formed in the vicinity of the end portions on one side and the other side in the longitudinal direction of FD bar 46. The pair of reference gratings 52 is formed placed apart from each other at a predetermined distance L, symmetric to the center in the X-axis direction of FD bar 46, or more specifically, formed in a symmetric placement to centerline CL previously described.

Further, on the upper surface of FD bar 46, a plurality of reference marks M are formed in a placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark of wafer W. Incidentally, in the embodiment, the surface of FD bar 46 and the surface of measurement table MTB (which may include the measurement members described above) are also covered with a liquid repellent film (water repellent film) severally.

In exposure apparatus 100 of the embodiment, although it is omitted in FIG. 1 from the viewpoint of avoiding intricacy of the drawing, a primary alignment system AL1 having a detection center at a position spaced apart from optical axis AX of projection optical system PL at a predetermined distance on the −Y side is actually placed on reference axis LV as shown in FIG. 3. Primary alignment system AL1 is fixed to the lower surface of a main frame (not shown) via a support member 54. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are severally arranged. That is, five alignment systems AL1 and $AL2_1$ to $AL2_4$ are placed so that their detection centers are placed at different positions in the X-axis direction, that is, placed along the X-axis direction.

As is representatively shown by secondary alignment system $AL2_4$, each secondary alignment system $AL2_n$ (n=1 to 4) is fixed to a tip (turning end) of an arm $56_n$ (n=1 to 4) that can turn around a rotation center O as the center in a predetermined angle range in clockwise and anticlockwise directions in FIG. 3. In the embodiment, a part of each secondary alignment system $AL2_n$ (for example, including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment Systems $AL2_1$, $AL2_2$, $AL2_3$ and $AL2_4$ are severally adjusted by rotating around rotation center O as the center. In other words, the detection areas (or the detection centers) of secondary alignment systems $AL2_1$, $AL2_2$, $AL2_3$ and $AL2_4$ are independently movable in the X-axis direction. Accordingly, the relative positions of the detection areas of primary alignment system AL1 and secondary alignment systems $AL2_1$, $AL2_2$, $AL2_3$ and $AL2_4$ are adjustable in the X-axis direction. Incidentally, in the embodiment, the X-positions of secondary alignment systems $AL2_1$, $AL2_2$, $AL2_3$ and $AL2_4$ are to be adjusted by the rotation of the arms. However, the present invention is not limited to this, and a drive mechanism that drives secondary alignment systems $AL2_1$, $AL2_2$, $AL2_3$ and $AL2_4$ back and forth in the X-axis direction may also be arranged. Further, at least one of secondary alignment systems $AL2_1$, $AL2_2$, $AL2_3$ and $AL2_4$ can be moved not only in the X-axis direction but also in the Y-axis direction. Incidentally, since part of each secondary alignment system $AL2_n$ is moved by arm $56_n$, positional information of the part that is fixed to arm $56_n$ is measurable by a sensor (not shown) such as, for example, an interferometer or an encoder. The sensor may only measure position information in the X-axis direction of secondary alignment system $AL2_n$, or may also be capable of measuring position information in another direction, for example, the Y-axis direction and/or the rotation direction (including at least one of the θx and θy directions).

On the upper surface of each arm $56_n$, a vacuum pad $58_n$ (n=1 to 4, not shown in FIG. 3, refer to FIG. 6) that is composed of a differential evacuation type air bearing is arranged. Further, arm $56_n$ can be turned by a rotation drive mechanism $60_n$ (n-1 to 4, not shown in FIG. 3, refer to FIG. 6) that includes, for example, a motor or the like, in response to instructions of main controller 20. Main controller 20 activates each vacuum pad 58n to fix each arm $56_n$ to a main frame (not shown) by suction after rotation adjustment of arm $56_n$. Thus, the state of each arm $56_n$ after rotation angle adjustment, that is, a desired positional relation between primary alignment system AL1 and four secondary alignment systems $AL2_1$ to $AL2_4$ is maintained.

Incidentally, in the case a portion of the main frame facing arm $56_n$ is a magnetic body, an electromagnet may also be employed instead of vacuum pad 58.

In the embodiment, as each of primary alignment system AL1 and four secondary alignment systems $AL2_1$ to $AL2_4$, for example, an FIA (Field image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 6, via an alignment signal processing system (not shown).

Incidentally, each of the alignment systems described above is not limited to the FIA system, and an alignment sensor, which irradiates a coherent detection light to a subject mark and detects a scattered light or a diffracted light generated from the subject mark or makes two diffracted lights (for example, diffracted lights of the same order or diffracted lights being diffracted in the same direction) generated from the subject mark interfere and detects an interference light, can naturally be used alone or in combination as needed. Further, in the embodiment, five alignment systems AL1 and $AL2_1$ to $AL2_4$ are to be fixed to the lower surface of the main frame that holds projection unit PU, via support member 54 or arm $56_n$. However, the present invention is not limited to this, and for example, the five alignment systems may also be arranged on the measurement frame described earlier.

Next, a configuration and the like of interferometer system 118 (refer to FIG. 6), which measures the positional information of wafer stage WST and measurement stage MST, will be described.

The measurement principle of the interferometer will now be briefly described, prior to describing a concrete configuration of the interferometer system. The interferometer irradiates a measurement beam (measurement light) on a reflection surface set at a measurement object. The interferometer receives a synthesized light of the reflected light and a reference beam, and measures the intensity of interference light, which is the reflected light (measurement light) and the reference beam made to interfere with each other, with their polarized directions arranged. In this case, due to optical path difference $\Delta L$ of the reflected light and the reference beam, the relative phase (phase difference) between the reflected light and the reference beam changes by $K\Delta L$. Accordingly, the intensity of the interference light changes in proportion to $1+a \cdot \cos(K\Delta L)$. In this case, homodyne detection is to be employed, and the wave number of the measurement light and the reference beam is the same, expressed as K. Constant a is decided by the intensity ratio of the measurement light and the reference beam. In this case, the reflection surface to the reference beam is arranged generally on the projection unit PU side surface (in some cases, inside the interferometer unit). The reflection surface of this reference beam becomes the reference position of the measurement. Accordingly, in optical path difference $\Delta L$, the distance from the reference position to the reflection surface is reflected. Therefore, if the number of times (the number of fringes) of intensity change of the interference light with respect to the change of distance to the reflection surface is measured, displacement of the reflection surface provided in the measurement object can be computed by the product of a counter value and a measurement unit. The measurement unit, in the case of an interferometer of a single-pass method is half the wavelength of the measurement light, and in the case of an interferometer of the double-pass method, one-fourth of the wavelength.

Now, in the case an interferometer of the heterodyne detection method is employed, wave number $K_1$ of the measurement light and wave number $K_2$ of the reference beam are slightly different. In this case, when the optical path length of the measurement light and the reference beam is $L_1$ and $L_2$, respectively, the phase difference between the measurement beam and the reference beam is given $K\Delta L + \Delta K L_1$, and the intensity of the interference light changes in proportion to $1+a \cdot \cos(K\Delta L + \Delta K L_1)$. However, optical path difference $\Delta L = L_1 - L_2$, $\Delta K = K_1 - K_2$, and $K = K_2$. When optical path $L_2$ of the reference beam is sufficiently shorts and approximate $\Delta L \approx L_1$ stands, the intensity of the interference light changes in proportion to $1+a \cdot \cos[(K+\Delta K)\Delta L]$. As it can be seen from above, the intensity of the interference light periodically vibrates at a wavelength $2\pi/K$ of the reference beam along with the change of optical path difference $\Delta L$, and the envelope curve of the periodic vibration vibrates (beats) at a long cycle $2\pi/\Delta K$. Accordingly, in the heterodyne detection method, the changing direction of optical path difference $\Delta L$, or more specifically, the displacement direction of the measurement object can be learned from the long-period beat.

Incidentally, as a major cause of error of the interferometer, the effect of temperature fluctuation (air fluctuation) of the atmosphere on the beam optical path can be considered. Assume that wavelength $\lambda$ of the light changes to $\lambda + \Delta\lambda$ by air fluctuation. Because the change of phase difference $K\Delta L$ by minimal change $\Delta\lambda$ of the wavelength is wave number $K=2\pi/\lambda$, $2\pi\Delta L\Delta\lambda/\lambda^2$ can be obtained. In this case, when wavelength of light $\lambda=1$ μm and minimal change $\Delta\lambda=1$ nm, the phase change becomes $2\pi \times 100$ with respect to an optical path difference $\Delta L=100$ nm. This phase change corresponds to displacement which is 100 times the measurement unit. In the case the optical path length which is set is long as is described, the interferometer is greatly affected by the air fluctuation which occurs in a short time, and is inferior in short-term stability. In such a case, it is desirable to use a surface position measurement system which will be described later that has an encoder or a Z head.

Interferometer system 118 includes a Y interferometer 16, X interferometers 126, 127, and 128, and Z interferometers 43A and 43B for position measurement of wafer stage WST, and a Y interferometer 18 and an X interferometer 130 for position measurement of measurement stage MST, as shown in FIG. 2. By severally irradiating a measurement beam on reflection surface 17a and reflection surface 17b of wager table WTB and receiving a reflected light of each beam, Y interferometer 16 and X interferometers 126, 127, and 128 (X interferometers 126 to 128 are not shown in FIG. 1, refer to FIG. 2) measure a displacement of each reflection surface from a reference position (for example, a fixed mirror is placed on the side surface of projection unit PU, and the surface is used as a reference surface), or more specifically, measure the positional information of wafer stage WST within the XY plane, and the positional information that has been measured is supplied to main controller 20. In the embodiment, as it will be described later on, as each interferometer a multiaxial interferometer that has a plurality of measurement axes is used with an exception for a part of the interferometers.

Meanwhile, to the side surface on the −Y side of stage main section 91, a movable mirror 41 having the longitudinal direction in the X-axis direction is attached via a kinematic support mechanism (not shown), as shown in FIGS. 4A and 4B. Movable mirror 41 is made of a member which is like a rectangular solid member integrated with a pair of triangular prisms adhered to a surface (the surface on the −Y side) of the rectangular solid member. As it can be seen from FIG. 2, movable mirror 41 is designed so that the length in the X-axis direction is longer than reflection surface 17a of wafer table WTB by at least the spacing between the two Z interferometers which will be described later.

To the surface on the −Y side of movable mirror 41, mirror-polishing is applied, and three reflection surfaces 41b, 41a, and 41c are formed, as shown in FIG. 4B. Reflection surface 41a configures a part of the edge surface on the −Y side of movable mirror 41, and reflection surface 41a is parallel with the XZ plane and also extends in the X-axis direction. Reflection surface 41b configures a surface adjacent to reflection surface 41a on the +Z side, forming an obtuse angle to reflection surface 41a, and spreading in the X-axis direction. Reflection surface 41c configures a surface adjacent to the −Z side of reflection surface 41a, and is arranged symmetrically with reflection surface 41b, with reflection surface 41b in between.

A pair of z interferometers 43A and 43B (refer to FIGS. 1 and 2) that irradiates measurement beams on movable mirror 41 is arranged facing movable mirror 41.

As it can be seen when viewing FIGS. 1 and 2 together, Z interferometers 43A and 43D are placed apart on one side and the other side of Y interferometer 16 in the X-axis direction at a substantially equal distance and at positions slightly lower than Y interferometer 16, respectively.

From each of the Z interferometers 43A and 43B, as shown in FIG. 1, measurement beam B1 along the Y-axis direction is irradiated toward reflection surface 41b, and measurement beam B2 along the Y-axis direction is irradiated toward reflection surface 41c (refer to FIG. 4B). In the embodiment, fixed mirror 47B having a reflection surface orthogonal to measurement beam B1 reflected off reflection surface 41b and a fixed mirror 47A having a reflection surface orthogonal to measurement beam B2 reflected off reflection surface 41c are arranged, each extending in the X-axis direction at a position distanced apart from movable mirror 41 in the −Y-direction by a predetermined distance in a state where the fixed mirrors do not interfere with measurement beams B1 and B2.

Fixed mirrors 47A and 47B are supported, for example, by the same support body (not shown) arranged in the frame (not shown) which supports projection unit PU.

Y interferometer 16, as shown in FIG. 2 (and FIG. 13), irradiates measurement beams $B4_1$ and $B4_2$ on reflection surface 17a of wafer table WTB along a measurement axis in the Y-axis direction spaced apart by an equal distance to the −X side and the +X side from reference axis IV previously described, and by receiving each reflected light, detects the position of wafer table WTB in the Y-axis direction (a Y position) at the irradiation point of measurement beams $B4_1$ and $B4_2$. Incidentally, in FIG. 1, measurement beams $B4_1$ and $B4_2$ are representatively shown as measurement beam B4.

Further, Y interferometer 16 irradiates a measurement beam 53 toward reflection surface 41a along a measurement axis in the Y-axis direction with a predetermined distance in the Z-axis direction spaced between measurement beams $B4_1$ and $B4_2$, and by receiving measurement beam B3 reflected off reflection surface 41a, detects the Y position of reflection surface 41a (more specifically wafer stage WST) of movable mirror 41.

Main controller 20 computes the Y position (or to be more precise, displacement $\Delta Y$ in the Y-axis direction) of reflection surface 17a, or more specifically, wafer table WTB (wafer stage WST), based on an average value of the measurement values of the measurement axes corresponding to measurement beams $B4_1$ and $B4_2$ of Y interferometer 16. Further, main controller 20 computes displacement (yawing amount) $\Delta\theta z^{(Y)}$ of wafer stage WST in the rotational direction around the Z-axis (the θz direction), based on a difference of the measurement values of the measurement axes corresponding to measurement beams $B4_1$ and $B4_2$. Further, main controller 20 computes displacement (pitching amount) $\Delta\theta x$ in the θx direction of wafer stage WST, based on the Y position (displacement $\Delta Y$ in the Y-axis direction) of reflection surface 17a and reflection surface 41a.

Figure 13:
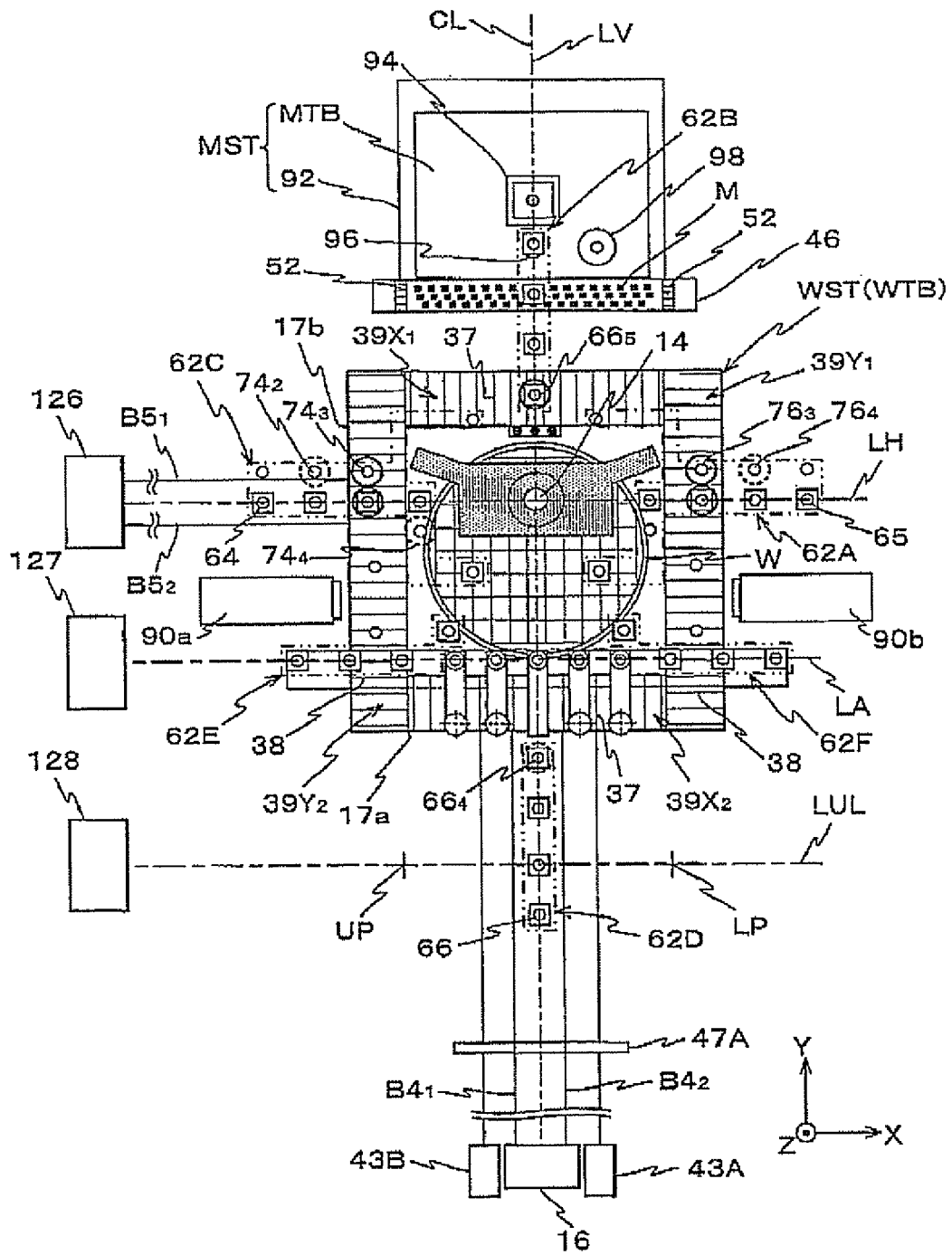
FIG. 13 is a view showing a state of the wafer stage and the measurement stage where exposure to a water on the wafer stage is performed by a step-and-scan method.

Further, as shown in FIGS. 2 and 13, X interferometer 126 irradiates measurement beams $B5_1$ and $B5_2$ on wafer table WTB along the dual measurement axes spaced apart from a straight line (a reference axis) LH in the X-axis direction that passes the optical axis of projection optical system PL by the same distance. And, based on the measurement values of the measurement axes corresponding to measurement beams $B5_1$ and B5$_2$, main controller 20 computes a position (an X position, or to be more precise, displacement ΔX in the X-axis direction) of wafer stage WST in the X-axis direction. Further, main controller 20 computes displacement (yawing amount) Δθz$^{(X)}$ of wafer stage WST in the θz direction from a difference of the measurement values of the measurement axes corresponding to measurement beams B5$_1$ and B5$_2$. Incidentally, Δθz$^{(X)}$ obtained from X interferometer 126 and Δθz$^{(Y)}$ obtained from Y interferometer 16 are equal to each other, and represents displacement (yawing amount) Δθz of wafer stage WST in the θz direction.

Figure 14:
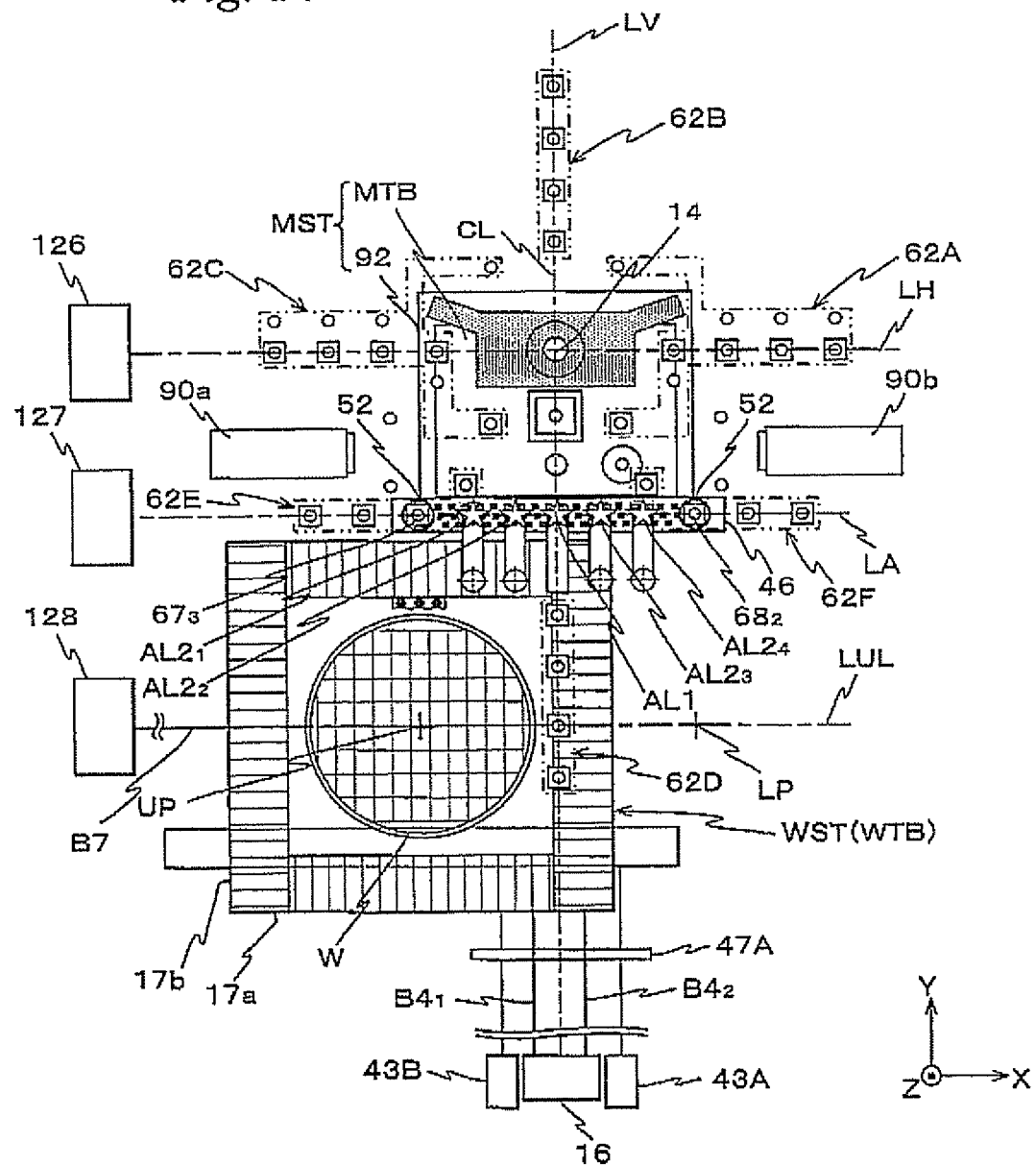
FIG. 14 is a view showing a state of both stages at the time of unloading of the wafer (when the measurement stage reaches the position where Sec-BCHK (interval) is performed)
Figure 15:
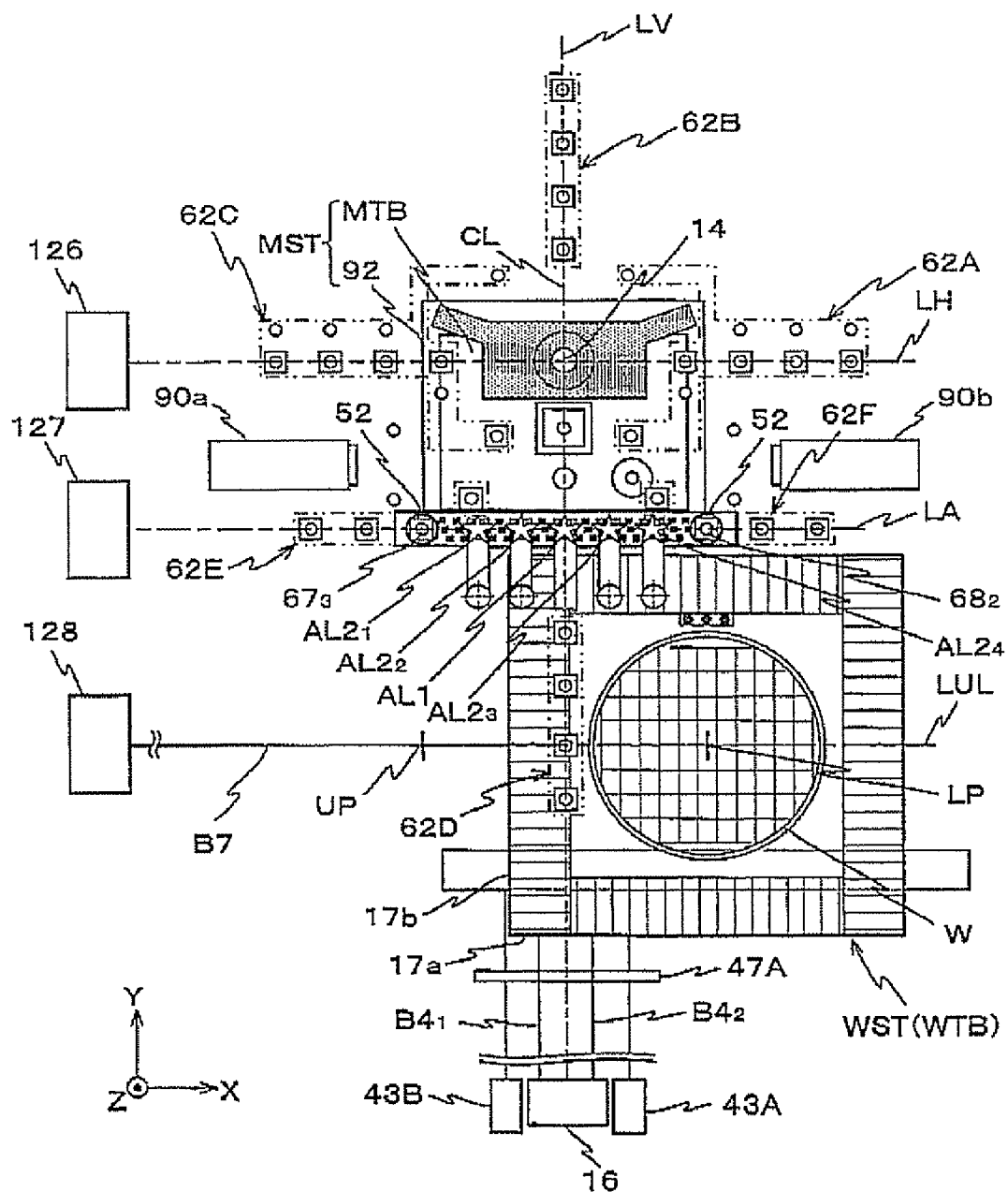
FIG. 15 is a view showing a state of both stages at the time of loading of the wafer.
Figure 16:
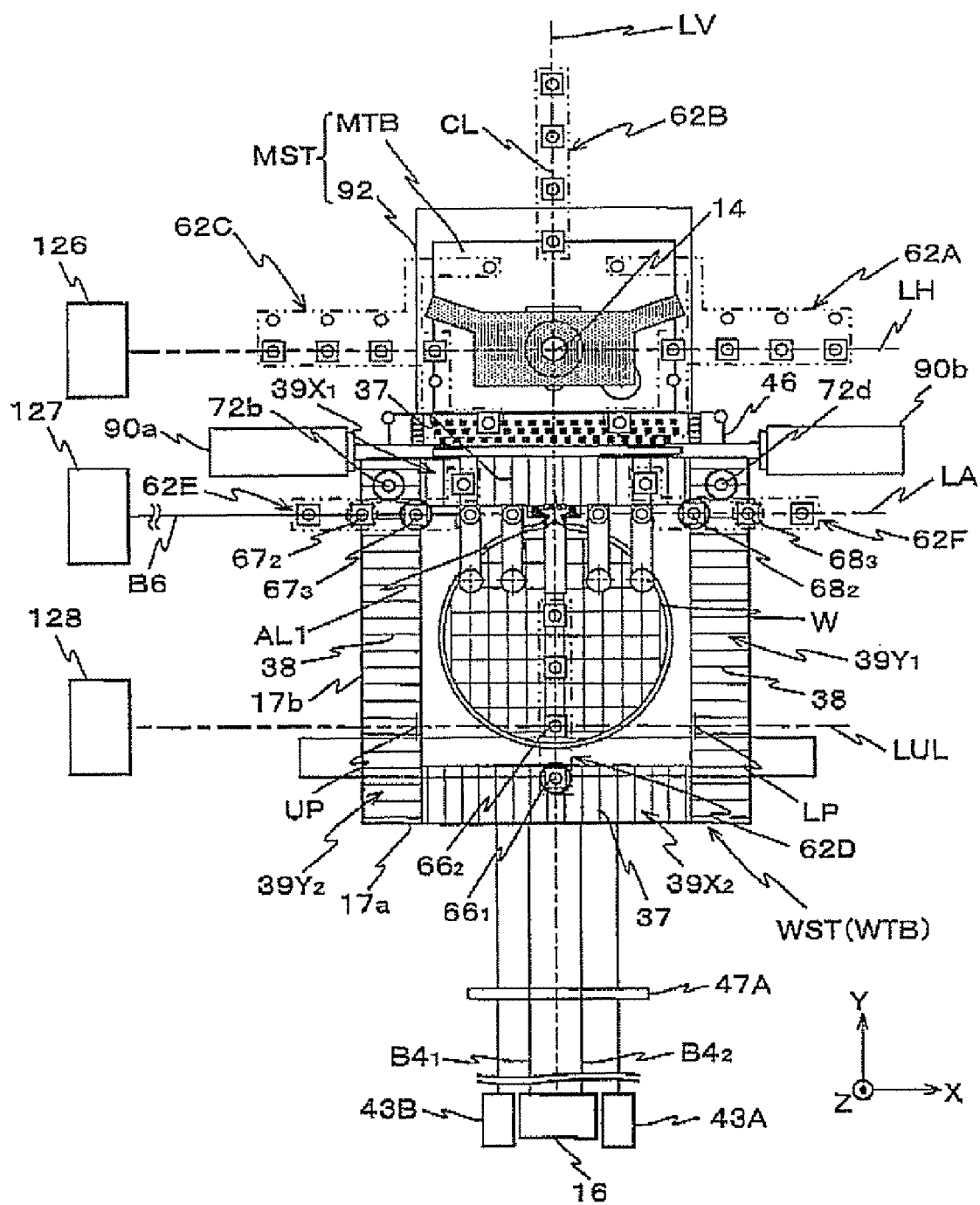
FIG. 16 is a view showing a state of both stages at the time of switching (when the wafer stage has moved to a position where the former processing of Pri-BCHK is performed) from stage servo control by the interferometer to stage servo control by the encoder.
Figure 17:
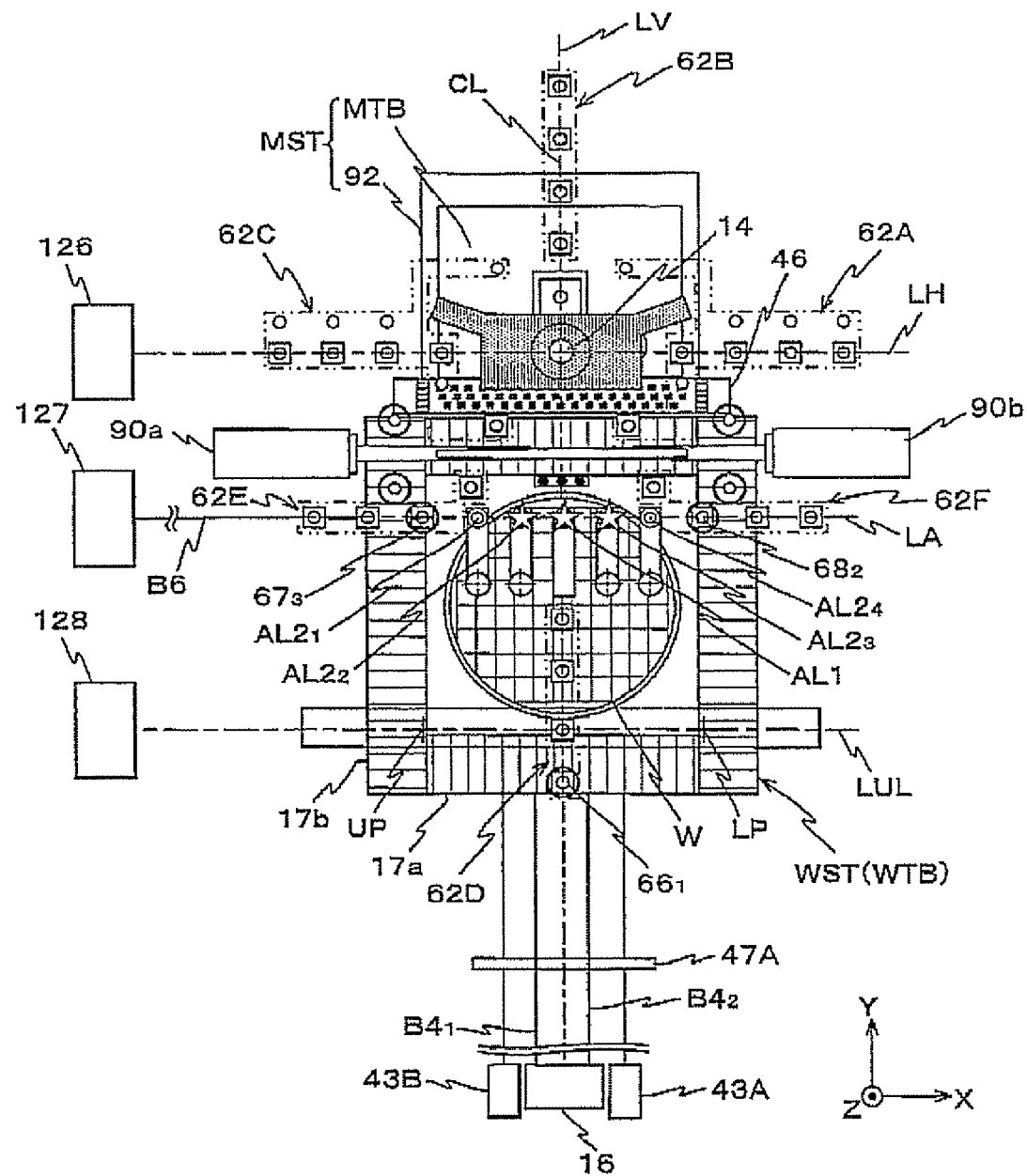
FIG. 17 is a view showing a state of the wafer stage and the measurement stage when alignment marks arranged in three first alignment shot areas are being simultaneously detected using alignment systems AL1, $AL2_2$ and $AL2_3$.

Further, as shown in FIGS. 14 and 15, a measurement beam B7 from X interferometer 128 is irradiated on reflection surface 17b of wafer table WTB along a straight line LUL, which is a line connecting an unloading position UP where unloading of the wafer on wafer table WTB is performed and a loading position IP where loading of the wafer onto wafer table WTB is performed and is parallel to the X-axis. Further, as shown in FIGS. 16 and 17, a measurement beam B6 from X interferometer 127 is irradiated on reflection surface 17b of wafer table WTB along a straight line (a reference axis) LA, which passes through the detection center of primary alignment system AL1 and is parallel to the X-axis.

Figure 19:
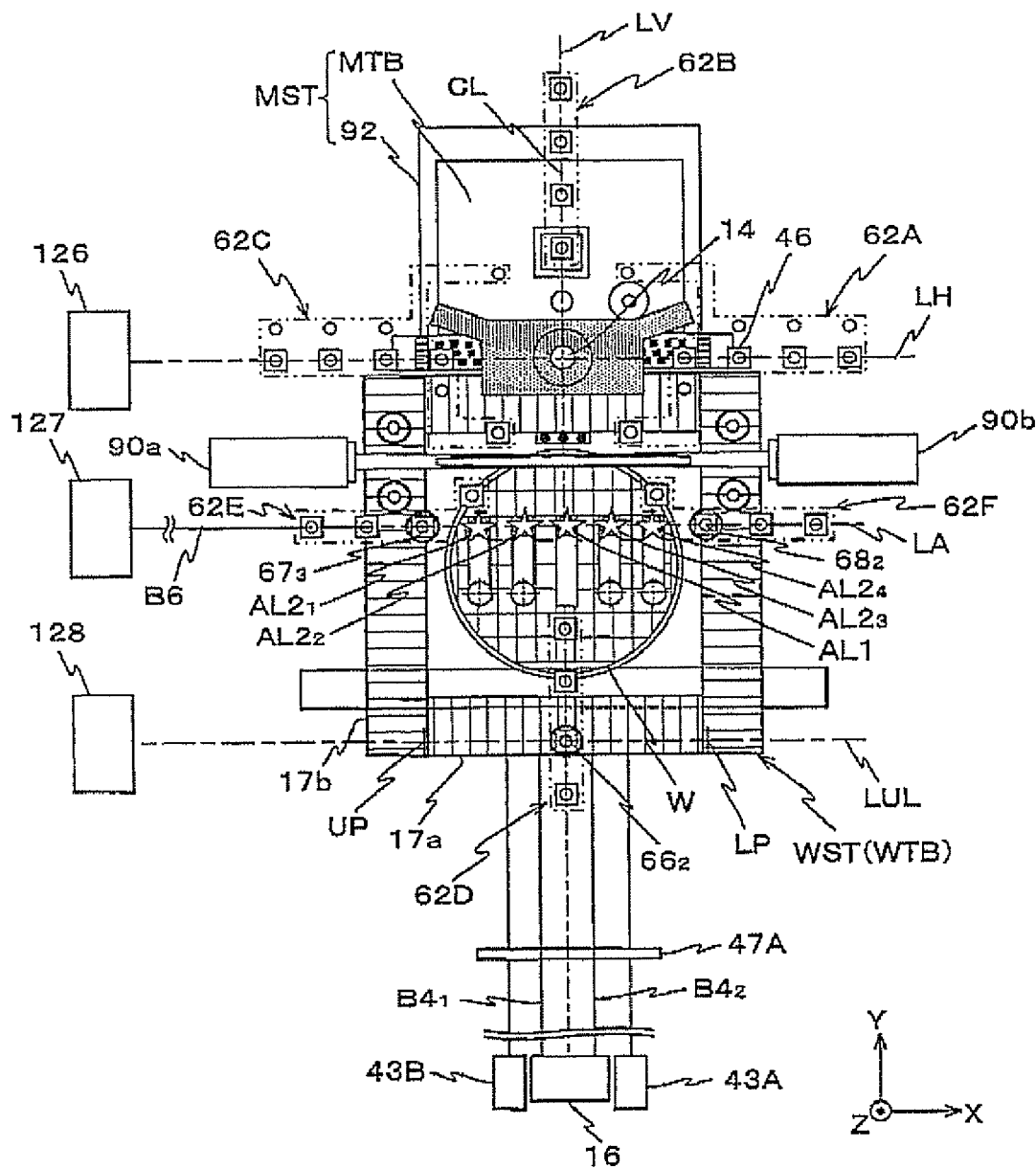
FIG. 19 is a view showing a state of the wafer stage and the measurement stage when alignment marks arranged in five second alignment shot areas are being simultaneously detected using alignment systems AL1 and $AL2_1$ to $AL2_4$.

Main controller 20 can obtain displacement ΔX of wafer stage WST in the X-axis direction from the measurement values of measurement beam B6 of X interferometer 127 and the measurement values of measurement beam 37 of X interferometer 128. However, the placement of the three X interferometers 126, 127, and 128 is different in the Y-axis direction. Therefore, X interferometer 126 is used at the time of exposure as shown in FIG. 13, X interferometer 127 is used at the time of wafer alignment as shown in FIG. 19, and X interferometer 128 is used at the time of wafer loading shown in FIG. 15 and wafer unloading shown in FIG. 14.

From Z interferometers 43A and 43B previously described, measurement beams B1 and B2 that proceed along the Y-axis are irradiated toward movable mirror 41, respectively, as shown in FIG. 1. These measurement beams B1 and B2 are incident on reflection surfaces 41b and 41c of movable mirror 41, respectively, at a predetermined angle of incidence (the angle is to be θ/2). Then, measurement beam 31 is sequentially reflected by reflection surfaces 41b and 41c, and then is incident perpendicularly on the reflection surface of fixed mirror 47B, whereas measurement beam B2 is sequentially reflected by reflection surf aces 41c and 41b and is incident perpendicularly on the reflection surface of fixed mirror 47A. Then, measurement beams B2 and B1 reflected off the reflection surface of fixed mirrors 47A and 47B are sequentially reflected by reflection surfaces 41b and 41c again, or are sequentially reflected by reflection surfaces 41c and 41b again (returning the optical path at the time of incidence oppositely), and then are received by Z interferometers 43A and 43B.

In this case, when displacement of movable mirror 41 (more specifically, wafer stage WST) in the Z-axis direction is ΔZo and displacement in the Y-axis direction is ΔYo, an optical path length change ΔL1 of measurement beam B1 and an optical path length change ΔL2 of measurement beam B2 can respectively be expressed as in formulas (1) and (2) below.

$$\Delta L1 = \Delta YoX(1+\cos\theta) + \Delta Zo\, X \sin\theta \quad (1)$$

$$\Delta L2 = \Delta YoX(1+\cos\theta) - \Delta Zo\, X \sin\theta \quad (2)$$

Accordingly, from formulas (1) and (2), ΔZo and ΔYo can be obtained using the following formulas (3) and (4).

$$\Delta Zo = (\Delta L1 - \Delta L2)/2 \sin\theta \quad (3)$$

$$\Delta Yo = (\Delta L1 + \Delta L2)/\{2/(1+\cos\theta)\} \quad (4)$$

Displacements ΔZo and ΔYo above can be obtained with Z interferometers 43A and 43B. Therefore, displacement which is obtained using Z interferometer 43A is to be ΔZoR and ΔYoR, and displacement which is obtained using Z interferometer 43B is to be ΔZoL and ΔYoL. And the distance between measurement beams B1 and B2 irradiated by Z interferometers 43A and 43B, respectively, in the X-axis direction is to be a distance D (refer to FIG. 2). Under such premises, displacement (yawing amount) Δθz of movable mirror 41 (more specifically, wafer stage WST) in the θz direction and displacement (rolling amount) Δθy in the θy direction can be obtained by the following formulas (5) and (6).

$$\Delta\theta z = \tan^{-1}\{(\Delta YoR - \Delta YoL)/D\} \quad (5)$$

$$\Delta\theta y = \tan^{-1}\{(\Delta ZoL - \Delta ZoR)/D\} \quad (6)$$

Accordingly, by using the formulas (3) to (6) above, main controller 20 can compute displacement of wafer stage WST in four degrees of freedom, ΔZo, ΔYo, Δθz, and Δθy, based on the measurement results of Z interferometers 43A and 43B.

In the manner described above, from the measurement results of interferometer system 118, main controller 20 can obtain displacement of wafer stage WST in directions of six degrees of freedom (Z, X, Y, θz, θx, and θy directions).

Incidentally, in the embodiment, while a single stage which can be driven in six degrees of freedom was employed as wafer stage WST, instead of this, wafer stage WST can be configured including a stage main section 91, which is freely movable within the XY plane, and a wafer table WTB, which is mounted on stage main section 91 and is finely drivable relatively with respect to stage main section 91 in at least the Z-axis direction, the θx direction, and the θy direction, or a wafer stage WST can be employed that has a so-called coarse and fine movement structure where wafer table WTB can be configured finely movable in the X-axis direction, the Y-axis direction, and the θz direction with respect to stage main section 91. However, in this case, a configuration in which positional information of wafer table WTB in directions of six degree of can be measured by interferometer system 118 will have to be employed. Also for measurement stage MST, the stage can be configured similarly, by a stage main section 92, and a measurement table MTB, which is mounted on stage main section 91 and has three degrees of freedom or six degrees of freedom. Further, instead of reflection surface 17a and reflection surface 17b, a movable mirror consisting of a plane mirror can be arranged in wafer table WTB.

In the embodiment, however, position information within the XY plane (including the rotation information in the θz direction) for position control of wafer stage WST (wafer table WTB) is mainly measured by an encoder system (to be described later), and the measurement values of interferometers 16, 126, and 127 are secondarily used in cases such as when long-term fluctuation (for example, by temporal deformation or the like of the scales) of the measurement values of the encoder system is corrected (calibrated).

Incidentally, at least part of interferometer system 118 (such as an optical system) may be arranged at the main frame that holds projection unit PU, or may also be arranged integrally with projection unit PU that is supported in a suspended state as is described above, however, in the embodiment, interferometer system 118 is to be arranged at the measurement frame described above.

Incidentally, in the embodiment, positional information of wafer stage WST was to be measured with a reflection surface of a fixed mirror arranged in projection unit PU serving as a reference surface, however, the position to place the reference surface at is not limited to projection unit PU, and the fixed mirror does not always have to be used to measure the positional information of wafer stage WST.

Further, in the embodiment, positional information of wafer stage WST measured by interferometer system 118 is not used in the exposure operation and the alignment operation which will be described later on, and was mainly to be used in calibration operations (more specifically, calibration of measurement values) of the encoder system, however, the measurement information (more specifically, at least one of the positional information in directions of six degrees of freedom) of interferometer system 118 can be used in the exposure operation and/or the alignment operation. Further, using interferometer system 118 as a backup of an encoder system can also be considered, which will be explained in detail later on. In the embodiment, the encoder system measures positional information of wafer stage WST in directions of three degrees of freedom, or more specifically, the X-axis, the Y-axis, and the θz directions. Therefore, in the exposure operation and the like, of the measurement information of interferometer system 118, positional information related to a direction that is different from the measurement direction (the X-axis, the Y-axis, and the θz direction) of wafer stage WST by the encoder system, such as, for example, positional information related only to the θx direction and/or the θy direction can be used, or in addition to the positional information in the different direction, positional information related to the same direction (more specifically, at least one of the X-axis, the Y-axis, and the θz directions) as the measurement direction of the encoder system can also be used. Further, in the exposure operation and the like, the positional information of wafer stage WST in the Z-axis direction measured using interferometer system 118 can be used.

In addition, interferometer system 118 (refer to FIG. 6) includes a Y interferometer 18 and an X interferometer 130 for measuring the two-dimensional position coordinates of measurement table MTB. Y interferometer 18 and X interferometer 130 (X interferometer 130 is not shown in FIG. 1, refer to FIG. 2) irradiate measurement beams on reflection surfaces 19a and 19b of measurement table MTB as shown in FIG. 2, and measure the displacement from a reference position of each reflection surface by receiving the respective reflected lights. Main controller 20 receives the measurement values of Y interferometer 18 and X interferometer 130, and computes the positional information (for example, including at least the positional information in the X-axis and the Y-axis directions and rotation information in the θz direction) of measurement stage MST.

Incidentally, as the Y interferometer used for measuring measurement table MTB, a multiaxial interferometer which is similar to Y interferometer 16 used for measuring wafer stage WST can be used. Further, as the X interferometer used for measuring measurement table MTB, a two-axis interferometer which is similar to X interferometer 126 used for measuring wafer stage WST can be used. Further, in order to measure Z displacement, Y displacement, yawing amount, and rolling amount of measurement stage MST, interferometers similar to Z interferometers 43A and 43B used for measuring wafer stage WST can be introduced.

Next, the structure and the like of encoder system 150 (refer to FIG. 6) which measures positional information (including rotation information in the θz direction) of wafer stage WST in the XY plane will be described.

In exposure apparatus 100 of the embodiment, as shown in FIG. 3, four head units 62A to 62D of encoder system 150 are placed in a state of surrounding nozzle unit 32 on all four sides. In actual, head units 62A to 62D are fixed to the foregoing main frame that holds projection unit PU in a suspended state via a support member, although omitted in the drawings such as FIG. 3 from the viewpoint of avoiding intricacy of the drawings.

As shown in FIG. 37 head units 62A and 62C are placed on the +X side and the −X side of projection unit PU, with the X-axis direction serving as a longitudinal direction. Head units 62A and 62C are each equipped with a plurality of (five, in this case) Y heads $65_i$ and $64_j$ (i, j=1-5) that are placed at a distance WD in the X-axis direction. More particularly, head units 62A and 62C are each equipped with a plurality of (four, in this case) Y heads ($64_1$ to $64_4$ or $65_2$ to $65_5$) that are placed on straight line (reference axis) LH which passes through optical axis AX of projection optical system PL and is also parallel to the X-axis at distance WD except for the periphery of projection unit PU, and a Y head ($64_5$ or $65_1$) which is placed at a position a predetermined distance away in the −Y-direction from reference axis LH in the periphery of projection unit PU, or more specifically, on the −Y side of nozzle unit 32. Head units 62A and 62C are each also equipped with five Z heads which will be described later on. Hereinafter, Y heads $65j$ and $64i$ will also be described as Y heads 65 and 64, respectively, as necessary.

Head unit 62A constitutes a multiple-lens (five-lens, in this case) Y linear encoder thereinafter appropriately shortened to "Y encoder" or "encoder") 70A (refer to FIG. 6) that measures the position of wafer stage WST (wafer table WTB) in the Y-axis direction (the Y-position) using Y scale $39Y_1$ previously described. Similarly, head unit 62C constitutes a multiple-lens (five-lens, in this case) Y linear encoder 70C (refer to FIG. 6) that measures the Y-position of wafer stage WST using Y scale $39Y_2$ described above. In this case, distance WD in the X-axis direction of the five Y heads ($64_i$ or $65_j$) (more specifically, measurement beams) that head units 62A and 62C are each equipped with, is set slightly narrower than the width (to be more precise, the length of grid line 38) of Y scales $39Y_1$ and $39Y_2$ in the X-axis direction.

As shown in FIG. 3, head unit 62B is placed on the +Y side of nozzle unit 32 (projection unit PU), and is equipped with a plurality of, in this case, four X heads $66_5$ to $66_8$ that are placed on reference axis LV previously described along Y-axis direction at distance WD. Further, head unit 62D is placed on the −Y side of primary alignment system AL1, on the opposite side of head unit 62B via nozzle unit 32 (projection unit PU), and is equipped with a plurality of, in this case, four X heads $66_1$ to $66_4$ that are placed on reference axis LV at distance WD. Hereinafter, X heads $66_1$ to $66_8$ will also be described as X head 66, as necessary.

Head unit 62B constitutes a multiple-lens (four-lens, in this case) X linear encoder (hereinafter, shortly referred to as an "X encoder" or an "encoder" as needed) 70B (refer to FIG. 6) that measures the position in the x-axis direction (the X-position) of wafer stage WST using X scale $39X_1$ described above. Further, head unit 62D constitutes a multiple-lens (four-lens, in this case) X encoder 70D (refer to FIG. 6) that measures the X-position of wafer stage WST using X scale $39X_2$ described above.

Here, the distance between adjacent X heads 66 (measurement beams) that are equipped in each of head units 62B and 62D is set shorter than a width in the Y-axis direction of X scales $39X_1$ and $39X_2$ (to be more accurate, the length of grid line 37). Further, the distance between X head $66_5$ of head unit 62B farthest to the −Y side and X head $66_4$ of head unit 62D farthest to the +Y side is set slightly narrower than the width of wafer stage WST in the Y-axis direction so that switching (linkage described below) becomes possible between the two X heads by the movement of wafer stage WST in the Y-axis direction.

In the embodiment, furthermore, head units 62F and 62E are respectively arranged a predetermined distance away on the −Y side of head units 62A and 62C. Although illustration of head units 62E and 62F is omitted in FIG. 3 and the like from the viewpoint of avoiding intricacy of the drawings, in actual practice, head units 62E and 62F are fixed to the foregoing main frame that holds projection unit PU in a suspended state via a support member. Incidentally, for example, in the case projection unit PU is supported in a suspended state, head units 62E and 62F, and head units 62A to 62D which are previously described can be supported in a suspended state integrally with projection unit PU, or can be arranged at the measurement frame described above.

Head unit 62E is equipped with four Y heads $67_1$ to $67_4$ whose positions in the X-axis direction are different. More particularly, head unit 62E is equipped with three Y heads $67_1$ to $67_3$ placed on the −X side of the secondary alignment system $AL2_1$ on reference axis LA previously described at substantially the same distance as distance WD previously described, and one Y head $67_4$ which is placed at a position a predetermined distance (a distance slightly shorter than WD) away on the +X side from the innermost (the +X side) Y head $67_3$ and is also on the +Y side of the secondary alignment system $AL2_1$ a predetermined distance away to the +Y side of reference axis LA.

Head unit 62F is symmetrical to head unit 62E with respect to reference axis LV, and is equipped with four Y heads $68_1$ to $68_4$ which are placed in symmetry to four Y heads $67_1$ to $67_4$ with respect to reference axis LV. Hereinafter, Y heads $67_1$ to $67_4$ and $68_1$ to $68_4$ will also be described as Y heads 67 and 68, respectively, as necessary. In the case of an alignment operation and the like which will be described later on, at least one each of Y heads 67 and 68 faces Y scale $39Y_2$ and $39Y_1$, respectively, and by such Y heads 67 and 68 (more specifically, Y encoders 70E and 70F which are configured by these Y heads 67 and 68), the Y position (and the θz rotation) of wafer stage WST is measured.

Further, in the embodiment, at the time of baseline measurement (Sec-BCHK (interval)) and the like of the secondary alignment system AL21 which will be described later on, Y head $67_3$ and $68_2$ which are adjacent to the secondary alignment systems $AL2_1$ and $AL2_4$ in the X-axis direction f ace the pair of reference gratings 52 of FD bar 46, respectively, and by Y heads $67_3$ and $68_2$ that face the pair of reference gratings 52, the Y position of FD bar 46 is measured at the position of each reference grating 52. In the description below, the encoders configured by Y heads $67_3$ and $68_2$ which face the pair of reference gratings 52, respectively, are referred to as Y linear encoders (also shortly referred to as a "Y encoder" or an "encoder" as needed) $70E_2$ and $70F_2$. Further, for identification, Y encoders 70 and 70 configured by Y heads 67 and 68 that face Y scales $39Y_2$ and $39Y_1$ described above, respectively, will be referred to as Y encoders $70E_1$ and $70F_1$.

The linear encoders 70A to 70F described above measure the position coordinates of wafer stage WST at a resolution of, for example, around 0.1 nm, and the measurement values are supplied to main controller 20. Main controller 20 controls the position within the XY plane of wafer stage WST based on three measurement values of linear encoders 70A to 70D or on three measurement values of encoders 70B, 70D, $70E_1$, and $70F_1$, and also controls the rotation in the θz direction of FD bar 46 based on the measurement values of linear encoders $70E_2$ and $70F_2$.

In exposure apparatus 100 of the embodiment, as shown in FIG. 3, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, U.S. Pat. No. 5,448,332 and the like. In the embodiment, as an example, irradiation system 90a is placed on the +Y side of the −X end portion of head unit 62E previously described, and photodetection system 90b is placed on the +Y side of the +X end portion of head unit 62F previously described in a state opposing irradiation system 90a.

A plurality of detection points of the multipoint AF system (90a, 90b) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set to around the same as the diameter of wafer W, by only scanning wafer W in the Y-axis direction once, position information (surface position information) in the Z-axis direction across the entire surface of wafer W can be measured. Further, since detection area AF is placed between liquid immersion area 14 (exposure area IA) and the detection areas of the alignment systems (AL1, $AL2_1$ to $AL2_4$) in the Y-axis direction, the detection operations of the multipoint AF system and the alignment systems can be performed in parallel. The multipoint AF system may also be arranged on the main frame that holds projection unit PU or the like, however, in the embodiment, the system will be arranged on the measurement frame previously described.

Incidentally, the plurality of detection points are to be placed in one row and M columns, or two rows and N columns, but the number(s) of rows and/or columns is/are not limited to these numbers. However, in the case the number of tows is two or more, the positions in the X-axis direction of detection points are preferably made to be different between the different rows. Moreover, the plurality of detection points is to be placed along the X-axis direction. However, the present invention is not limited to this and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the vicinity of detection points located at both ends out of a plurality of detection points of the multipoint AF system (90a, 90b), that is, in the vicinity of both end portions of beam area AF, heads 72a and 72b, and 72c and 72d of surface position sensors for Z position measurement (hereinafter, shortly referred to as "Z heads") are arranged each in a pair, in symmetrical placement with respect to reference axis LV. Z heads 72a to 72d are fixed to the lower surface of a main frame (not shown). Incidentally, Z heads 72a to 72d may also be arranged on the measurement frame described above or the like.

As Z heads 72a to 72d, a sensor head that irradiates a light to wafer table WTB from above, receives the reflected light and measures position information of the water table WTB surface in the Z-axis direction orthogonal to the XY plane at the irradiation point of the light, as an example, a head of an optical displacement sensor (a sensor head by an optical pickup method), which has a configuration like an optical pickup used in a CD drive device, is used.

Furthermore, head units 62A and 62C previously described are respectively equipped with Z heads $76_j$ and $74_i$ (i, j=1-5), which are five heads each, at the same X position as Y heads $65_j$ and $64_i$ (i, j=1-5) that head units 62A and 62C are respectively equipped with, with the Y position shifted. In this case, Z heads $76_3$ to $76_5$ and $74_1$ to $74_3$, which are three heads each on the outer side belonging to head units 62A and 62C, respectively, are placed parallel to reference axis LH a predetermined distance away in the +Y direction from reference axis LH. Further, Z heads $76_1$ and $74_5$, which are heads on the innermost side belonging to head units 62A and 62C, respectively, are placed on the +Y side of projection unit PU, and Z heads $76_2$ and $74_4$, which are the second innermost heads, are placed on the −Y side of Y heads $65_2$ and $64_4$, respectively. And Z heads $76_j$, $74_i$ (i, j=1-5), which are five heads each belonging to head unit 62A and 62C, respectively, are placed symmetric to each other with respect to reference axis LV. Incidentally, as each of the Z heads 76 and 74, an optical displacement sensor head similar to Z heads 72a to 72d described above is employed. Incidentally, the configuration and the like of the Z heads will be described later on.

In this case, Z head $74_i$ is on a straight line parallel to the Y-axis, the same as is with Z heads 72a and 72b previously described. Similarly, Z head $76_3$ is on a straight line parallel to the Y-axis, the same as is with Z heads 72c and 72d previously described.

Z heads 72a to 72d, Z heads $74_1$ to $74_5$, and Z heads $76_1$ to $76_5$ described above connect to main controller 20 via a signal processing/selection device 170, as shown in FIG. 6. Main controller 20 selects an arbitrary Z head from Z heads 72a to 72d, Z heads $74_1$ to $74_5$, and Z heads $76_i$ to $76_5$ via signal processing/selection device 170 and makes the head move into an operating state, and then receives the surface position information detected by the Z head which is in the operating state via signal processing/selection device 170. In the embodiment, a surface position measurement system 180 (a part of measurement system 200) that measures positional information of wafer stage WST in the Z-axis direction and the direction of inclination with respect to the XY plane is configured, including Z heads 72a to 72d, Z heads $74_1$ to $74_5$, and Z heads $76_1$ to $76_5$, and signal processing/selection device 170.

Incidentally, in FIG. 3, measurement stage MST is omitted and a liquid immersion area that is formed by water Lq held in the space between measurement stage MST and tip lens 191 is shown by a reference code 14. Further, in FIG. 3, a reference code UP indicates an unloading position where a wafer on wafer table WTB is unloaded, and a reference code LP indicates a loading position where a wafer is loaded on wafer table WTB. In the embodiment, unloading position UP and loading position LP are set symmetrically with respect to reference axis LV. Incidentally, unloading position UP and loading position LP may be the same position.

FIG. 6 shows the main configuration of the control system of exposure apparatus 100. The control system is mainly configured of main controller 20 composed of a microcomputer (or workstation) that performs overall control of the entire apparatus. In memory 34 which is an external memory connected to main controller 20, correction information is stored of measurement instrument systems such as interferometer system 118, encoder system 150 (encoders 70A to 70F), Z heads 72a to 72d, $74_1$ to $74_5$, $76_1$ to $76_5$ and the like. Incidentally, in FIG. 6, various sensors such as irregular illuminance sensor 94, aerial image measuring instrument 96 and wavefront aberration measuring instrument 98 that are arranged at measurement stage MST are collectively shown as a sensor group 99.

Next, the configuration and the like of Z heads 72a to 72d, $74_1$ to $74_5$, and $76_1$ to $76_5$ will be described, focusing on Z head 72a shown in FIG. 7 as a representative.

Figure 7:
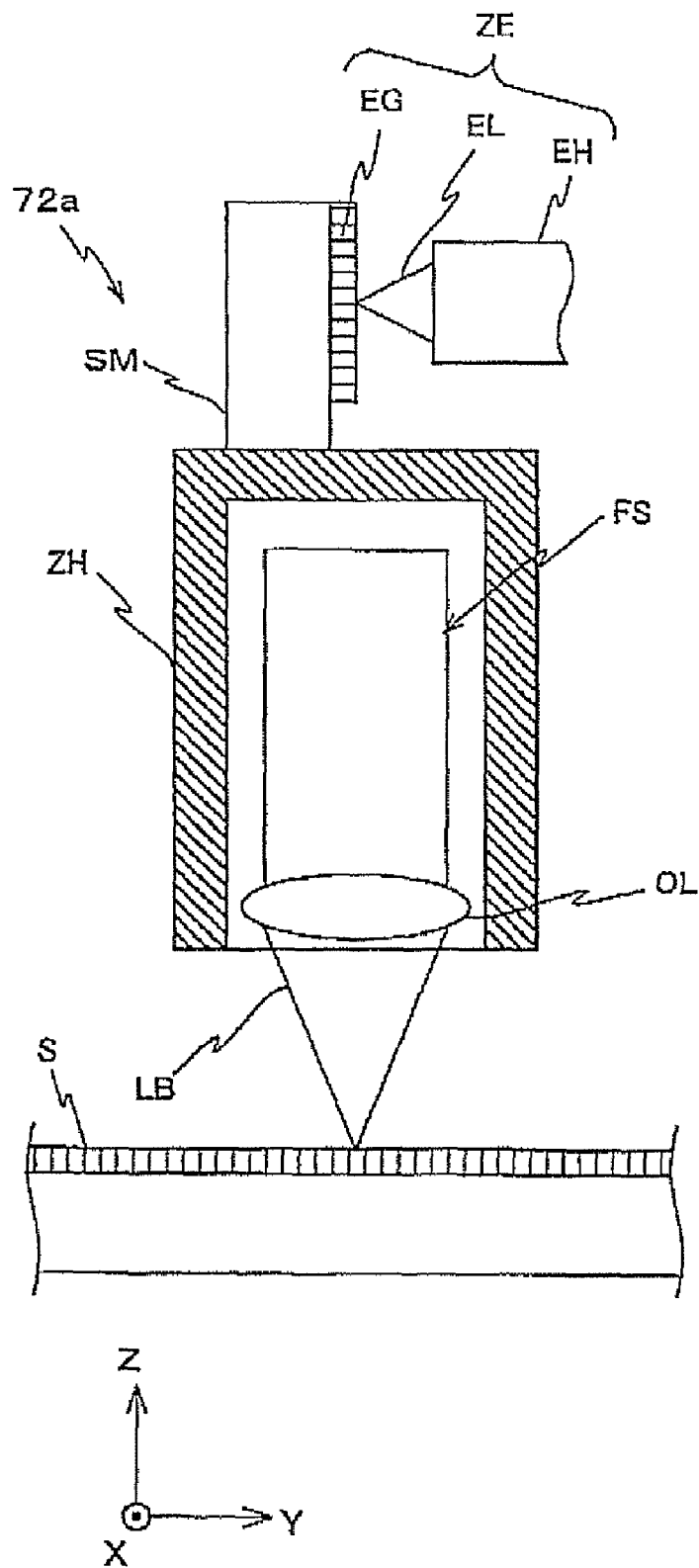
FIG. 7 is a view schematically showing an example of a configuration of a Z head.

As shown in FIG. 7, Z head 72a is equipped with a focus sensor FS, a sensor main section ZH which houses focus sensor FS, a drive section (not shown) which drives sensor main section ZH in the Z-axis direction, a measurement section ZE which measures displacement of sensor main section ZH in the Z-axis direction and the like.

As focus sensor FS, an optical displacement sensor similar to an optical pickup used in a CD drive unit that irradiates a probe beam LB on a measurement target surface S and optically reads the displacement of measurement surface S by receiving the reflected light is used. The configuration and the like of the focus sensor will be described later in the description. The output signal of focus sensor FS is sent to the drive section (not shown).

The drive section (not shown) includes an actuator such as, for example, a voice coil motor, and one of a mover and a stator of the voice coil motor is fixed to sensor main section ZH, and the other is fixed to a part of a housing (not shown) which houses the sensor main section ZH, measurement section ZE and the like, respectively. The drive section drives sensor main section ZH in the Z-axis direction according to the output signals from focus sensor FS so that the distance between sensor main section ZH and measurement target surface S is constantly maintained (or to be more precise, so that measurement target surface S is maintained at the best focus position of the optical system of focus sensor FS). By this drive, sensor main section ZH follows the displacement of measurement target surface S in the Z-axis direction, and a focus lock state is maintained.

As measurement section ZE, in the embodiment, an encoder by the diffraction interference method is used as an example. Measurement section ZE includes a reflective diffraction grating EG whose periodic direction is the Z-axis direction arranged on a side surface of a support member SM fixed on the upper surface of sensor main section ZH extending in the Z-axis direction, and an encoder head EH which is attached to the housing (not shown) facing diffraction grating EG. Encoder head ER reads the displacement of sensor main section ZH in the Z-axis direction by irradiating probe beam EL on diffraction grating EG, receiving the reflection/diffraction light from diffraction grating EG with a light-receiving element, and reading the deviation of an irradiation point of probe beam EL from a reference point (for example, the origin).

In the embodiment, in the focus lock state, sensor main section ZH is displaced in the Z-axis direction so as to constantly maintain the distance with measurement target surface S as described above. Accordingly, by encoder head EH of measurement section ZE measuring the displacement of sensor main section ZH in the Z-axis direction, surface position (z position) of measurement target surface S is measured. Measurement values of encoder head ER is supplied to main controller 20 via signal processing/selection device 170 previously described as measurement values of Z head 72a.

As shown in FIG. 8A, as an example, focus sensor FS includes three sections, an irradiation system $FS_1$, an optical system $FS_2$, and a photodetection system $FS_3$.

Irradiation system $FS_1$ includes, for example, a light source LD made up of laser diodes, and a diffraction grating plate (a diffractive optical element) ZG placed on the optical path of a laser beam outgoing from light source LD.

Optical system $FS_2$ includes, for instance, a diffraction light of the laser beam generated in diffraction grating plate ZG, or more specifically, a polarization beam splitter PBS, a collimator lens CL, a quarter-wave plate (a λ/4 plate) WP, and object lens OL and the like placed sequentially on the optical path of probe beam $LB_1$.

Photodetection system $FS_3$, for instance, includes a cylindrical lens CYL and a tetrameric light receiving element ZD placed sequentially on a return optical path of reflected beam $LB_2$ of probe beam $LB_1$ on measurement target surface S.

According to focus sensor FS, the linearly polarized laser beam generated in light source LD of irradiation system $FS_1$ is irradiated on diffraction grating plate ZG, and diffraction light (probe beam) $LB_1$ is generated in diffraction grating plate ZG. The central axis (principal ray) of probe beam $LB_1$ is parallel to the Z-axis and is also orthogonal to measurement target surface S.

Then, probe beam $LB_1$, or more specifically, light having a polarization component that is a P-polarized light with respect to a separation plane of polarization beam splitter PBS, is incident on optical system $FS_2$. In optical system $FS_2$, probe beam $LB_1$ passes through polarization beam splitter PBS and is converted into a parallel beam at collimator lens CL, and then passes through λ/4 plate WP and becomes a circular polarized light, which is condensed at object lens OL and is irradiated on measurement target surface S. Accordingly, at measurement target surface S, reflected light (reflected beam) $LB_2$ occurs, which is a circular polarized light that proceeds inversely to the incoming light of probe beam $LB_1$. Then, reflected beam $LB_2$ traces the optical path of the incoming light (probe beam $LB_1$) the other way around, and passes through object lens OL, λ/4 plate WP, collimator lens CL, and then proceeds toward polarization beam splitter PBS. In this case, because the beam passes through λ/4 plate WP twice, reflected beam $LB_2$ is converted into an S-polarized light. Therefore, the proceeding direction of reflected beam $LB_2$ is bent at the separation plane of polarization beam splitter PBS, so that it moves toward photodetection system $FS_3$.

In photodetection system $FS_3$, reflected beam $LB_2$ passes through cylindrical lenses CYL and is irradiated on a detection surface of tetrameric light receiving element ZD. In this case, cylindrical lenses CYL is a "cambered type" lens, and as shown in FIG. 8B, the YZ section has a convexed shape with the convexed section pointing the Y-axis direction, and as shown also in FIG. 8C, the XY section has a rectangular shape. Therefore, the sectional shape of reflected beam $LB_2$ which passes through cylindrical lenses CYL is narrowed asymmetrically in the Z-axis direction and the X-axis direction, which causes astigmatism.

Tetrameric light receiving element ZD receives reflected beam $LB_2$ on its detection surface. The detection surface of tetrameric light receiving element ZD has a square shape as a whole as shown in FIG. 9A, and it is divided equally into four detection areas a, b, c, and d with the two diagonal lines serving as a separation line. The center of the detection surface will be referred to as $O_{ZD}$.

In this case, in an ideal focus state (a state in focus) shown in FIG. 8A, or more specifically, in a state where probe beam $LB_1$ is focused on measurement target surface $S_0$, the cross-sectional shape of reflected beam $LB_2$ on the detection surface becomes a circle with center $O_{ZD}$ serving as a center, as shown in view 9C.

Further, in the so-called front-focused state (more specifically, a state equivalent to a state where measurement target surface S is at ideal position $S_0$ and tetrameric light receiving element ZD is at a position shown by reference code 1 in FIGS. 8B and 8C) where probe beam $LB_1$ focuses on measurement target surface $S_1$ in FIG. 8A, the cross-sectional shape of reflected beam $LB_2$ on the detection surface becomes a horizontally elongated circle with center $O_{ZD}$ serving as a center as shown in FIG. 9B.

Further, in the so-called back-focused state (more specifically, a state equivalent to a state where measurement target surface S is at ideal position $S_0$ and tetrameric light receiving element ZD is at a position shown by reference code—1 in FIGS. 8B and 8C) where probe beam $LB_1$ focuses on measurement target surface $S_{-1}$ in FIG. BA, the cross-sectional shape of reflected beam $LB_2$ on the detection surface becomes a longitudinally elongated circle with center $O_{ZD}$ serving as a center as shown in FIG. 9D.

In an operational circuit (not shown) connected to tetrameric light receiving element ZD, a focus error I expressed as in the following formula (7) is computed and output to the drive section (not shown), with the intensity of light received in the four detection areas a, b, c, and d expressed as Ia, Ib, Ic, and Id, respectively.

$$I=(Ia+Ic)-(Ib+Id) \qquad (7)$$

Incidentally, in the ideal focus state described above, because the area of the beam cross-section in each of the four detection areas is equal to each other, focus error I=0 can be obtained. Further, in the front focused state described above, according to formula (7), focus error becomes I<0, and in the back focused state, according to formula (7), focus error becomes I>0.

The drive section (not shown) receives focus error I from a detection section $FS_3$ within focus sensor FS, and drives sensor main body ZH which stored focus sensor FS in the Z-axis direction so as to reproduce I=0. By this operation of the drive section, because sensor main section ZH is also displaced following measurement target surface S, the probe beam focuses on measurement target surface S without fail, or more specifically, the distance between sensor main section ZH and measurement target surface S is always constantly maintained (focus lock state is maintained).

Meanwhile, the drive section (not shown) can also drive and position sensor main section ZH in the Z-axis direction so that a measurement result of measurement section ZE coincides with an input signal from the outside of Z head 72a. Accordingly, the focus of probe beam LB can also be positioned at a position different from the actual surface position of measurement target surface S. By this operation (scale servo control) of the drive section, processes such as return process in the switching of the Z heads, avoidance process at the time of abnormality generation in the output signals and the like can be performed.

In the embodiment, as is previously described, an encoder is adopted as measurement section ZE, and encoder head ER is used to read the Z displacement of diffraction grating EG set in sensor main section ZH. Because encoder head ER is a relative position sensor which measures the displacement of the measurement object (diffraction grating EG) from a reference point, it is necessary to determine the reference point. In the embodiment, the reference position (for example, the origin) of the Z displacement can be determined by detecting an edge section of diffraction grating EG, or in the case a lay out pattern is arranged in diffraction grating EG, by detecting the pattern for positioning. In any case, reference surface position of measurement target surface S can be determined in correspondence with the reference position of diffraction grating EG, and the Z displacement of measurement target surface S from the reference surface position, or more specifically, the position in the Z-axis direction can be measured. Incidentally, at the start up and the restoration of the Z head, setting of the reference position (for example, the origin, or more specifically, the reference surface position of measurement target surface S) of diffraction grating EG is executed without fail. In this case, it is desirable for the reference position to be set around the center of the movement range of sensor main section ZH. Therefore, a drive coil for adjusting the focal position of the optical system can be arranged to adjust the Z position of object lens OL so that the reference surface position corresponding to the reference position around the center coincides with the focal position of the optical system in the focus sensor FS.

In Z head 72a, because sensor main section ZH and measurement section ZE are housed together inside the housing (not shown) and the part of the optical path length of probe beam $LB_1$ which is exposed outside the housing is extremely short, the influence of air fluctuation is extremely small. Accordingly, even when compared, for example, with a laser interferometer, the sensor including the Z head is much more superior in measurement stability (short-term stability) during a period as short as while the air fluctuates.

The other Z heads are also configured and function in a similar manner as Z head 72a described above. As is described, in the embodiment, as each Z head, a configuration is employed where the diffraction grating surfaces of Y scales $39Y_1$, $39Y_2$ and the like are observed from above (the +Z direction) as in the encoder. Accordingly, by measuring the surface position information of the upper surface of wafer table WTB at different positions with the plurality of Z heads, the position of wafer stage WST in the Z-axis direction, the θy rotation (rolling), and the θx rotation (pitching) can be measured. However, in the embodiment, because the accuracy of pitching control of wafer stage WST is not especially important on exposure, the surface position measurement system including the Z head does not measure pitching, and a configuration was employed where one Z head each races Y scales $39Y_1$ and $39Y_2$.

Next, detection of position information (surface position information) of the wafer W surface in the Z-axis direction (hereinafter, referred to as focus mapping) that is performed in exposure apparatus 100 of the embodiment will be described.

Figure 10A:
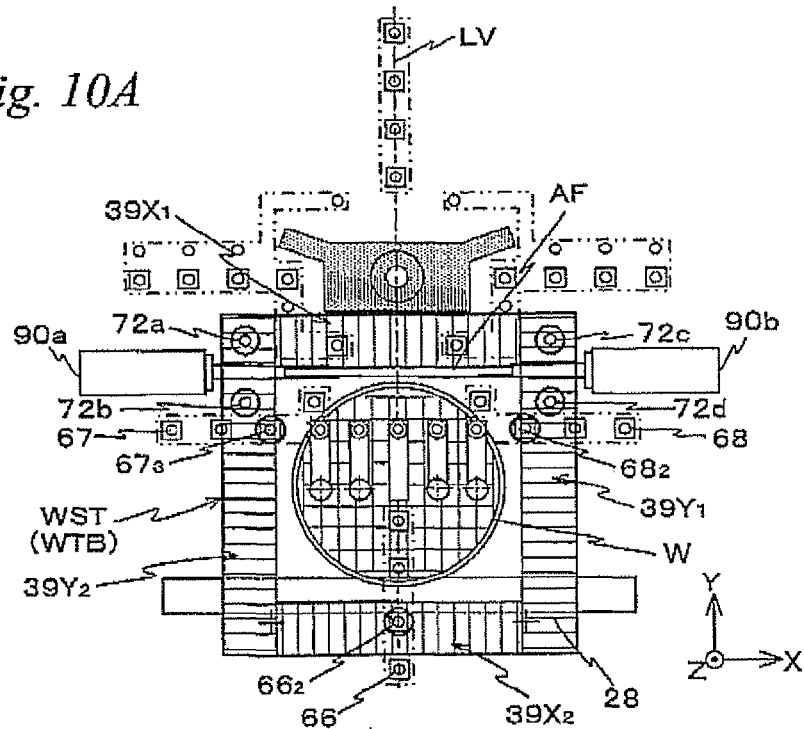
FIGS. 10A to 10C are views used to explain focus mapping performed in the exposure apparatus of an embodiment.

On the focus mapping, as is shown in FIG. 10A, main controller 20 controls the position within the XY plane of wafer stage WST based on X head $66_3$ facing X scale $39X_2$ (X linear encoder 70D) and two Y heads $68_2$ and $67_3$ facing Y scales $39Y_1$ and $39Y_2$ respectively (Y linear encoders 70F1 and 70E1). In the state of FIG. 10A, a straight line (centerline) parallel to the Y-axis that passes through the center of wafer table WTB (which substantially coincides with the center of wafer W) coincides with reference axis LV previously described. Further, although it is omitted in the drawing here, measurement stage MST is located on the +Y side of wafer stage WST, and water is retained in the space between FD bar 46, wafer table WTB and tip lens 191 of projection optical system PL previously described (refer to FIG. 18).

Then, in this state, main controller 20 starts scanning of wafer stage WST in the +Y direction, and after having started the scanning, activates (turns ON) both Z heads 72a to 72d and the multipoint AF system (90a, 90b) by the time when wafer stage WST moves in the +Y direction and detection beams (detection area AF) of the multipoint AF system (90a, 90b) begin to be irradiated on wafer W.

Figure 10B:
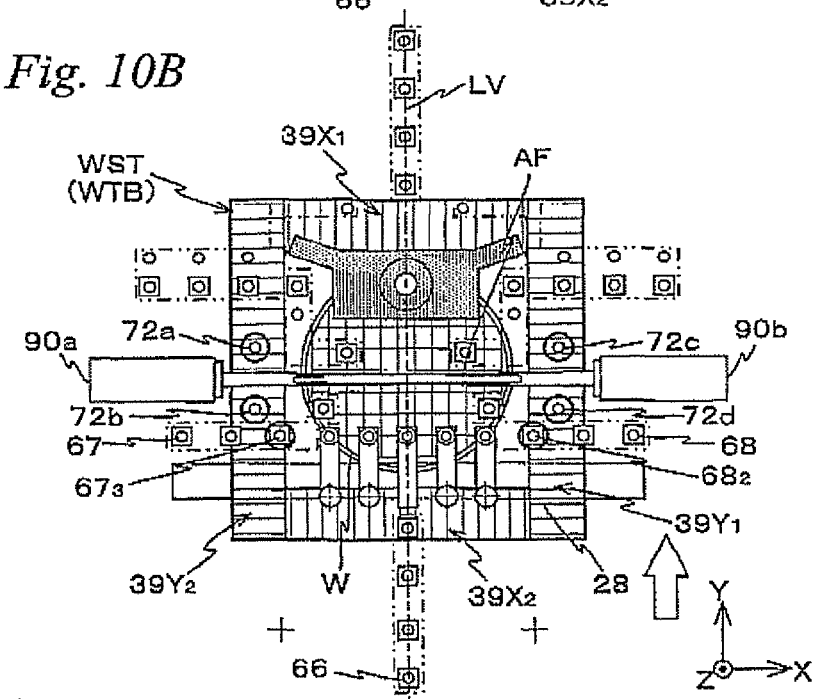

Then, in a state where Z heads 72a to 72d and the multipoint AF system (90a, 90b) simultaneously operate, as is shown in FIG. 10B, position information (surface position information) of the wafer table WTB surface (surface of plate 28) in the Z-axis direction that is measured by Z heads 72a to 72d and position information (surface position information) of the wafer W surface in the Z-axis direction at a plurality of detection points that is detected by the multipoint AF system (90a, 90b) are loaded at a predetermined sampling interval while wafer stage WST is proceeding in the +Y direction, and three kinds of information, which are the two kinds of surface position information that has been loaded and the measurement values of Y linear encoders $F_1$ and $70E_1$ at the time of each sampling, are made to correspond to one another, and then are sequentially stored in memory (not shown) (or in memory 34).

Then, when the detection beams of the multipoint AF system (90a, 90b) begin to miss wafer W, main controller 20 ends the sampling described above and converts the surface position information at each detection point of the multipoint AF system (90a, 90b) into data which uses the surface position information by Z heads 72a to 72d that has been loaded simultaneously as a reference.

Figure 10C:
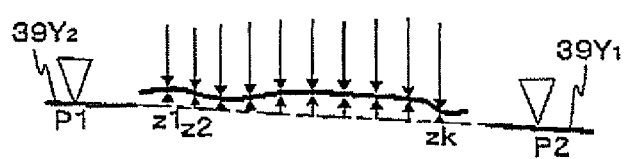

More specifically, based on an average value of the measurement values of Z heads 72a and 72b, surface position information at a predetermined point (for example, corresponding to a midpoint of the respective measurement points of Z heads 72a and 72b, that is, a point on substantially the same X-axis as the array of a plurality of detection points of the multipoint AF system (90a, 90b): hereinafter, this point is referred to as a left measurement point P1) on an area (an area where Y scale $39Y_2$ is formed) near the edge section on the –X side of plate 28 is obtained. Further, based on an average value of the measurement values of Z heads 72c and 72d, surface position information at a predetermined point (for example, corresponding to a midpoint of the respective measurement points of Z heads 72c and 72d, that is, a point on substantially the same X-axis as the array of a plurality of detection points of the multipoint AF system (90a, 90b): hereinafter, this point is referred to as a right measurement point P2) on an area (an area where Y scale $39Y_1$ is formed) near the edge section on the +X side of plate 28 is obtained. Then, as shown in FIG. 10C, main controller 20 converts the surface position information at each detection point of the multipoint AF system (90a, 90b) into surface position data z1-zk, which uses a straight line that connects the surface position of left measurement point P1 and the surface position of right measurement point P2 as a reference. Main controller 20 performs such a conversion on all information taken in during the sampling.

By obtaining such converted data in advance in the manner described above, for example, in the case of exposure, main controller 20 measures the wafer table WTB surface (a point on the area where Y scale $39Y_2$ is formed (a point near left measurement point P1 described above) and a point on the area where Y scale $39Y_1$ is formed (a point near right measurement point P1 described above)) with Z heads $74_i$ and $76_j$ previously described, and computes the z position and θy rotation (rolling) amount θy of wafer stage WST. Then, by performing a predetermined operation using the Z position, the rolling amount θy, and the θx rotation (pitching) amount θx of wafer stage WST measured with Y interferometer 16, and computing the Z position ($Z_0$), rolling amount θy, and pitching amount θx of the wafer table WTB surface in the center (the exposure center) of exposure area IA previously described, and then obtaining the straight line passing through the exposure center that connects the surface position of left measurement point P1 and the surface position of right measurement point P2 described above based on the computation results, it becomes possible to perform the surface position control (focus leveling control) of the upper surface of wafer W without actually acquiring the surface position information of the wafer W surface by using such straight line and surface position data z1-zk. Accordingly, because there is no problem even if the multipoint AF system is placed at a position away from projection optical system PL, the focus mapping of the embodiment can suitably be applied also to an exposure apparatus and the like that has a short working distance.

Incidentally, in the description above, while the surface position of left measurement point P1 and the surface position of right measurement point P2 were computed based on the average value of the measurement values of Z heads 72a and 72b, and the average value of Z heads 72c and 72d, respectively, the surface position information at each detection point of the multipoint AF system (90a, 90b) can also be converted, for example, into surface position data which uses the straight line connecting the surface positions measured by Z heads 72a and 72c as a reference. In this case, the difference between the measurement value of Z head 72a and the measurement value of Z head 72b obtained at each sampling timing, and the difference between the measurement value of Z head 72c and the measurement value of Z head 72a obtained at each sampling timing are to be obtained severally in advance. Then, when performing surface position control at the time of exposure or the like, by measuring the wafer table WTB surface with Z heads $74_i$ and $76_j$ and computing the Z-position and the θy rotation of wafer stage WST, and then performing a predetermined operation using these computed values, pitching amount θx of wafer stage WST measured by Y interferometer 16, surface position data z1 to zk previously described, and the differences described above, it becomes possible to perform surface position control of wafer W, without actually obtaining the surface position information of the wafer surface.

However, the description so far is made, assuming that unevenness does not exist on the wafer table WTB surface in the X-axis direction. Accordingly, hereinafter, to simplify the description, unevenness is not to exist on the wafer table WTB surface in the X-axis direction and the Y-axis direction.

Next, focus calibration will be described. Focus calibration refers to a process where a processing of obtaining a relation between surface position information of wafer table WTB at end portions on one side and the other side in the X-axis direction in a reference state and detection results (surface position information) at representative detection points on the measurement plate 30 surface of multipoint AF system (90a, 90b) (former processing of focus calibration), and a processing of obtaining surface position information of wafer table WTB at end portions on one side and the other side in the X-axis direction that correspond to the best focus position of projection optical system PL detected using aerial image measurement device 45 in a state similar to the reference state above (latter processing of focus calibration) are performed, and based on these processing results, an offset of multipoint AF system (90a, 90b) at representative detection points, or in other words, a deviation between the best focus position of projection optical system PL and the detection origin of the multipoint AF system, is obtained.

Figure 11A:
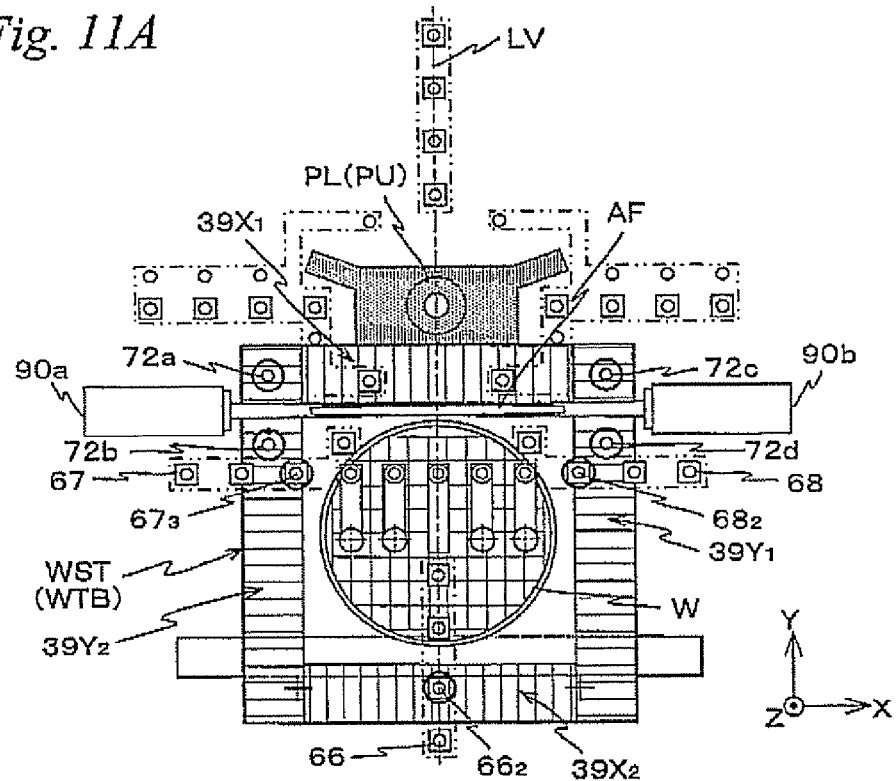
FIGS. 11A and 11B are views used to explain focus calibration performed in the exposure apparatus of an embodiment.

On the focus calibration, as is shown in FIG. 11A, main controller 20 controls the position within the XY plane of wafer stage WST based on X head $66_2$ facing X scale $39X_2$ (X linear encoder 70D) and two Y heads $68_2$ and $67_3$ facing Y scales $39Y_1$ and $39Y_2$ respectively (Y linear encoders 70A and 70C). The state of FIG. 11A is substantially the same as the state in 10A previously described. However, in the state of FIG. 11A, wafer stage WST is at a position where a detection beam from multipoint AF system (90a, 90b) is irradiated on measurement plate 30 previously described in the Y-axis direction.

(a) In this state, main controller 20 performs the former processing of focus calibration as in the following description. More specifically, while detecting surface position information of the end portions on one side and the other side of wafer table WTB in the X-axis direction that is detected by Z heads 72a, 72b, 72c and 72d previously described, main controller 20 uses the surface position information as a reference, and detects surface position information of the measurement plate 30 (refer to FIG. 3) surface previously described using the multipoint AF system (90a, 90b). Thus, a relation between the measurement values of Z heads 72a, 72b, 72c and 72d (surface position information at end portions on one side and the other side of wafer table WTB in the X-axis direction) and the detection results (surface position information) at a detection point (the detection point located in the center or the vicinity thereof out of a plurality of detection points) on the measurement plate 30 surface of the multipoint AF system (90a, 90b), in a state where the centerline of wafer table WTB coincides with reference line LV, is obtained.

Figure 11B:
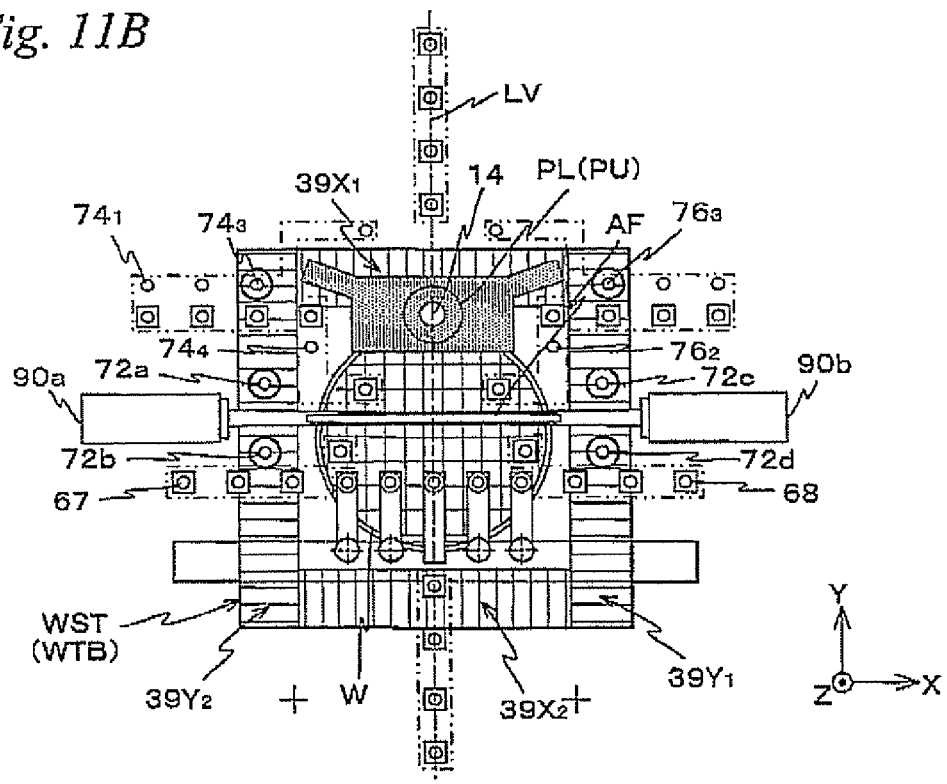

(b) Next, main controller 20 moves wafer stage WST in the +Y direction by a predetermined distance, and stops wafer stage WST at a position where measurement plate 30 is located directly below projection optical system PL. Then, main controller 20 performs the latter processing of focus calibration as follows. More specifically, as is shown in FIG. 11B, while controlling the position of measurement plate 30 (wafer stage WST) in the optical axis direction of projection optical system PL (the Z position), using surface position information measured by Z heads 72a, 72b, 72c, and 72d as a reference as in the former processing of focus calibration, main controller 20 measures an aerial image of a measurement mark formed on reticle R or on a mark plate (not shown) on reticle stage RST by a Z direction scanning measurement whose details are disclosed in, for example, the pamphlet of International Publication No. 2005/124834 and the like, using aerial image measurement device 45, and based on the measurement results, measures the best focus position of projection optical system PL. During the Z direction scanning measurement described above, main controller 20 takes in measurement values of a pair of Z heads $74_3$ and $76_3$ which measure the surface position information at end portions on one side and the other side of wafer table WTB in the X-axis direction, in synchronization with taking in output signals from aerial image measurement device 45. Then, main controller 20 stores the values of Z heads $74_3$ and $76_3$ corresponding to the best focus position of projection optical system PL in memory (not shown) (or in memory 34). Incidentally, the reason why the position (Z position) related to the optical axis direction Of projection optical system PL of measurement plate 30 (wafer stage WST) is controlled using the surface position information measured in the latter processing of the focus calibration by Z heads 72a, 72b, 72c, and 72d is because the latter processing of the focus calibration is performed during the focus mapping previously described.

In this case, because liquid immersion area 14 is formed between projection optical system PL and measurement plate 30 (wafer table WTB) as shown in FIG. 11B, the measurement of the aerial image is performed via projection optical system PL and the water. Further, although it is omitted in FIG. 11B, because measurement plate 30 and the like of aerial image measurement device 45 are installed in wafer stage WST, and the light receiving elements are installed in measurement stage MST, the measurement of the aerial image described above is performed while wafer stage WST and measurement stage MST maintain a contact state (or a proximity state) (refer to FIG. 20).

(c) Accordingly, main controller 20 can obtain the offset at the representative detection point of the multipoint AF system (90a, 90b), or more specifically, the deviation between the best focus position of projection optical system PL and the detection origin of the multipoint AF system, based on the relation between the measurement values of Z heads 72a, 72b, 72c, and 72d (surface position information at the end portions on one side and the other side in the X-axis direction of wafer table WTB) and the detection results (surface position information) of the measurement plate 30 surface by the multipoint AF system (90a, 90b) obtained in (a) described above, in the former processing of focus calibration, and also on the measurement values of Z heads $74_3$ and $76_3$ (that is, surface position information at the end portions on one side and the other side in the X-axis direction of wafer table WTB) corresponding to the best focus position of projection optical system PL obtained in (b) described above, in the latter processing of focus calibration. In the embodiment, the representative detection point is, for example, the detection point in the center of the plurality of detection points or in the vicinity thereof, but the number and/or the position may be arbitrary. In this case, main controller 20 adjusts the detection origin of the multipoint AF system so that the offset at the representative detection point becomes zero The adjustment may be performed, for example, optically, by performing angle adjustment of a plane parallel plate (not shown) inside photodetection system 90b, or the detection offset may be electrically adjusted. Alternatively, the offset may be stored, without performing adjustment of the detection origin. In this case, adjustment of the detection origin is to be performed by the optical method referred to above. This completes the focus calibration of the multipoint AF system (90a, 90b). Incidentally, because it is difficult to make the offset become zero at all the remaining detection points other than the representative detection point by adjusting the detection origin optically, it is desirable to store the offset after the optical adjustment at the remaining detection points.

Next, offset correction of detection values among a plurality of light-receiving elements (sensors) that individually correspond to a plurality of detection points of the multiple AF system (90a, 90b) (hereinafter, referred to as offset correction among AF sensors) will be described.

Figure 12A:
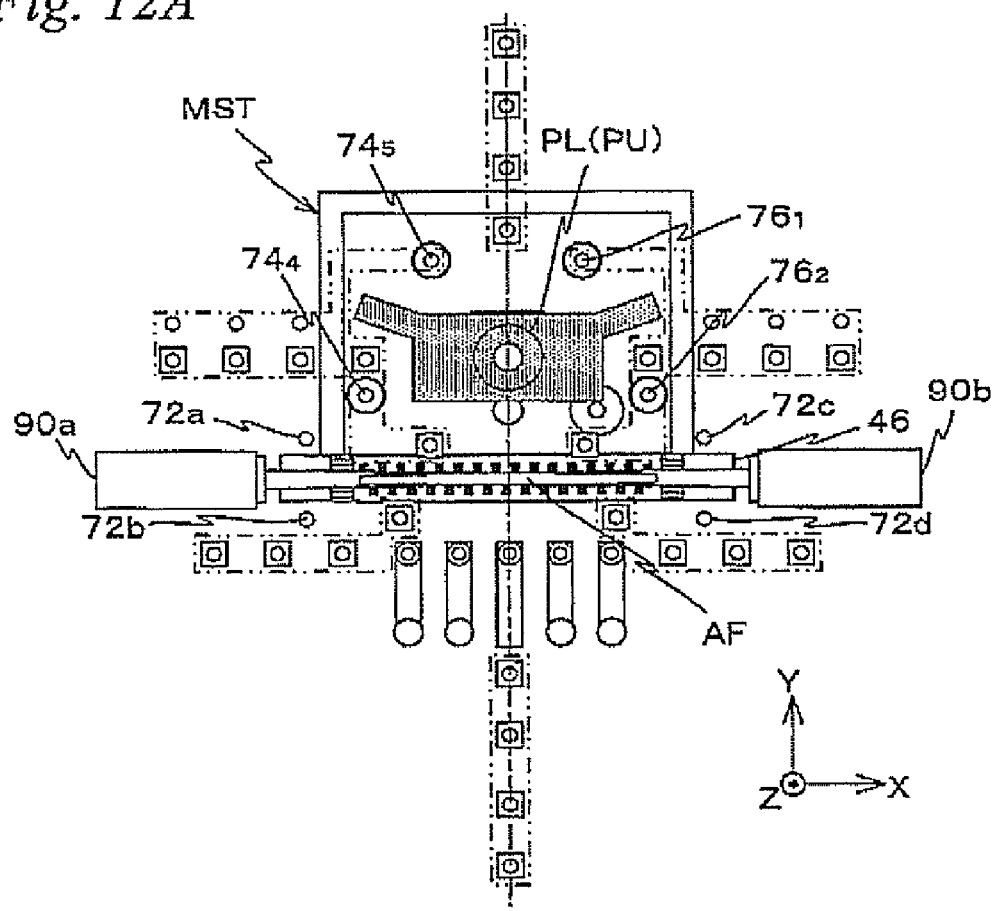
FIGS. 12A and 12B are views used to explain offset correction among AF sensors performed in the exposure apparatus related to an embodiment.
Figure 12B:
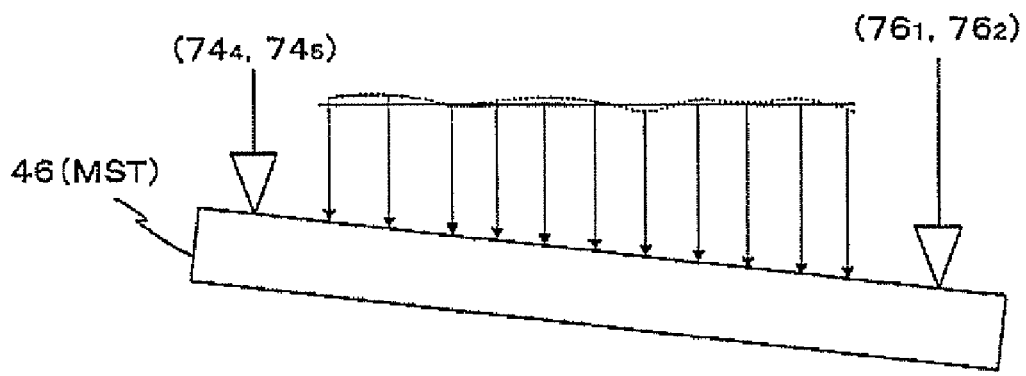

On the offset correction among AF sensors, as is shown in FIG. 12A, main controller 20 makes irradiation system 90a of the multipoint AF system (90a, 90b) irradiate detection beams to FD bar 46 equipped with a predetermined reference plane, and takes in output signals from photodetection system 90b of the multipoint AF system (90a, 90b) that receives the reflected lights from the FD bar 46 surface (reference plane).

In this case, if the FD bar 46 surface is set parallel to the XY plane, main controller 20 can perform the offset correction among AF sensors by obtaining a relation among the detection values (measurement values) of a plurality of sensors that individually correspond to a plurality of detection points based on the output signals loaded in the manner described above and storing the relation in a memory (or in memory 34), or by electrically adjusting the detection offset of each sensor so that the detection values of all the sensors become, for example, the same value as the detection value of a sensor that corresponds to the representative detection point on the focus calibration described above.

In the embodiment, however, as is shown in FIG. 12A, because main controller 20 detects the inclination of the surface of measurement stage MST (integral with FD bar 46) using Z heads $74_4$, $74_5$, $76_1$, and $76_2$ when taking in the output signals from photodetection system 90b of the multipoint AF system (90a, 90b), the FD bar 46 surface does not necessarily have to be set parallel to the XY plane. In other words, as is modeled in FIG. 12B, when it is assumed that the detection value at each detection point is the value as severally indicated by arrows in the drawing, and the line that connects the upper end of the detection values has an unevenness as shown in the dotted line in the drawing, each detection value only has to be adjusted so that the line that connects the upper end of the detection values becomes the solid line shown in the drawing.

Next, a parallel processing operation that uses wafer stage WST and measurement stage MST in exposure apparatus 100 of the embodiment will be described based on FIGS. 13 to 23. Incidentally, during the operation below, main controller 20 performs the open/close control of each valve of liquid supply unit 5 of local liquid immersion unit 8 and liquid recovery unit 6 in the manner previously described, and water is constantly filled on the outgoing surface side of tip lens 191 of projection optical system PL. However, in the description below, for the sake of simplicity, the explanation related to the control of liquid supply unit 5 and liquid recovery unit 6 will be omitted. Further, many drawings are used in the operation description hereinafter, however, reference codes may or may not be given to the same member for each drawing. More specifically, the reference codes written are different for each drawing; however, such members have the same configuration, regardless of the indication of the reference codes. The same can be said for each drawing used in the description so far.

FIG. 13 shows a state in which an exposure by the step-and-scan method of wafer W mounted on wafer stage WST is performed. This exposure is performed by alternately repeating a movement between shots in which wafer stage WST is moved to a scanning starting position (acceleration staring position) to expose each shot area on wafer W and scanning exposure in which the pattern formed on reticle R is transferred onto each shot area by the scanning exposure method, based on results of wafer alignment (EGA: Enhanced Global Alignment) and the like which has been performed prior to the beginning of exposure. Further, exposure is performed in the following order, from the shot area located on the −Y side on wafer W to the shot area located on the +Y side. Incidentally, exposure is performed in a state where liquid immersion area 14 is formed in between projection unit PU and wafer W.

During the exposure described above, the position (including rotation in the θz direction) of wafer stage WST in the XY plane is controlled by main controller 20, based on measurement results of a total of three encoders which are the two Y encoders 70A and 70C, and one of the two X encoders 70B and 70D. In this case, the two X encoders 70B and 70D are made up of two X heads 66 that face X scale $39X_1$ and $39X_2$, respectively, and the two Y encoders 70A and 70C are made up of Y heads 65 and 64 that face Y scales $39Y_1$ and $39Y_2$, respectively. Further, the Z position and rotation (rolling) in the θy direction of wafer stage WST are controlled based on measurement results of Z heads $74_i$ and $76_j$, which respectively belong to head units 62C and 62A facing the end section on one side and the other side of the surface of wafer table WTB in the X-axis direction, respectively. The θx rotation (pitching) of wafer stage WST is controlled based on measurement values of Y interferometer 16. Incidentally, in the case three or more Z heads including Z head $74_i$ and $76_i$ face the surface of the second water repellent plate $28h$ of wafer table WTB, it is also possible to control the position of wafer stage WST in the Z-axis direction, the θy rotation (rolling), and the θx rotation (pitching), based on the measurement values of Z heads $74_i$, $76_i$ and the other one head. In any case, the control (more specifically, the focus leveling control of wafer W) of the position of wafer stage WST in the Z-axis direction, the rotation in the θy direction, and the rotation in the θx direction is performed, based on results of a focus mapping performed beforehand.

At the position of wafer stage WST shown in FIG. 13, while X head $66_5$ (shown circled in FIG. 13) faces X scale $39X_1$, there are no X heads 66 that face X scale $39X_2$. Therefore, main controller 20 uses one X encoder 70B and two Y encoders 70A and 70C so as to perform position (X, Y, θz) control of wafer stage WST. In this case, when wafer stage WST moves from the position shown in FIG. 13 to the –Y direction, X head $66_5$ moves off of (no longer faces) X scale $39X_1$, and X head $66_4$ (shown circled in a broken line in FIG. 13) faces X scale $39X_2$ instead. Therefore, main controller 20 switches the control to a position (X, Y, θz) control of wafer stage WST that uses one X encoder 70D and two Y encoders 70A and 70C.

Further, when wafer stage WST is located at the position shown in FIG. 13, Z heads $74_3$ and $76_3$ (shown circled in FIG. 13) face Y scales $39Y_2$ and $39Y_1$, respectively. Therefore, main controller 20 performs position (Z, θy) control of wafer stage WST using Z heads $74_3$ and $76_3$. In this case, when wafer stage WST moves from the position shown in FIG. 13 to the +X direction, Z heads $74_3$ and $76_3$ move off of (no longer faces) the corresponding Y scales, and Z heads $74_4$ and $76_4$ (shown circled in a broken line in FIG. 13) respectively face Y scales $39Y_2$ and $39Y_1$ instead. Therefore, main controller 20 switches to position (Z, θy) control of wafer stage WST using Z heads $74_4$ and $76_4$.

In this manner, main controller 20 performs position control of wafer stage WST by consistently switching the encoder to use depending on the position coordinate of wafer stage WST.

Incidentally, independent from the position measurement of water stage WST described above using the measuring instrument system described above, position (X, Y, Z, θx, θy, θz) measurement of wafer stage WST using interferometer system 118 is constantly performed. In this case, the X position and θz rotation (yawing) of wafer stage WST or the X position are measured using X interferometers 126, 127, or 128, the Y position, the θx rotation, and the θz rotation are measured using Y interferometer 16, and the Y position, the Z position, the θy rotation, and the θz rotation are measured using Z interferometers 43A and 43B (not shown in FIG. 13, refer to FIG. 1 or 2) that constitute interferometer system 118. Of X interferometers 126, 127, and 128, one interferometer is used according to the Y position of wafer stage WST. As indicated in FIG. 13, X interferometer 126 is used during exposure. The measurement results of interferometer system 118 except for pitching (θx rotation) are used for position control of wafer stage WST secondarily, or in the case of back-up which will be described later on, or when measurement using encoder system 150 cannot be performed.

When exposure of wafer W has been completed, main controller 20 drives wafer stage WST toward unloading position UP. On this drive, wafer stage WST and measurement stage MST which were apart during exposure come into contact or move close to each other with a clearance of around 300 µm in between, and shift to a scrum state. In this case, the –Y side surface of FD bar 46 on measurement table MTB and the +Y side surface of wafer table WTB come into contact or move close together. And by moving both stages WST and MST in the –Y direction while maintaining the scrum condition, liquid immersion area 14 formed under projection unit PU moves to an area above measurement stage MST. For example, FIGS. 14 and 15 show the state after the movement.

When wafer stage WST moves further to the –Y direction and moves off from the effective stroke area (the area in which wafer stage WST moves at the time of exposure and wafer alignment) after the drive of wafer stage WST toward unloading position UP has been started, all the X heads and Y heads, and all the Z heads that constitute encoder 70A to 70D move off from the corresponding scale on wafer table WTB. Therefore, position control of wafer stage WST based on the measurement results of encoders 70A to 70D and the Z heads is no longer possible. Just before this, main controller 20 switches the control to a position control of wafer stage WST based on the measurement results of interferometer system 118. In this case, of the three X interferometers 126, 127, and 128, X interferometer 128 is used.

Then, wafer stage WST releases the scrum state with measurement stage MST, and then moves to unloading position UP as shown in FIG. 14. After the movement, main controller 20 unloads wafer W on wafer table WTB. And then, main controller 20 drives wafer stage WST in the TX direction to loading position LP, and the next wafer W is loaded on wafer table WTB as shown in FIG. 15.

In parallel with these operations, main controller 20 performs Sec-BCHK (a secondary base line check) in which position adjustment of FD bar 46 supported by measurement stage MST in the XY plane and baseline measurement of the four secondary alignment systems $AL2_1$ to $AL2_4$ are performed. Sec-BCHK is performed on an interval basis for every water exchange. In this case, in order to measure the position (the θz rotation) in the XY plane, Y encoders $70E_2$ and $70F_2$ previously described are used.

Next, as shown in FIG. 16, main controller 20 drives wafer stage WST and positions reference mark FM on measurement plate 30 within a detection field of primary alignment system AL1, and performs the former process of Pri-BCHK (a primary baseline check) in which the reference position is decided for baseline measurement of alignment system AL1, and $AL2_1$ to $AL2_4$.

On this process, as shown in FIG. 16, two Y heads $68_2$ and $67_3$ and one X head 66 (shown circled in the drawing) come to race Y scales $39Y_1$ and $39Y_2$, and X scale $39X_2$, respectively. Then, main controller 20 switches the stage control from a control using interferometer system 118, to a control using encoder system 150 (encoders $70F_1$, $70E_1$, and 70D). Interferometer system 118 is used secondarily again, except in measurement of the θx rotation. Incidentally, of the three X interferometers 126, 127, and 128, X interferometer 127 is used.

Next, while controlling the position of wafer stage WST based on the measurement values of the three encoders described above, main controller 20 begins the movement of wafer stage WST in the +Y direction toward a position where an alignment mark arranged in three first alignment shot areas is detected.

Then, when wafer stage WST reaches the position shown in FIG. 17, main controller 20 stops wafer stage WST. Prior to this operation, main controller 20 activates (turns ON) Z heads $72a$ to $72d$ and starts measurement of the Z-position and the tilt (the θy rotation) of wafer table WTB at the point in time when all of or part of Z heads $72a$ to $72d$ face(s) wafer table WTB, or before that point in time.

After wafer stage WST is stopped, main controller 20 detects the alignment mark arranged in the three first alignment shot areas substantially at the same time and also individually (refer to the star-shaped marks in FIG. 17), using primary alignment system AL1, and secondary alignment systems $AL2_2$ and $AL2_3$, and makes a link between the detection results of the three alignment systems AL1, $AL2_2$, and $AL2_3$ and the measurement values of the three encoders above at the time of the detection, and stores them in memory (not shown) (or in memory 34).

As in the description above, in the embodiment, the shift to the contact state (or proximity state) between measurement stage MST and wafer stage WST is completed at the position where detection of the alignment marks of the first alignment shot area is performed. And from this position, main controller 20 begins to move both stages WST and MST in the +Y direction (step movement toward the position for detecting an alignment mark arranged in five second alignment shot areas) in the contact state (or proximity state). Prior to starting the movement of both stages WST and MST in the +Y direction, as shown in FIG. 17, main controller 20 begins irradiation of a detection beam from irradiation system 90 of the multipoint AF system ($90a$, $90b$) to wafer table WTB. Accordingly, a detection area of the multipoint AF System is formed on wafer table WTB.

Figure 18:
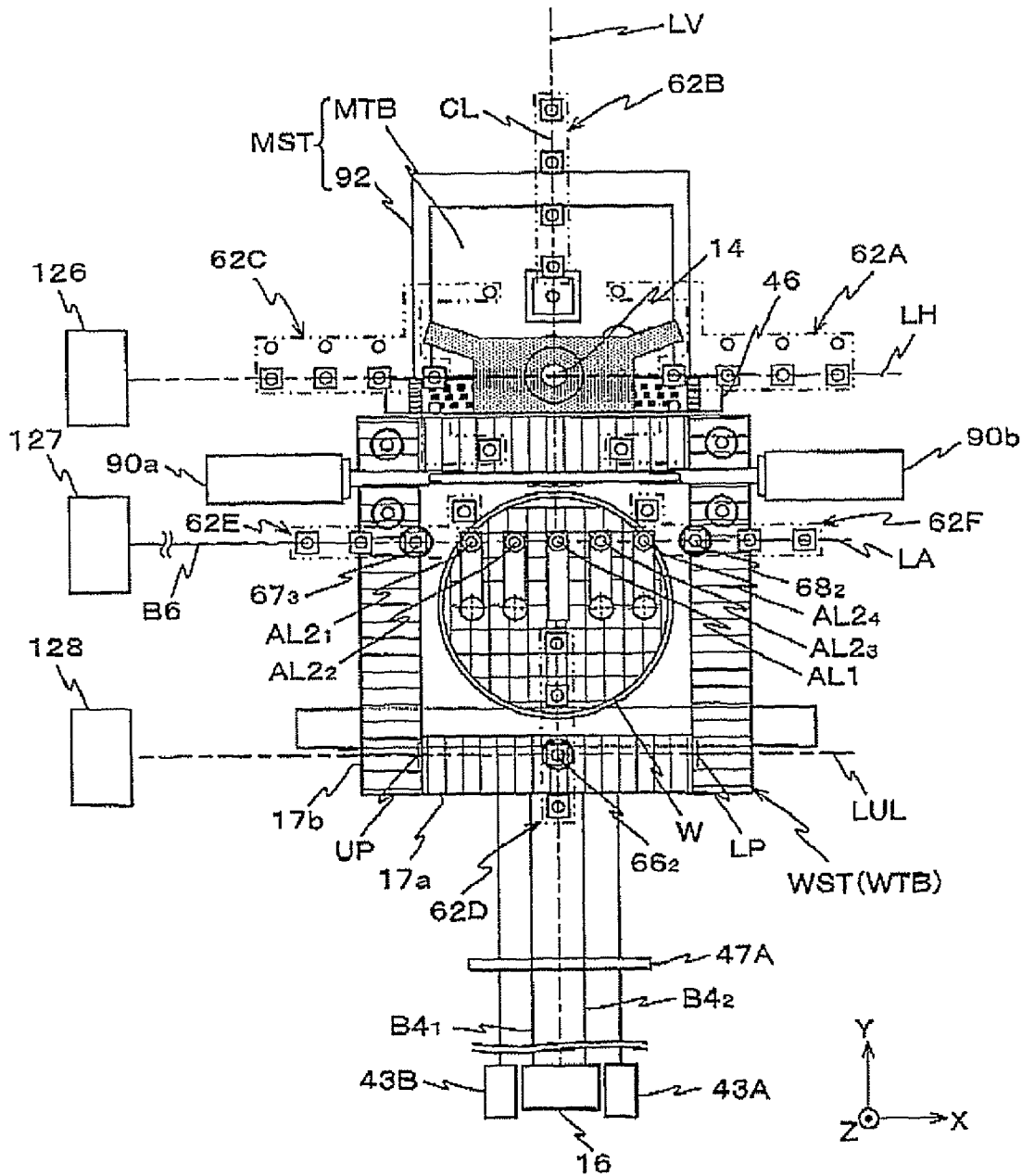
FIG. 18 is a view showing a state of the wafer stage and the measurement stage when the former processing of focus calibration is being performed.

Then, when both stages WST and MST reach the position shown in FIG. 18 during the movement of both stages WST and MST in the +Y direction, main controller 20 performs the former process of the focus calibration, and obtains the relation between the measurement values (surface position information on one side and the other side of water table WTB in the X-axis direction) of Z heads $72a$, $72b$, $72c$, and $72d$, in a state where the center line of wafer table WTB coincides with reference axis LV, and the detection results (surface position information) of the surface of measurement plate 30 by the multipoint AF system ($90a$, $90b$). At this point, liquid immersion area 14 is formed on the upper surface of FD bar 46.

Then, both stages WST and MST move further in the +Y direction while maintaining the contact state (or proximity state), and reach the position shown in FIG. 19. Then, main controller 20 detects the alignment mark arranged in the five second alignment shot areas substantially at the same time as well as individually (refer to the star-shaped marks in FIG. 19), using the five alignment systems AL1, and $AL2_1$ to $AL2_4$, and makes a link between the detection results of the five alignment systems AL1, and $AL2_1$ to $AL2_4$ and the measurement values of the three encoders measuring the position of wafer stage WST in the XY plane at the time of the detection, and then stores them in memory (not shown) (or in memory 34). At this point, main controller 20 controls the position of wafer stage WST within the XY plane based on the measurement values of X head $66_2$ (X linear encoder 70D) that faces X scale $39X_2$ and Y linear encoders $70F_1$ and $70E_1$.

Further, after the simultaneous detection of the alignment marks arranged in the five second alignment shot areas ends, main controller 20 starts again movement in the +Y direction of both stages WST and MST in the contact state (or proximity state), and at the same time, starts the focus mapping previously described using Z heads $72a$ to $72d$ and the multipoint AF system ($90a$, $90b$), as is shown in FIG. 19.

Then, when both stages WST and MST reach the position shown in FIG. 20 where measurement plate 30 is located directly below projection optical system PL, main controller 20 performs the latter processing of focus calibration in a state continuing the control of Z position of wafer stage WST (measurement plate 30) that uses the surface position information measured by Z heads $72a$, $72b$, $72c$, and $72d$ as a reference, without switching the Z head used for position (Z position) control of wafer stage WST in the optical axis direction of projection optical system PL to Z heads $74_i$ and $76_j$.

Then, main controller 20 obtains the offset at the representative detection point of the multipoint AF system ($90a$, $90b$) based on the results of the former processing and latter processing of focus calibration described above, and stores the offset in the memory (not shown). And, on reading mapping information obtained from the results of focus mapping at the time of exposure, main controller 20 is to add the offset to the mapping information.

Figure 20:
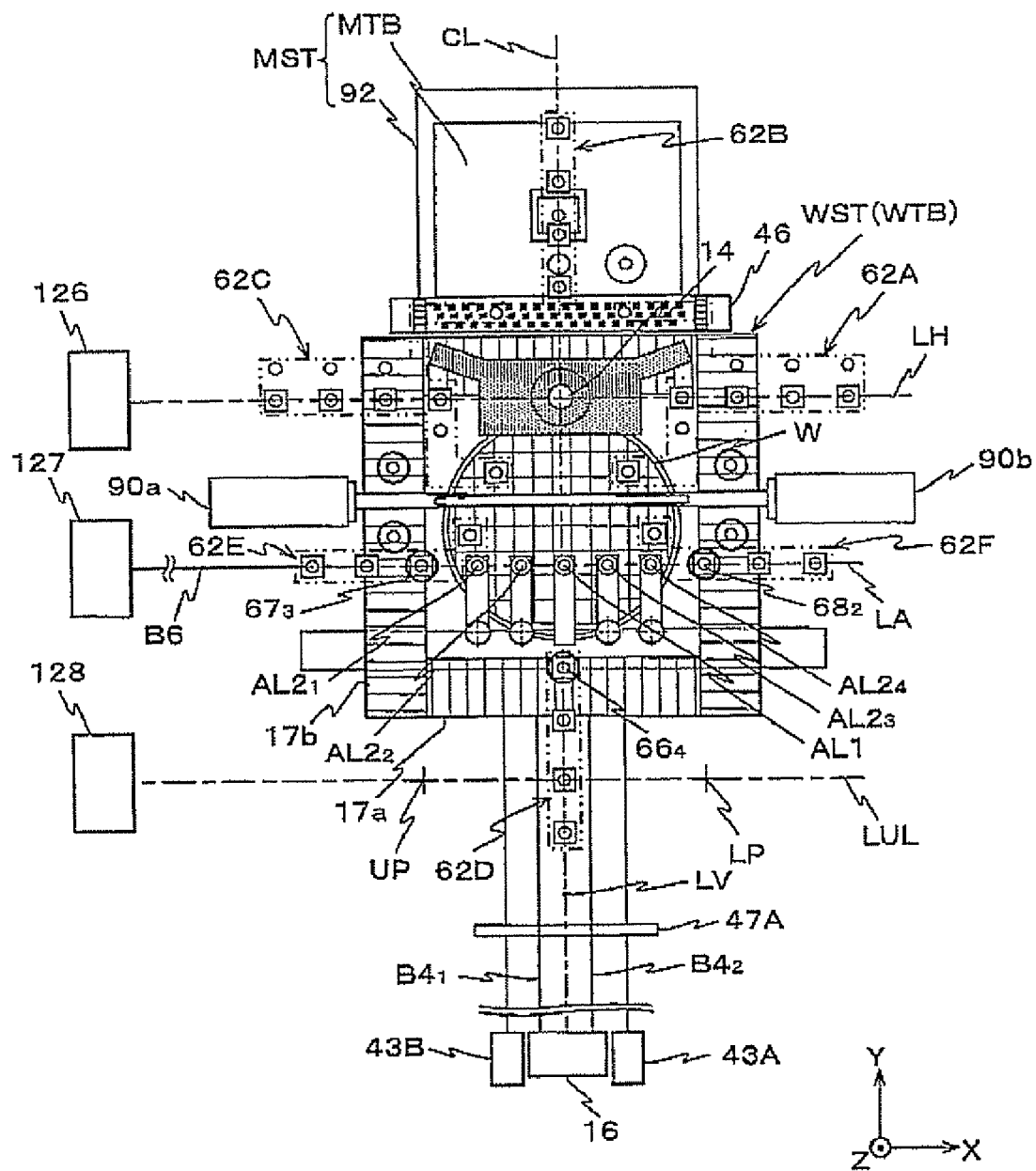
FIG. 20 is a view showing a state of the wafer stage and the measurement stage when at least one of the latter processing of Pri-BCHK and the latter processing of focus calibration is being performed.

Incidentally, in the state of FIG. 20, the focus mapping is being continued.

Figure 21:
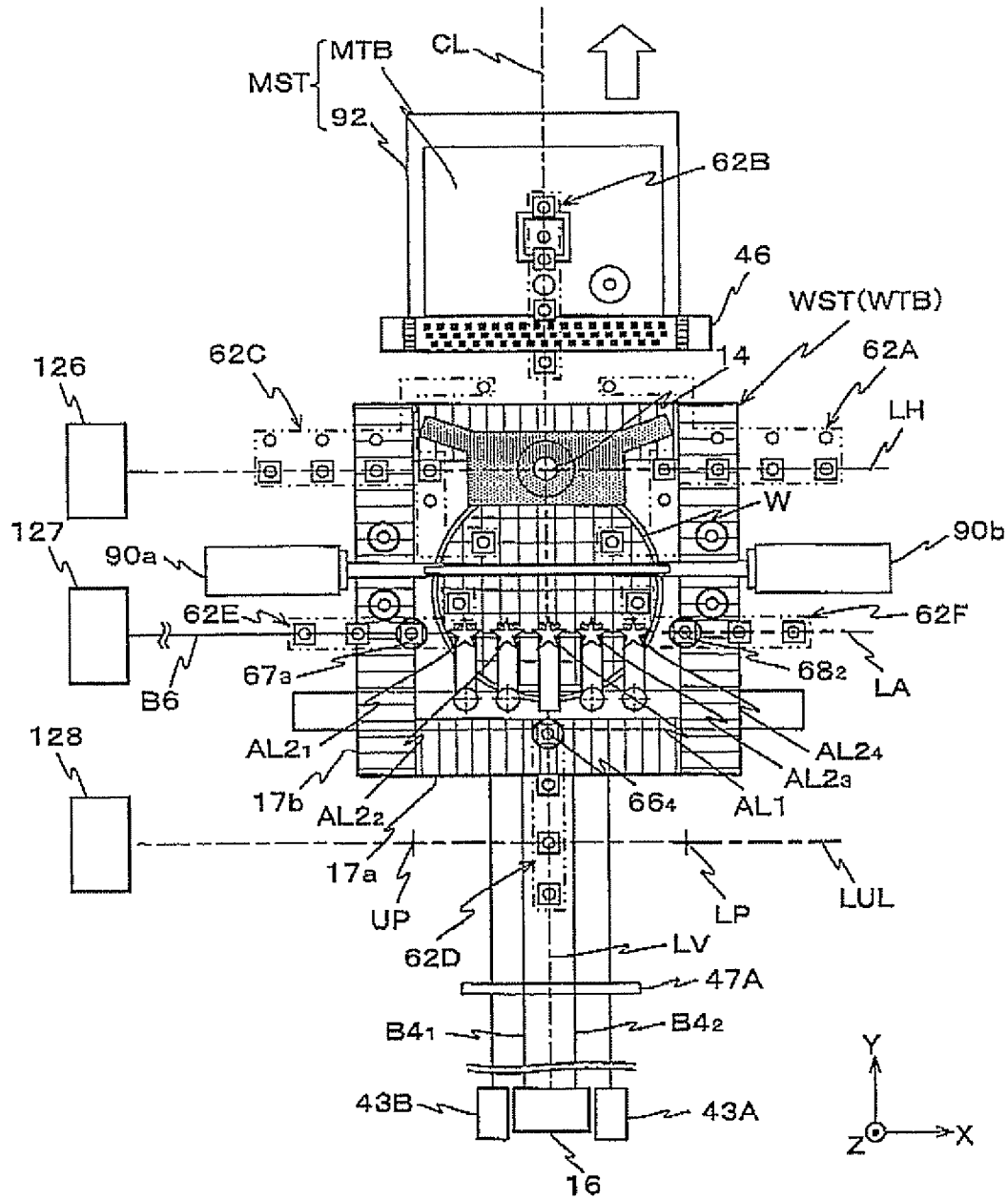
FIG. 21 is a view showing a state of the wafer stage and the measurement stage when alignment marks arranged in five third alignment shot areas are being simultaneously detected using alignment systems AL1 and $AL2_1$ to $AL2_4$.

When wafer stage WST reaches the position shown in FIG. 21 by movement in the +Y direction of both stages WST and MST in the contact state (or proximity state) described above, main controller 20 stops wafer stage WST at that position, while making measurement stage MST continue the movement in the +Y direction. Then, main controller 20 detects the alignment mark arranged in the five second alignment shot areas substantially at the same time as well as individually (refer to the star-shaped marks in FIG. 21), using the five alignment systems AL1, and $AL2_1$ to $AL2_4$, and makes a link between the detection results of the five alignment systems AL1, and $AL2_1$ to $AL2_4$ and the measurement values of the three encoders at the time of the detection, and then stores them in the memory (not shown). Further, at this point as well, the focus mapping is being continued.

Meanwhile, after a predetermined period of time from the suspension of wafer stage WST described above, measurement stage MST and wafer stage WST move from the contact state (or proximity state) into a separation state. After moving into the separation state, main controller 20 stops the movement of measurement stage MST when measurement stage MST reaches an exposure start waiting position where measurement stage MST waits until exposure is started.

Next, main controller 20 starts the movement of wafer stage WST in the +Y direction toward a position where the alignment mark arranged in the three fourth alignment shots are detected. At this point in time, the focus mapping is being continued. Meanwhile, measurement stage MST is waiting at the exposure start waiting position described above.

Figure 22:
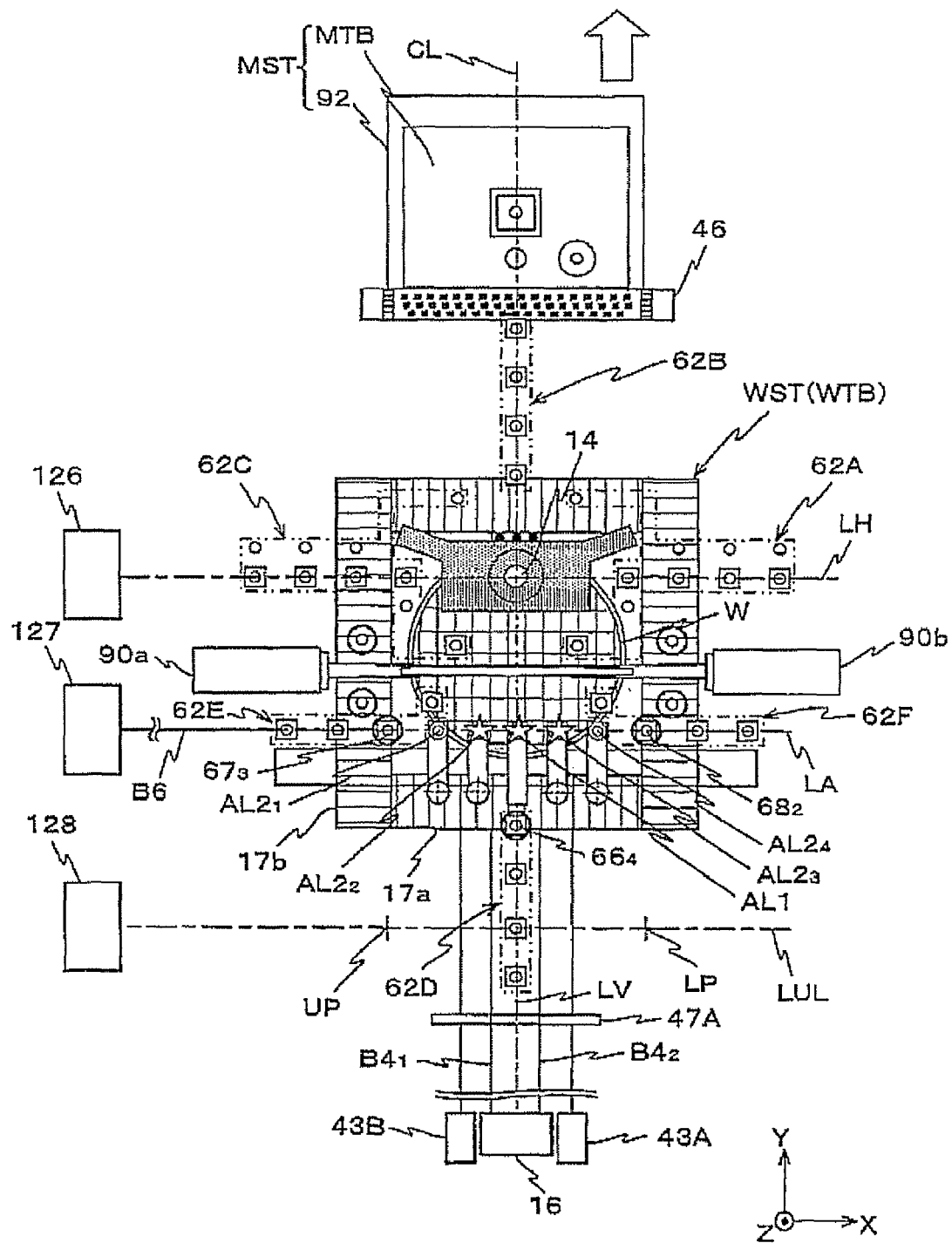
FIG. 22 is a view showing a state of the wafer stage and the measurement stage when alignment marks arranged in three fourth alignment shot areas are being simultaneously detected using alignment systems AL1, AL2$_2$ and AL2$_3$.

Then, when wafer stage WST reaches the position shown in FIG. 22, main controller 20 immediately stops wafer stage WST, and almost simultaneously and individually detects the alignment marks arranged in the three fourth alignment shot areas on wafer W (refer to star-shaped marks in FIG. 22) using primary alignment system AL1 and secondary alignment systems $AL2_2$ and $AL2_3$, links the detection results of three alignment systems AL1, $AL2_2$ and $AL2_3$ and the measurement values of the three encoders out of the four encoders above at the time of the detection, and stores them in memory (not shown). Also at this point in time, the focus mapping is being continued, and measurement stage MST is still waiting at the exposure start waiting position. Then, using the detection results of a total of 16 alignment marks and the measurement values of the corresponding encoders obtained in the manner described above, main controller 20 computes array information (coordinate values) of all the shot areas on wafer W on an alignment coordinate system (an XY coordinate system whose origin is placed at the detection center of primary alignment system AL1) that is set by the measurement axes of encoders 70B, 70D, $70E_1$, and $70F_1$ of encoder system 150, by performing a statistical computation disclosed in, for example, U.S. Pat. No. 4,780,617 and the like.

Figure 23:
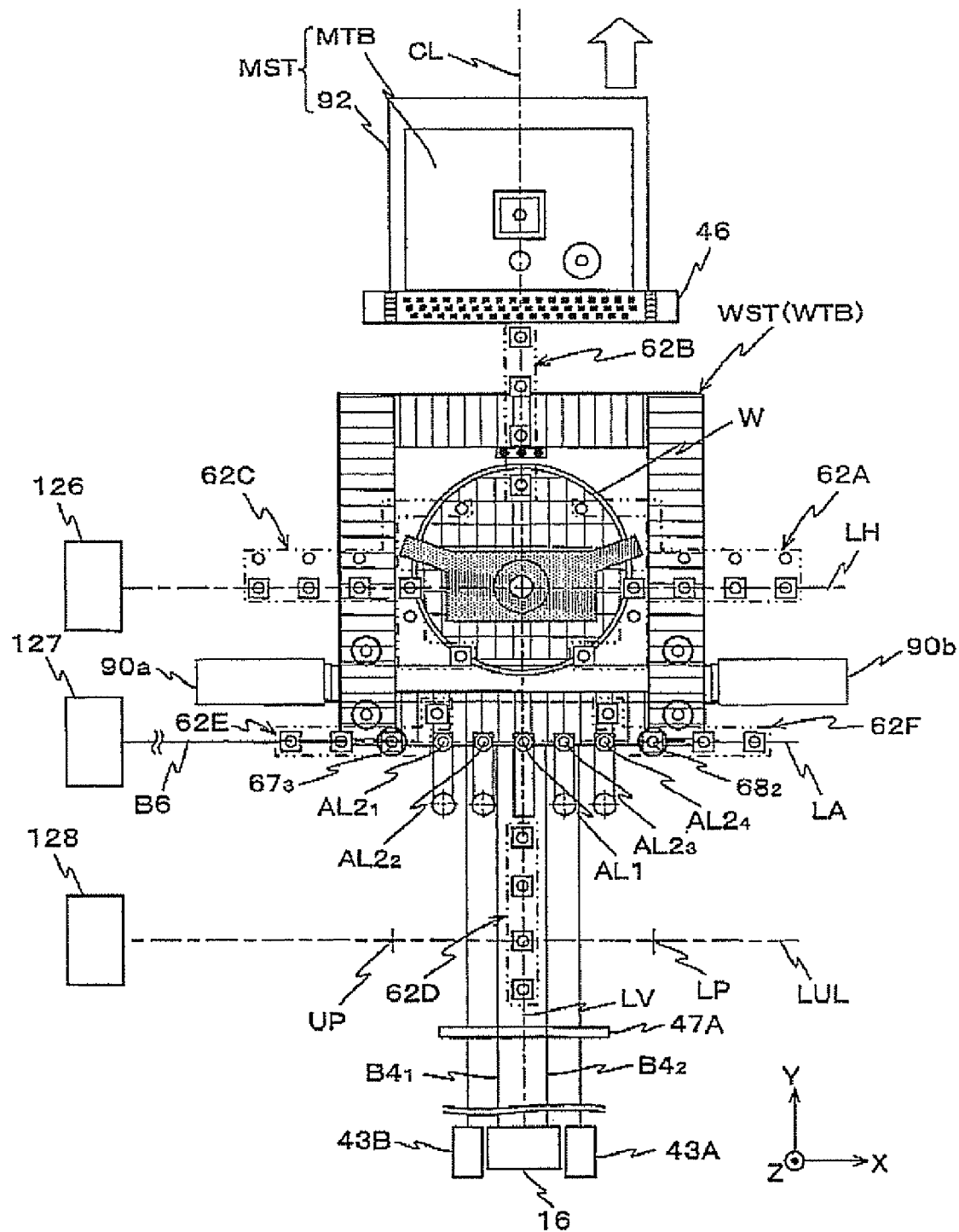
FIG. 23 is a view showing a state of the wafer stage and the measurement stage when the focus mapping has ended.

Next, main controller 20 continues the focus mapping while moving wafer stage WST in the +Y direction again. Then, when the detection beam from the multipoint AF system (90a, 90b) begins to miss the wafer W surface, as is shown in FIG. 23, main controller 20 ends the focus mapping.

After the focus mapping has been completed, main controller 20 moves wafer stage WST to a scanning starting position (acceleration starting position) for exposure of the first shot on wafer W, and during the movement, main controller 20 switches the Z heads used for control of the Z position and the θy rotation of wafer stage WST from Z heads 72a to 72d to Z heads $74_i$ and $74_j$ while maintaining the Z position, the θy rotation, and the θx rotation of wafer stage WST. After this switching, based on the results of the wafer alignment (EGA) previously described and the latest baselines and the like of the five alignment systems AL1 and $AL2_1$ to $AL2_4$, main controller 20 performs exposure by a step-and-scan method in a liquid immersion exposure, and sequentially transfers a reticle pattern to a plurality of shot areas on wafer W. Hereinafter, a similar operation is performed repeatedly.

Next, a computation method of the Z position and the amount of tilt of wafer stage WST using the measurement results of the Z heads will be described Main controller 20 uses the four Z heads 70a to 70d that constitute surface position measurement system 180 (refer to FIG. 6) at the time of focus calibration and focus mapping, and measures height Z and tilt (rolling) θy of wafer table WTB. Further, main controller 20 uses two Z heads $74_i$ and $76_j$ (i and j are one of 1 to 5) at the time of exposure, and measures height Z and tilt (rolling) θy of wafer table WTB. Incidentally, each Z head irradiates a probe beam on the upper surface (a surface of a reflection grating formed on the upper surface) of the corresponding Y scales $39Y_1$ or $39Y_2$, and measures the surface position of each scale (reflection grating) by receiving the reflected light.

Figure 24A:
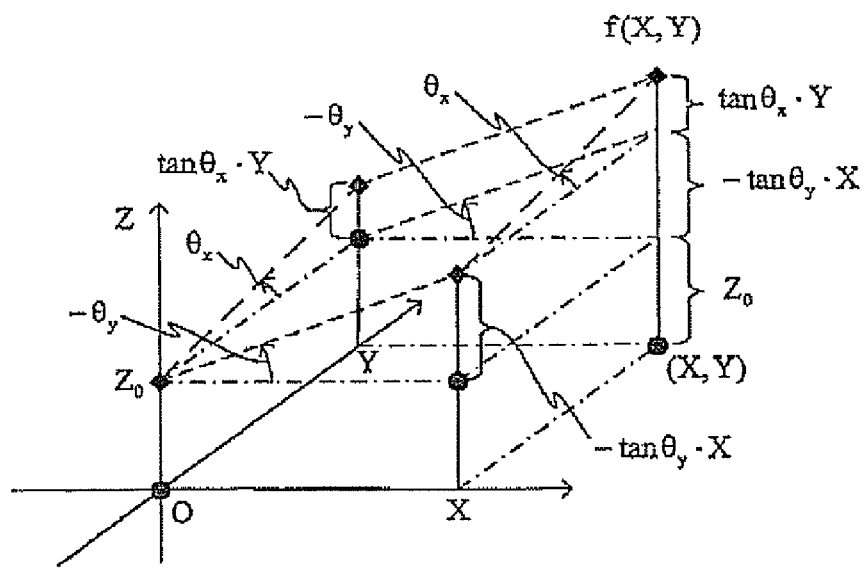
FIGS. 24A and 24B are views for explaining a computation method of the Z position and the amount of tilt of the wafer stage using the measurement results of the Z heads.

FIG. 24A shows a two-dimensional plane having height $Z_0$, rotation angle (an angle of inclination) around the X-axis θx, and rotation angle (an angle of inclination) around the Y-axis θy at a reference point O. Height Z at position (X, Y) of this plane is given by a function according to the next formula (8).

$$f(X,Y) = -\tan\theta y \cdot X + \tan\theta x \cdot Y + Z_0 \quad (8)$$

Figure 24B:
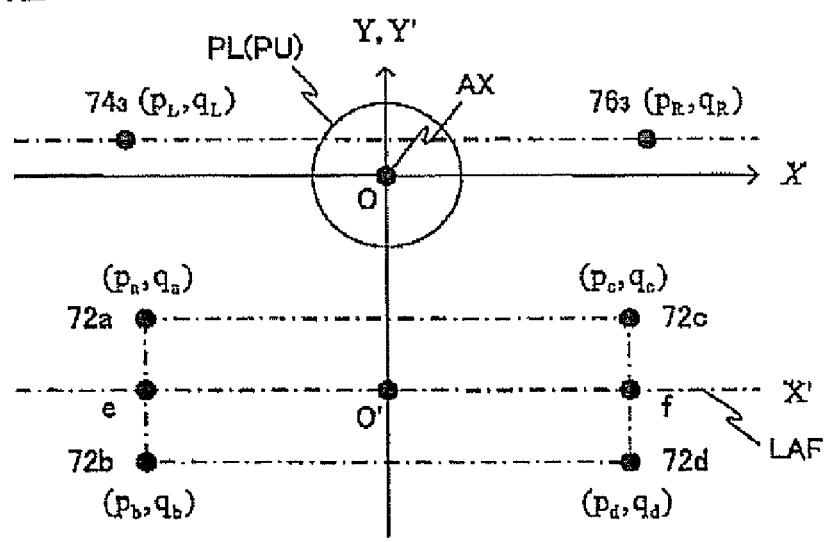

As shown in FIG. 24B, at the time of the exposure, height Z from a movement reference surface (a surface that is substantially parallel to the XY plane) of water table WTB and rolling θy are measured at an intersection point (reference point) O of a movement reference surface of wafer table WTB and optical axis AX of projection optical system PL, using two Z heads $74_i$ and $76_j$ (i and j are one of 1 to 5). In this case, Z heads $74_3$ and $76_3$ are used as an example. Similar to the example shown in FIG. 24A, the height of wafer table WTB at reference point O will be expressed as $Z_0$, the tilt (pitching) around the X-axis will be expressed as θx, and the tilt (rolling) around the Y-axis will be expressed as θy. In this case, measurement values $Z_L$ and $Z_R$ of the surface position of (reflection gratings formed on) Y scales $39Y_2$ and $39Y_1$ indicated by Z head $74_3$, which is located at coordinate $(p_L, q_L)$, and Z head $76_3$, which is located at coordinate $(p_R, q_R)$ in the XY plane, respectively, follow theoretical formulas (9) and (10), similar to formula (8).

$$Z_L = -\tan\theta y \cdot p_L + \tan\theta x \cdot q_L + Z_0 \quad (9)$$

$$Z_R = -\tan\theta y \cdot p_R + \tan\theta x \cdot q_R + Z_0 \quad (10)$$

Accordingly, from theoretical formulas (9) and (10), height $Z_0$ of wafer table WTB and rolling θy at reference point O can be expressed as in the following formulas (11) and (12), using measurement values $Z_L$ and $Z_R$ of Z heads $74_3$ and $76_3$.

$$Z_0 = \{Z_L + Z_R - \tan\theta x \cdot (q_L + q_R)\}/2 \quad (11)$$

$$\tan\theta y = \{Z_L - Z_R - \tan\theta x \cdot (q_L - q_R)\}/(p_R - p_L) \quad (12)$$

Incidentally, in the case of using other combinations of Z heads as well, by using theoretical formulas (11) and (12), height $Z_0$ of wafer table WTB and rolling θy at reference point O can be computed. However, pitching θx uses the measurement results of another sensor system (in the embodiment, interferometer system 118).

As shown in FIG. 24B, at the time of focus calibration and focus mapping, height Z of wafer table WTB and rolling θy at a center point O' of a plurality of detection points of the multipoint AF system (90a, 90b) are measured, using four Z heads 72a to 72d. Z heads 72a to 72d, in this case, are respectively placed at position $(X, Y)=(p_a, q_a), (p_b, q_b), (p_c, q_c), (p_d, q_d)$. As shown in FIG. 24B, these positions are set symmetric to center point O'=(Ox', Oy'), or more specifically, $p_a=p_b, p_c=p_d, q_a=q_c, q_b=q_d$, and also $(p_a+p_c)/2=(p_b+p_d)/2=Ox', (q_a+q_b)/2=(q_c+q_d)/2=Oy'$.

From average $(Za+Zb)/2$ of measurement values Za and Zb of Z head 72a and 72b, height Ze of wafer table WTB at a point e of position $(p_a=p_b, Oy')$ can be obtained, and from average $(Zc+Zd)/2$ of the measurement values Zc and Zd of Z heads 70c and 70d, height Zf of wafer table WTB at a point f of position $(p_c=p_d, Oy')$ can be obtained. In this case, when the height of wafer table WTB at center point O' is expressed as $Z_0$, and the tilt (rolling) around the Y-axis is expressed as θy, then, Ze and Zf follow theoretical formulas (13) and (14), respectively.

$$Ze\{=(Z_a+Z_b)/2\} = -\tan\theta y \cdot (p_a+p_b-2Ox')/2 + Z_0 \quad (13)$$

$$Zf\{=(Z_c+Z_d)/2\} = -\tan\theta y \cdot (p_c+p_d-2Ox')/2 + Z_0 \quad (14)$$

Accordingly, from theoretical formulas (13) and (14), height $Z_0$ of water table WTB and rolling θy at center point O' can be expressed as in the following formulas (15) and (16), using measurement values Za to Zd of Z heads 70a to 70d.

$$Z_0 = (Ze + Zf)/2 = (Za + Zb + Zc + Zd)/4 \quad (15)$$

$$\tan\theta y = -2(Ze - Zf)/(p_a + p_b - p_c - p_d) \quad (16)$$
$$= -(Za + Zb - Zc - Zd)/(p_a + p_b - p_c - p_d)$$

However, pitching θx uses the measurement results of another sensor system (in the embodiment, interferometer system 118).

As shown in FIG. 16, immediately after switching from servo control of wafer stage WST by interferometer system 118 to servo control by encoder system 150 (encoders 70A to 70F) and surface position measurement system 180 (Z head systems 72a to 72d, $74_1$ to $74_5$, and $76_1$ to $76_5$), because only two heads, Z heads 72b and 72d, face the corresponding Y scales $39Y_1$ and $39Y_2$, the Z and θy positions of wafer stage WST at center point O' cannot be computed using formulas (15) and (16). In such a case, the following formulas (17) and (18) are applied.

$$Z_0 = \{Z_b + Z_d - \tan\theta x \cdot (q_b + q_d - 2Oy')\}/2 \quad (17)$$

$$\tan\theta y = \{Z_b - Z_d - \tan\theta x \cdot (q_b - q_d)\}/(p_d - p_b) \quad (18)$$

Then, when wafer stage WST has moved in the +Z direction, and accompanying this move, after Z heads 72a and 72c have faced the corresponding Y scales $39Y_1$ and $39Y_2$, formulas (15) and (16) above are applied.

As previously described, scanning exposure to wafer W is performed, after finely driving wafer stage WST in the Z-axis direction and tilt direction according to the unevenness of the surface of wafer W, and having adjusted the surface position of wafer W and the tilt (focus leveling) so that the exposure area IA portion on the surface of wafer W matches within the range of the depth of focus of the image plane of projection optical system PL. Therefore, prior to the scanning exposure, focus mapping to measure the unevenness (a focus map) of the surface of wafer W is performed. In this case, as shown in FIG. 10B, the unevenness of the surface of wafer W is measured at a predetermined sampling interval (in other words, a Y interval) while moving wafer stage WST tin the +Y direction, using the multipoint AF system (90a, 90b) with the surface position of wafer table WTB (or to be more precise, the corresponding Y scales $39Y_1$ and $39Y_2$) measured using Z heads 72a to 72d serving as a reference.

To be specific, as shown in FIG. 24B, surface position Ze of wafer table WTB at point e can be obtained from the average of surface positions Za and Zb of Y scale $39Y_2$, which is measured using Z heads 72a and 72b, and surface position Zf of wafer table WTB at point f can be obtained from the average of surface positions Zc and Zd of Y scale $39Y_1$, which is measured using Z heads 72c and 72d. In this case, the plurality of detection points of the multipoint AF system and center O' of these points are located on a straight line ef parallel to the X-axis and connecting point e and point f. Therefore, as shown in FIG. 10C, by using a straight line expressed tin the following formula (19) connecting surface position Ze at point e (P1 in FIG. 10C) of wafer table WTB and surface position Zf at point f (P2 in FIG. 10C) as a reference, surface position $Z_{0k}$ of the surface of wafer W at detection point $X_k$ is measured, using the multipoint AF system (90a, 90b).

$$Z(X) = -\tan\theta y \cdot X + Z_0 \qquad (19)$$

However, $Z_0$ and tansy can be obtained from formulas (15) and (16) above, using measurement results Za to Zd of Z heads 72a to 72d. From the results of surface position $Z_{0k}$ that has been obtained, unevenness data (focus map) $Z_k$ of the surface of wafer W can be obtained as in the following formula (20).

$$Z_k = Z_{0k} - Z(X_k) \qquad (20)$$

At the time of exposure, by finely driving wafer stage WST in the Z-axis direction and the tilt direction according to focus map $Z_k$ obtained in the manner described above, focus is adjusted, as is previously described. At the time of the exposure here, the surface position of wafer table WTB (or to be more precise, the corresponding Y scales $39Y_2$ and $39Y_1$) is measured, using Z heads $74_i$ and $76_j$ (i, j=1-5). Therefore, reference line Z(X) of focus map $Z_k$ is set again. However, $Z_0$ and $\tan\theta y$ can be obtained from formulas (11) and (12) above, using the measurement results $Z_L$ and $Z_R$ of Z heads $74_i$ and $76_j$ (i, j=1-5). From the procedure described so far, the surface position of the surface of wafer W is converted to $Z_k + Z(X_k)$.

Figure 25A:
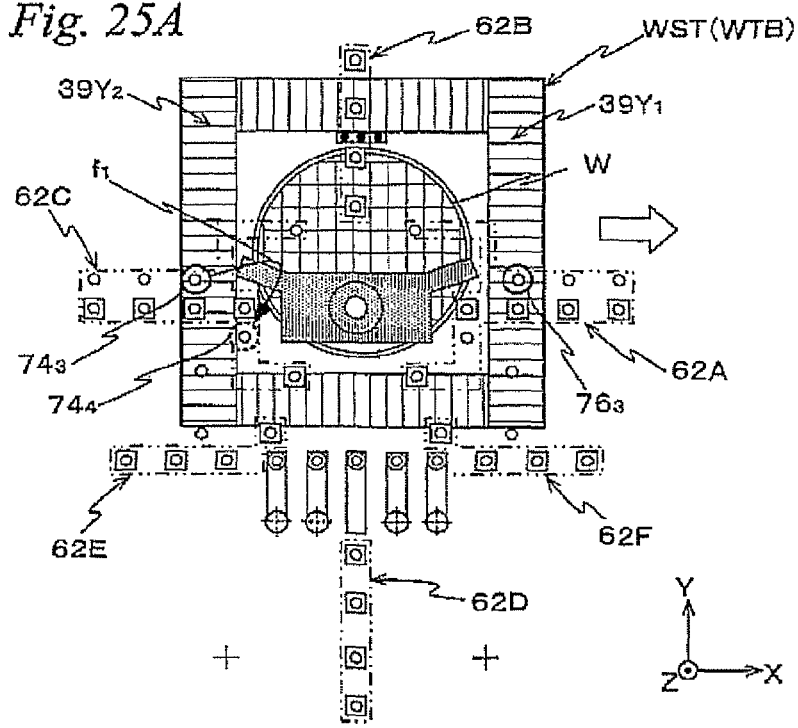
FIGS. 25A and 25B are views showing the state of a switching of the Z heads which oppose the Y scale, along with the movement of the wafer stage.
Figure 25B:
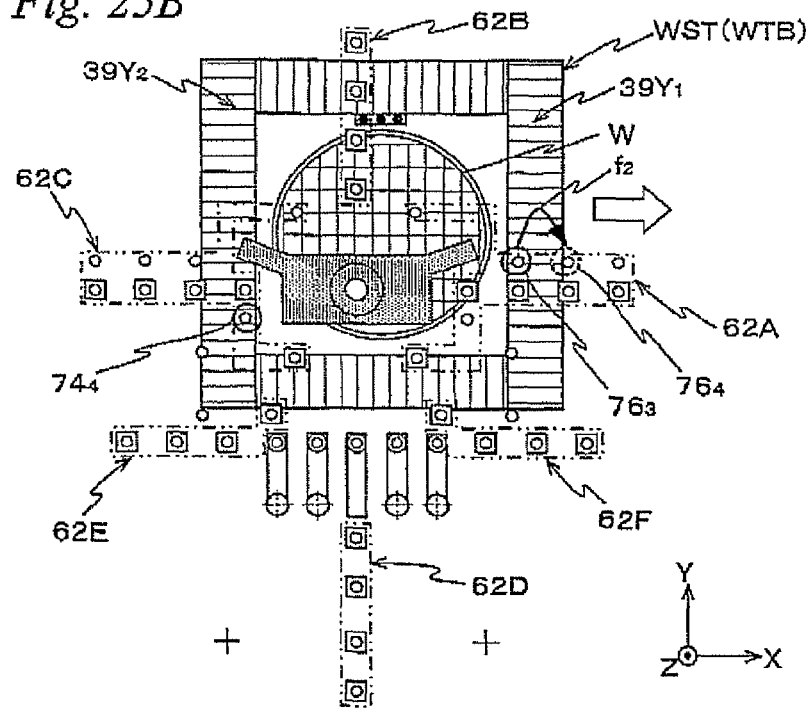

In exposure apparatus 100 of the embodiment, as shown in FIGS. 25A and 25B, in the effective stroke range (a range where the stage moves for alignment, exposure operation, and focus mapping) of wafer stage WST, the Z heads are placed so that at least one of Z heads $76_j$ and $74_i$ (j and i are one of 1 to 5) or one of 72a to 72d faces each of the Y scales $39Y_1$ and $39Y_2$, without fail. In FIGS. 25A and 25B, the Z head which faces the corresponding Y scale is shown surrounded in a circle.

In this case, when wafer stage WST is to be driven in a direction indicated by an outlined arrow (the +X direction) as shown in FIG. 25A, as indicated by arrow f1, the Z head which faces Y scale $39Y_2$ is switched from Z head $74_3$ shown circled by a solid line to a Z head $74_4$ which is shown circled by a dotted line. Further, when wafer stage WST is to be driven furthermore in a direction indicated by an outlined arrow (the +X direction) as shown in FIG. 25B, as indicated by arrow f2, the Z head which faces Y scale $39Y_1$ is switched from Z head $76_3$ shown circled by a solid line to a Z head $76_4$ which is shown circled by a dotted line. In this manner, Z heads $74_i$ and $76_j$ (i, j=1-5) are sequentially changed to the next head, with the movement of wafer stage WST in the X-axis direction. Incidentally, at the time of switching of the Z head, a return process in which setting of the reference surface position (the origin) and measurement preparation are performed, or furthermore, a linkage process to keep the continuity of the measurement results, is performed. Details on these processes will be described later in the description.

Figure 26A:
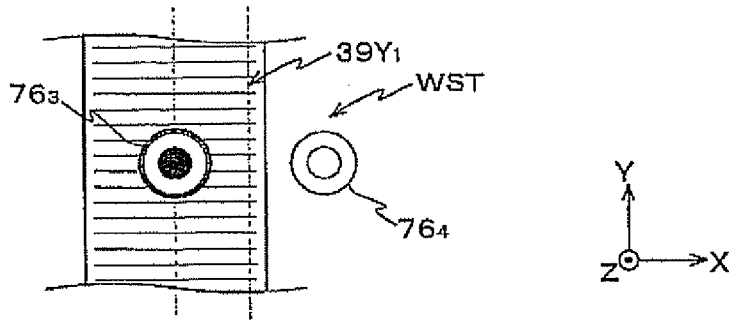
FIGS. 26A to 26E are views for explaining the switching procedure of the Z heads.

Next, a switching procedure of the Z head will be described, based on FIGS. 26A to 26E and also appropriately using other drawings as a reference, taking the switching from Z head $76_3$ to $76_4$ shown in arrow f2 in FIG. 25B as an example. In FIG. 26A, a state before the switching is shown. In this state, Z head $76_3$ facing the scanning area (the area where the diffraction grating is arranged) on Y scale $39Y_1$ is operating, and Z head $76_4$ which has moved away from the scanning area is suspended. Here, the operating (focus servo) Z heads are shown in a black circle, and the suspended or waiting (scale servo) Z heads are shown in an outlined circle, respectively. Based on measurement values of the operating Z head $76_3$, main controller 20 computes the position of wafer stage WST. In this case, the Z head used for computing the position of wafer stage WST is shown surrounded by a double circle.

When wafer stage WST moves in the +X direction from the state shown in FIG. 26A, Y scale $39Y_1$ is displaced in the +X direction, and Z head $76_4$ which is suspended approaches the scanning area on Y scale $39Y_1$. Then, main controller 20 confirms that Z head $76_4$ has come within a predetermined distance from the scanning area, and performs the return process of Z head $76_4$.

Figure 27A:
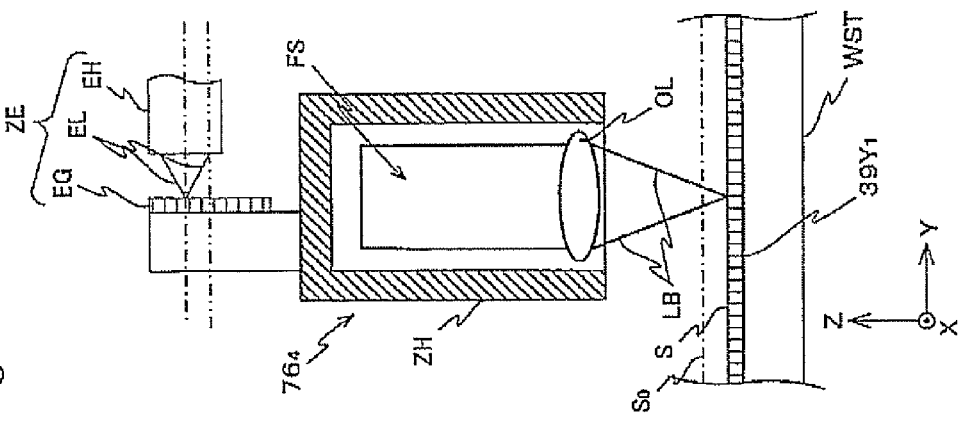
FIGS. 27A to 27C are views for explaining a return procedure of the Z heads using two states, which are scale servo and focus servo.
Figure 27B:
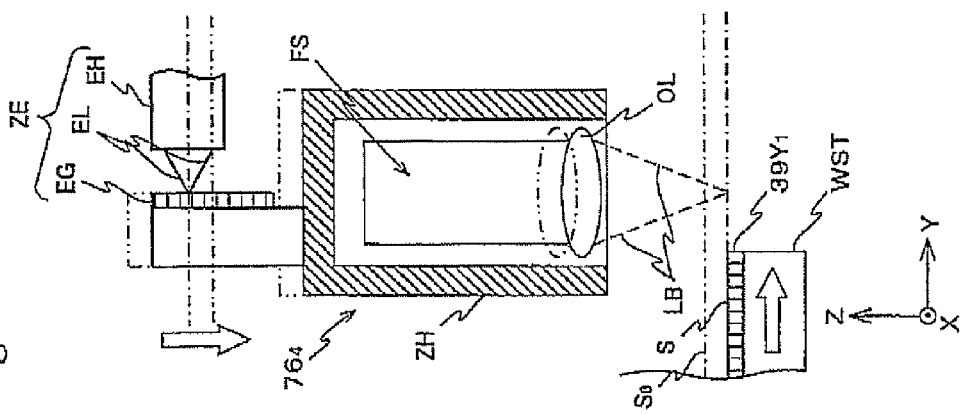
Figure 27C:
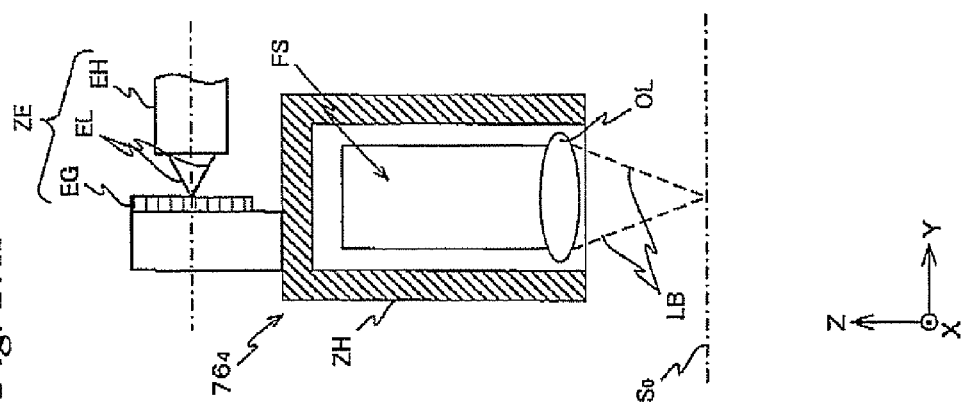

Now, the return process of Z head $76_4$ will be described, referring to FIGS. 27A to 27C. As shown in FIG. 27A, reference surface position (origin) $S_0$ of Z head $76_4$ is to be set at the time of initial operation of the Z head, such as during the start up of exposure apparatus 100 as is previously described.

Main controller 20 estimates a predicted value (more specifically, a predicted surface position S of Y scale $39Y_1$) of the measurement value of Z head $76_4$, which is to be restored from function t (X, Y) of the formula (8) previously described, using the position of wafer stage WST in directions of three degree of freedom (Z, θy, θx) obtained from the measurement results of the operating Z head and interferometer system 118. Now, into X and Y, the X and Y positions of Z head $76_4$ are substituted. And, as shown in FIG. 27B, main controller 20 displaces Z sensor main section ZH via the drive section (not shown) in Z head $76_4$ so that the measurement value of Z head $76_4$ matches a predicted value (Z head $76_4$ outputs a predicted value which serves as a measurement value), and makes the focal point of probe beam LB coincide with predicted surface position S.

In the state where the return process described above has been completed, the focal position of probe beam LB coincides with predicted surface position S of Y scale $39Y_1$. Incidentally, with the movement of wafer stage WST in directions of three degree of freedom (Z, θy, θx), predicted surface position S of Y scale $39Y_1$ is also displaced. And, following the displacement, sensor main section ZH of Z head $76_4$ also performs Z displacement. More specifically, Z head $76_4$ performs a follow-up servo (scale servo) with respect to predicted surface position S of Y scale $39Y_1$. Z head $76_4$ is waiting in such a state.

Figure 26B:
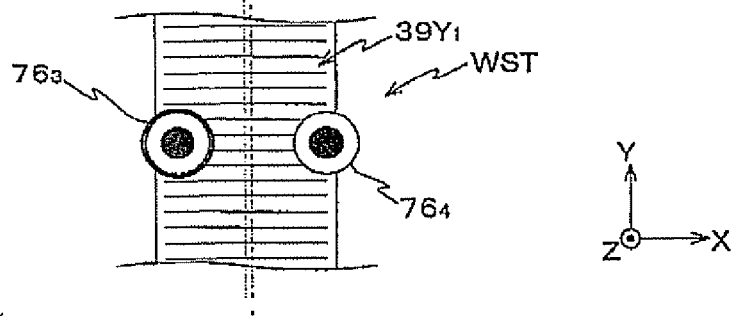

In this case, in the embodiment, as is previously described, the distance in the X-axis direction between the two adjacent Z heads $74_i$ and $76_j$ is set smaller than the effective width (width of the scanning area) of Y scales $39Y_2$ and $39Y_1$ in the X-axis direction. Therefore, a state occurs when Z heads $76_3$ and $76_4$ simultaneously face the scanning area of Y scale $39Y_1$ as shown in view 26B. Therefore, after main controller 20 confirms that Z head $76_4$ in a waiting (a scale servo) state has faced the scanning area along with the operating Z head $76_3$ as shown in FIG. 26B, main controller 20 begins focus servo with respect to the actual surface position of Y scale $39Y_1$ of Z head $76_4$, as shown in FIG. 27C.

However, in the waiting (during scale servo to the predicted surface position) state, focus error (hereinafter simply referred to as an output, as appropriate) I which is the output of focus sensor ES is monitored. If output I becomes zero, it can be judged that the predicted surface position (more specifically, the Z position of the focus of the probe beam of the Z head) of Y scale $39Y_1$ matches the actual surface position. Therefore, main controller 20 begins the focus servo, after confirming that Z heads $76_3$ and $76_4$ have faced the scanning area of Y scale $39Y_1$, and at the same time, that output I of focus sensor FS has become zero or approximately 0 (a value which is equal to or less than a predetermined value, and can be substantially regarded as zero) as described above. By performing the processing of such a procedure, the Z head can be shifted smoothly from scale servo to focus servo. However, at this point, while the measurement value of Z head $76_4$ is monitored, it is not used in position computation (position control) of wafer table WTB (wafer stage WST).

Figure 26C:
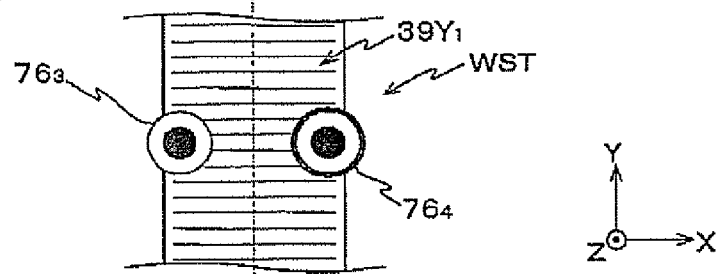
Figure 26D:
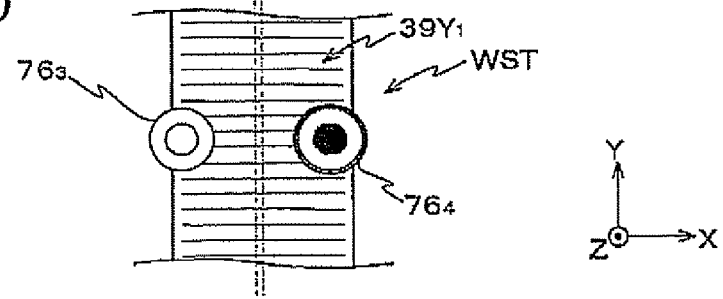
Figure 26E:
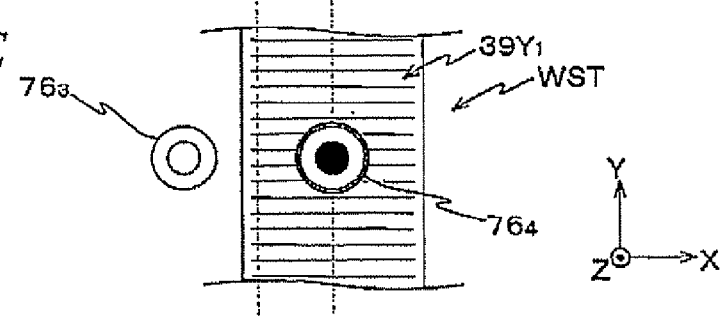

Next, as shown in FIG. 26C, while Z head $76_3$ which is to be suspended later faces the scanning area, main controller 20 switches the Z head used to compute the position of wafer stage WST in directions of two degrees of freedom (Z, θy) from Z head $76_3$ to $76_4$. However, in this processing, the position of wafer stage WST in directions of two degrees of freedom (Z, θy) computed before and after the switching generally becomes discontinuous. Therefore, a linkage process of the measurement values which will be described later is performed, as necessary. After the linkage process has been completed, the Z head to be used is switched from Z head $76_3$ to $76_4$. After the switching has been completed, as shown in FIG. 26D, main controller 20 rakes Z head $76_3$ move into a waiting (scale servo) state before moving off of the scanning area, and then, when Z head $76_3$ is sufficiently distanced from the scanning area, suspends its operation. With the operation described above, the switching of the Z head is completed, and hereinafter, as shown in FIG. 26E, Z head $76_4$ is used.

In the embodiment, the spacing between adjacent Z heads $74_i$ (i=1 to 5), for example, is 70 mm (with some exceptions), and is set smaller than the effective width of the scanning area of Y scale $39Y_2$ in the X-axis direction, which is, for example, 76 mm. Further, similarly, the spacing between adjacent Z heads $76_j$ (j=1 to 5) is, for example, 70 mm (with some exceptions), and is set smaller than the effective width of the scanning area of Y scale $39Y_1$ in the X-axis direction, which is, for example, 76 mm. Because of this, the switching of Z heads $74_i$ and $76_j$ (i, j=1-5) can be carried out smoothly, as described above.

Incidentally, the range in which the two adjacent Z heads face the scale, or more specifically, the moving distance of wafer stage WST (wafer table WTB) from a state shown in FIG. 26B to a state shown in FIG. 26D, for example, is 6 mm. And at the center, or more specifically, when wafer stage WST is located at the position shown in FIG. 26C, the Z head that monitors the measurement values is switched. This switching operation is completed by the time the Z head which is to be suspended moves off the scanning area, or more specifically, while wafer stage WST moves in an area by a distance of 3 mm during the state shown in FIG. 26C until the state shown in FIG. 26D. Incidentally, in the case the movement speed of the stage is 1 m/sec, then the switching operation of the Z head is to be completed within 3 msec.

Next, the linkage process at the time of switching of the Z heads 72a to 72d, $74_1$ to $74_5$, and $76_1$ to $76_5$, or more specifically, the reset of the measurement values to maintain the continuity of the position of wafer stage WST in directions of two degrees of freedom (Z, θy) computed by the measurement results of the Z heads will be described, focusing mainly on the operation of main controller 20.

Figure 28A:
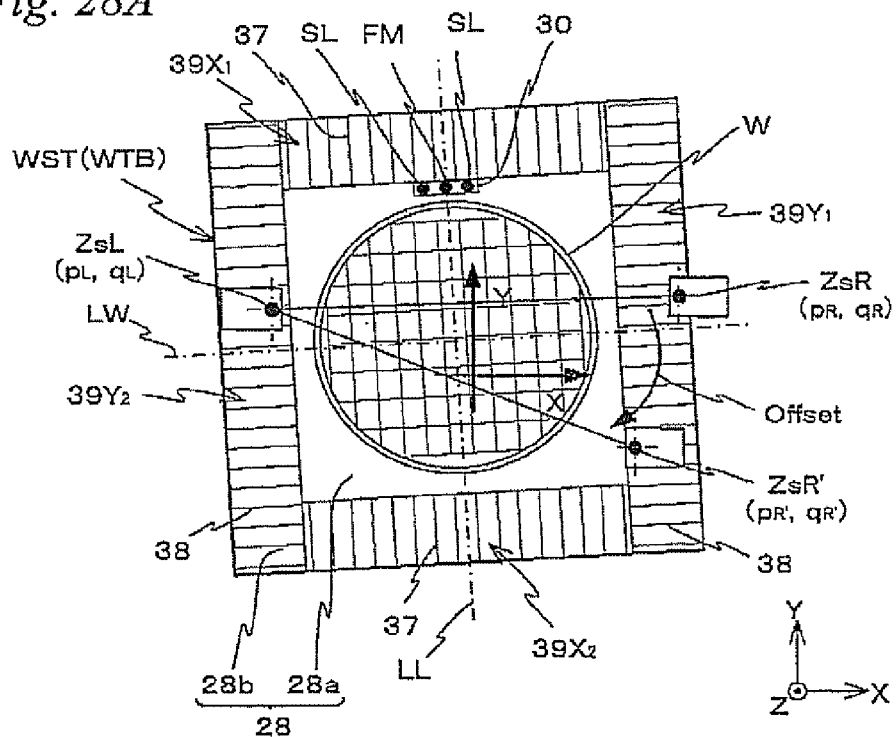
FIGS. 28A and 28B are views for explaining a switching process of the Z heads used for position control of the wafer stage.
Figure 28B:
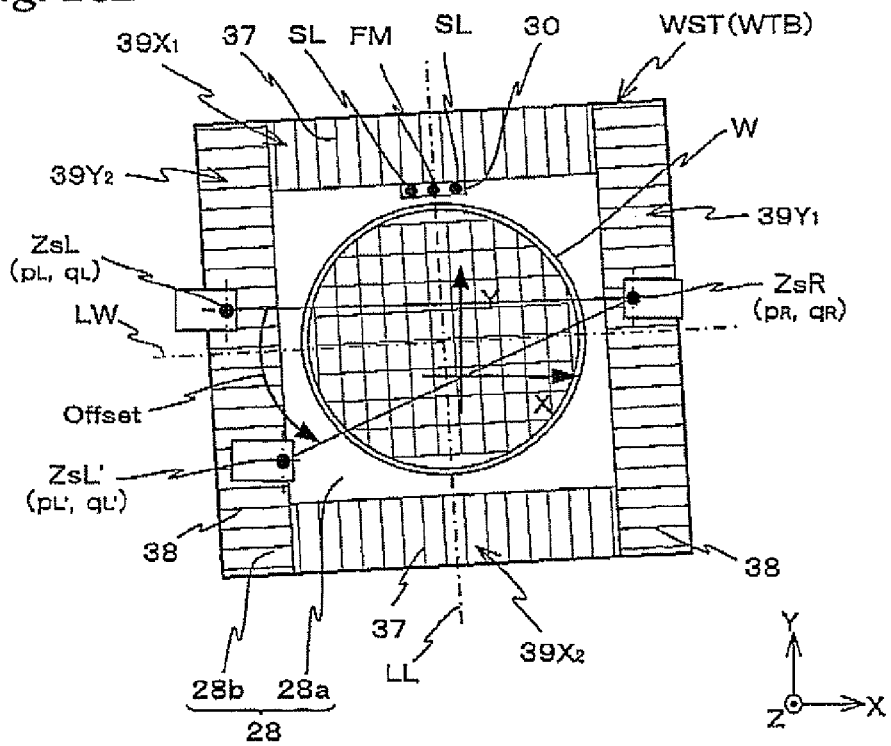

In the embodiment, as is previously described, in the movement stroke range of wafer stage WST at the time of exposure, at least two Z heads ZsL (one of $74_1$ to $74_5$) and ZsR (one of $76_1$ to $76_5$) constantly observe the movement of wafer stage WST. Accordingly, when the switching process of the Z head is performed, three Z heads, to which a third Z head ZsR' is added to the two Z heads ZsL and ZsR, will be made to observe wafer stage WST as shown in FIG. 28A. In this case, Z heads ZsL, ZsR, and ZsR' are located above Y scales $39Y_2$, $39Y_1$, and $39Y_1$, respectively, and are performing follow-up servo (focus servo) of the surface positions.

In the embodiment, as shown in FIG. 28A, main controller 20 switches from position (Z, θy) measurement of wafer stage WST by the two Z heads ZsL and ZsR to position (Z, θy) measurement of wafer stage WST by the two Z heads ZsL and ZsR'. On this switching, first of all, main controller 20 substitutes measurement values $Z_L$ and $Z_R$ of Z heads ZsL and ZsR, to which offset cancellation to be described later have been performed, into formulas (11) and (12) and computes $Z_0$ and θy positions of wafer stage WST at reference point O (an intersecting point of the movement reference surface of wafer stage WST and optical axis AX of projection optical system PL). Next, using the Z0 and θy positions computed here, and the θx position measured by interferometer system 118, a predicted value ZR' of the third Z head ZsR' is obtained according to theoretical formula (10). Now, the X position ($p_{R'}$) and Y position ($q_{R'}$) of Z head ZsR' are substituted into pR and qR. And offset $O_{R'}=Z_{R'}-Z_{R0'}$ is set. In this case, $Z_{R0'}$ is the actual measurement value of Z head ZsR', that is, the actual measurement result of the surface position of the opposing Y scale $39Y_1$. Measurement value $Z_{R'}$ of Z head ZsR' is given by performing offset correction using offset $O_{R'}$ on the actual measurement value $Z_{R0'}$, namely by the following formula (21).

$$Z_{R'}=Z_{R0'}+O_{R'} \quad (21)$$

By the handling using offset $O_{R'}$, predicted value $Z_{R'}$ is set as measurement value $Z_{R'}$ of Z head ZsR'.

By the linkage process described above, the switching operation of the Z head is completed while having maintained the position ($Z_0$, θy) of wafer stage WST. From then onward, from formulas (11) and (12), position coordinate ($Z_0$, θy) of wafer stage WST is computed, using measurement values $Z_L$ and $Z_{R'}$ of Z heads ZsL and ZsR' which are used after the switching. However, in formula (11) and formula (12), $Z_{R'}$, $p_{R'}$, $q_{R'}$ are substituted into $Z_R$, $p_R$, $q_R$.

$$Z_{L'}=Z_{L0'}+O_{L'} \quad (22)$$

By the handling using offset $O_L$, predicted value $Z_{L'}$ is set as measurement value $Z_{L'}$ of Z head ZsL'.

By the linkage process described above, the switching operation of the Z head is completed while having maintained the position ($Z_0$, θy) of wafer stage WST. From then onward, from formulas (11) and (12), position coordinate ($Z_0$, θy) of wafer stage WST is computed, using measurement values $Z_{L'}$ and $Z_R$ of Z heads ZsL' and ZsR which are used after the switching. However, in formula (11) and formula (12), $Z_{L'}$, $p_{L'}$, $q_{L'}$ are substituted into $Z_L$, $p_L$, $q_L$.

However, in the actual measurement value (raw measurement value) of Z head ZsR' or ZsL', various measurement errors are included. Therefore, main controller 20 shows the value whose error has been corrected as a measurement value. Accordingly, in the linkage process described above, main controller 20 uses scale unevenness error correction information, correction information on the Z head installation error and the like, and performs an inverse correction of the theoretical value obtained from formulas (9) and (10) and computes the raw value before correction, and then sets the raw value as the measurement value of Z head ZsR' or ZsL'. Incidentally, it is convenient to include such error correction information in offset $O_{R'}$ and $O_{L'}$ described above, and to perform error correction simultaneously with the offset correction (formulas (21) and (22)).

Incidentally, by applying the coordinate linkage method, the position (Z, θy) of wafer stage WST which is computed before and after the switching of the Z heads becomes continuous without fail. However, an error (a linkage error) may occur, due to the prediction calculation of the measurement value, the offset computation and the like of the Z head to be newly used. When exposure of all the shot areas on the wafer is actually performed, the switching of the encoder will be performed, for examples approximately 100 times. Accordingly, even if the error which occurs in one linkage process is small enough to ignore, the errors may be accumulated by repeating the switching many times, and may come to exceed a permissible level. Incidentally, assuming that the errors occur at random, the cumulative error which occurs by performing the switching 100 times is about 10 times the error which occurs when the switching is performed once. Accordingly, the precision of the linkage process must be improved as much as possible, and a stage control method which is not affected by the linkage accuracy will have to be employed.

Therefore, for example, position control of wafer stage WST is preferably performed using the position coordinate (Z, θy) of wafer stage WST which has been obtained by applying the coordinate linkage method, and focus calibration and a focus should be performed using the position coordinate (Z, θy) of wafer stage WST which has been obtained from the actual output of the Z head, without applying the coordinate linkage method. Further, when the wafer stage WST stops, the offset should be cleared to cancel out the accumulated linkage error.

The position coordinate of wafer stage WST is controlled, for example, at a time interval of 96 μsec. At each control sampling interval, main controller 20 updates the current position of wafer stage WST, computes thrust command values and the like to position the stage to a target position, and outputs the values. As previously described, the current position of wafer stage WST is computed from the measurement results of interferometer system 118, encoder system 150 (encoders 70A to 70F), and surf ace position measurement system 180 (Z heads 72a to 72d, $74_1$ to $74_5$, and $76_1$ to $76_5$). Accordingly, main controller 20 monitors the measurement results of the interferometer, the encoder, and the Z heads at a time interval (measurement sampling interval) much shorter than the control sampling interval.

Therefore, in the embodiment, main controller 20 constantly continues to receive the measurement values from all the Z heads (not always two) that face the scanning area (the area where the probe beams from the Z heads are scanned) of the scales, while wafer stage WST is within the effective stroke range. And, main controller 20 performs the switching operation (a linkage operation between a plurality of Z heads) of the Z heads described above in synchronization with position control of wafer stage WST which is performed at each control sampling interval. In such an arrangement, an electrically high-speed switching operation of the Z heads will not be required, which also means that costly hardware to realize such a high-speed switching operation does not necessarily have to be arranged.

Figure 29:
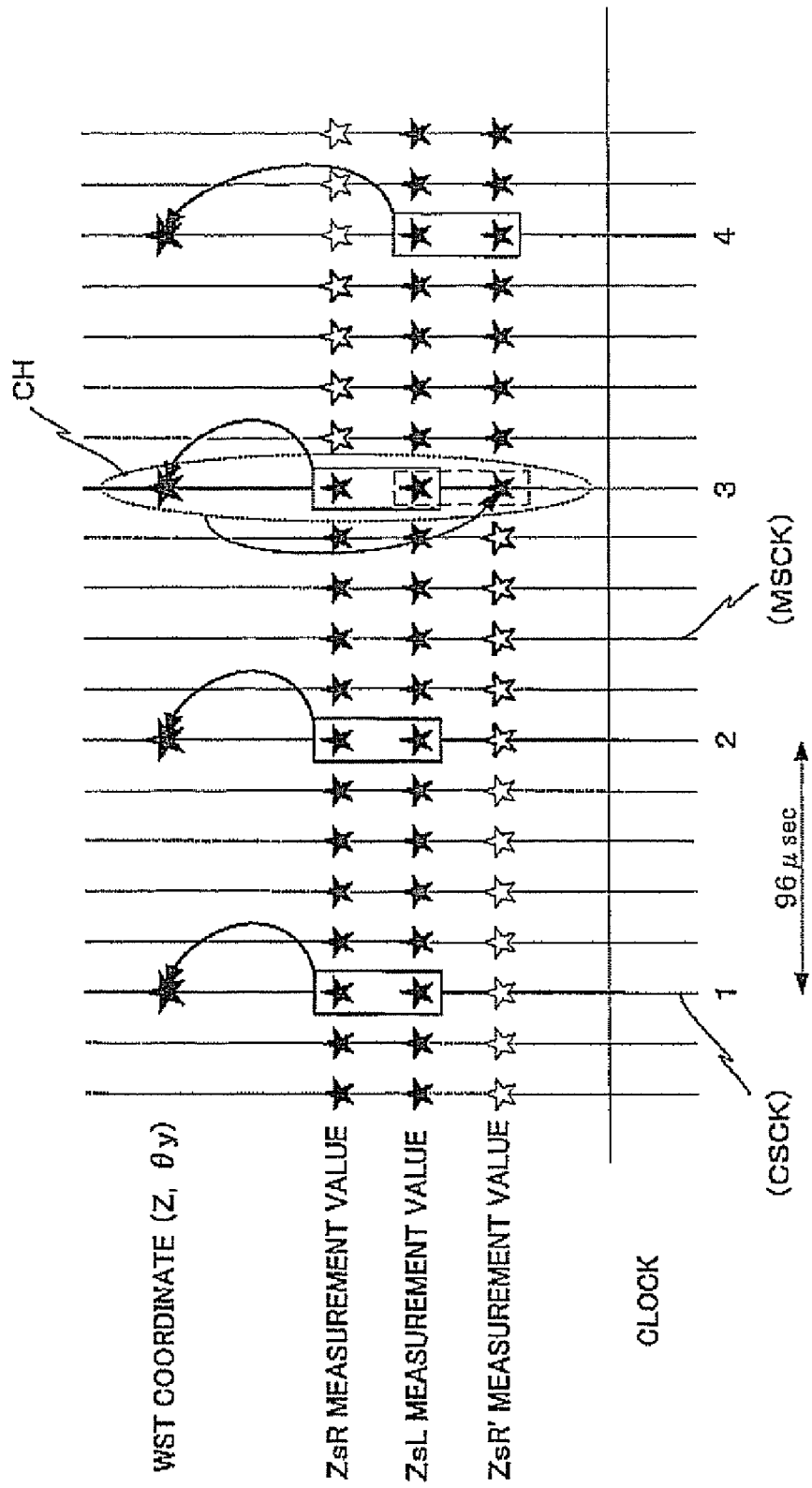
FIG. 29 is a view conceptually showing position control of the wafer stage, uptake of a measurement value of the Z head, and the switching timing of the Z head.

FIG. 29 conceptually shows the timing of position control of wafer stage WST, the uptake of the measurement values of the Z head, and the switching of the Z head in the embodiment. Reference code CSCK in FIG. 29 indicates the generation timing of a sampling clock (a control clock) of the position control of wafer stage WST, and reference code MSCK indicates a generation timing of a sampling clock (a measurement clock) of the measurement of the Z head (and interferometer and encoder). Further, reference code CH typically shows the switching (linkage) of the Z head described in detail in FIG. 26.

Main controller 20 executes the switching of the Z heads by dividing the operation into two stages; the restoration process and the switching process (and the linkage process) of the Z heads. When describing the switching according to an example shown in FIG. 29, first of all, the Z heads which are operating at the time of the first control clock are to be of a first combination, ZsL and ZsR. Main controller 20 monitors the measurement value of these Z heads, and computes the position coordinate (Z, θy) of wafer stage WST. Next, according to the position coordinate of wafer stage WST, main controller 20 obtains all the Z heads which are above and in the vicinity of the scanning area of the Y scale, and from these heads, main controller 20 specifies Z head ZsR' which needs restoration, and restores the encoder at the time of the second control clock. In this case, Z head ZsR' which has been restored is in the waiting state (scale servo state) previously described, and is switched to the operating state (focus servo state) after main controller 20 confirms that Z head ZsR' has faced the scanning area of the Y scale. At this point of time, the operating Z heads become three, which are, ZsL, ZsR and ZsR'. And then, main controller 20 specifies the Z head whose measurement values are to be monitored to compute the position coordinate of wafer stage WST at the time of the next control clock from the operating Z heads, according to the position coordinate of wafer stage WST. Assume that a second combination ZsL and ZsR' are specified here. Main controller 20 confirms whether this specified combination matches the combination that was used to compute the position coordinate of wafer stage WST at the time of the previous control clock. In this example, Z head ZsR in the first combination and Z head ZsR' in the second combination are different. Therefore, main controller 20 performs a linkage process CH to the second combination at the time of the third control clock. Hereinafter, main controller 20 monitors the measurement values of the second combination ZsL and ZsR', and computes the position coordinate (Z, θy) of wafer stage WST. As a matter of course, linkage process CH is not performed if there is no change in the combination. Z head ZsR which is removed from the monitoring subject, is switched to a waiting state at the time of the fourth control clock when Z head ZsR moves off from the scanning area on the Y scale.

Incidentally, so far, in order to describe the principle of the switching method of the encoder to be used in position control of wafer stage WST in the embodiment, four Z heads ZsL, ZsL', ZsR, and ZsR' were taken up, however, ZsL and ZsL' representatively show any of Z heads $74_i$ (i=1 to 5), $72a$, and $72b$, and ZsR and ZsR' representatively show any of Z heads $76_j$ (j=1 to 5), $72c$, and $72d$. Accordingly, similar to the switching between Z heads $74_i$ (i=1 to 5) and $76j$ (j=1 to 5), the switching and linkage process described above can be applied to the switching between Z heads $72a$ to $72d$, and the switching between Z heads $72a$ to $72d$ and Z heads $74_i$ (i=1 to 5), $76_j$ (j=1 to 5).

By at least a part of the measurement beam being intercepted (this makes detection of a foreign material possible, therefore, in the description below, it will also be expressed as detecting a foreign material) by a foreign material adhered on the scale surface and the like, abnormality may occur in the measurement results of the encoder (X heads and Y heads) and the Z heads. In this case, the measurement beam of the encoder has an expanse of 2 mm in the measurement direction and 50 μm in the grid line direction on the scale surface. The probe beam of the Z head is condensed to several μm on the diffraction grating surface serving as a reflection surface, however, on the scale surface, the probe beam widens to an extent of sub millimeters according to the numerical aperture at the scale surface (the cover glass surface). Accordingly, even a small foreign material can be detected. Furthermore, in a practical point of view, it is extremely difficult to completely prevent foreign materials from entering the device and from adhering on the scale surface for over a long period. Further, a situation can be considered where the encoder or the Z head fails to work properly, and the encoder output is cut off. Therefore, when abnormality occurs in the measurement results of the encoder and/or the Z head, a backup operation such as to switch the measurement to a measurement by interferometer system 118 from measurement by the encoder and/or the Z head in which abnormality has occurred, or to correct the measurement results of the encoder and/or the Z head in which abnormality has occurred using the measurement results of interferometer system 118 becomes necessary.

In the case of exposure apparatus 100 in the embodiment, water droplets may remain on the scale surface. For example, the liquid immersion area frequently passes over scale $39X_1$ of wafer stage WST which is adjacent to measurement stage MST when wafer stage WST and measurement stage MST form a scrum. Further, as for the other scales as well, at the time of edge shot exposure, the liquid immersion area enters a part of an area on the scale. Accordingly, the water droplets that cannot be recovered and are left on the scale may be a source which generates abnormality in the measurement results of the encoder and/or the Z head. In this case, when the encoder and/oz the Z head detect water droplets, the beam is blocked by the water droplets which reduces the beam intensity, and furthermore, the output signals are cut off (however, the output of the measurement section of the Z head is different from the output of the focus sensor, and is not cut off due to the presence of water droplets). Furthers because materials of a different refractive index are detected, linearity of the measurement results with respect to the displacement of wafer stage WST (wafer table WTB) deteriorates. The reliability of the measurement results should be inspected, on the basis of such various influences.

The abnormality of the measurement results of the encoder or the Z head can be determined from sudden temporal change of the measurement results, or from deviation or the like of the measurement results from the measurement results of a different sensor. First of all, in the former case, when the position coordinates of wafer stage WST obtained at every measurement sampling interval using the encoders or the Z head change so much from the position coordinates obtained at the time of the previous sampling that it cannot be possible when taking into considering the actual drive speed of the stage, main controller 20 decides that abnormality has occurred. In the latter case, main controller 20 predicts the individual measurement values of the encoder or the Z head from the current position of wafer stage WST, and when the deviation of the predicted measurement values from the actual measurement values exceeds a permissible level which is decided in advance, main controller 20 decides that abnormality has occurred. Further, in the embodiment, position measurement using interferometer system 118 is performed in the whole stroke area, independently from the position measurement of wafer stage WST using the encoder and the Z head. Therefore, in the case the deviation of the position coordinates of wafer stage WST obtained using the encoder or the Z head from the position coordinates of wafer stage WST obtained using interferometer system 118 exceeds a permissible level which is decided in advance, main controller 20 decides that abnormality has occurred.

By the Z head detecting, for example, a foreign material adhered on the scale surface, abnormal measurement results can be output. However, in such a case, by the movement of wafer stage WST, the output of the Z head promptly returns to the normal output. Next, a response to such a temporary abnormality output will be described.

First of all, main controller 20 predicts the measurement value of the Z head, that is, the surface position of the corresponding Y scale (measurement surface), from theoretical formulas (9) and (10) using the current position (Z, θx, θy) of wafer stage WST. By obtaining the difference between the predicted measurement value and the actual measurement value of the Z head, and furthermore, taking the average (or to be more precise, a movement average covering a predetermined number of control clocks) regarding a predetermined timer main controller 20 obtains offset Oz. This offset Oz is set to all the Z heads, and is used as an index to inspect the measurement results of the individual Z heads.

Now, a case will be considered where a Z head ZS detects a foreign material DW, which is adhered on a moving measurement target surface S0, as shown in FIGS. 30A to 30H. First of all, as shown in FIG. 30A, Z head ZS is to be in an operating state, or more specifically, in a focus servo state where the surface position of measurement target surface $S_0$ is followed. As previously described, the reflected light of probe beam LB is received by tetrameric light receiving element ZD which constitutes focus sensor FS. In the operating state, as shown in FIG. 30B, sensor main section ZH including focus sensor FS follows the surface position of measurement target surface $S_0$ so that the sectional shape of the reflected light of probe beam LB is in the form of a circle on the detection surface of tetrameric light receiving element ZD, or more specifically, so that focus error I of focus sensor FS expressed in formula (7) becomes zero (I=0). At this point in time, measurement section ZE outputs a reading value $E_0$ corresponding to the surface position of measurement target surface $S_0$ as a measured value of Z head ZS.

Next, measurement target surface $S_0$ moves in the −Y direction from the position shown in FIG. 30A, and assume that Z head ZS detects foreign material DW adhering on the surface, as shown in FIG. 30C. In this case, for the sake of simply, assume that probe beam LB is completely reflected on the surface of foreign material DW, and the principal ray of the reflected light matches the principal ray of probe beam LB. At this point, sensor main section ZH follows the actual reflection surface, or more specifically, follows surface S of foreign material DW so as to reproduce output (focus error) I=0 of focus sensor FS, or more specifically, so that the sectional shape of the reflected light on detection surface ZD is in the form of a circle, as shown in FIG. 30D. Accordingly, measurement section ZE of Z head ZS outputs reading value E corresponding to the surface position of surface S of foreign material DW as the measured value of Z head ZS.

Measured value E of Z head ZS at this point diverges greatly from the predicted measurement value of Z head ZS corresponding to the predicted surface position of measurement target surface $S_0$, or more specifically, from $E_0$. Therefore, offset Oz also becomes a large value. So, main controller 20 sets a threshold value for offset Oz, and when offset Oz exceeds the threshold value, main controller 20 decides that abnormality has occurred in the measurement results of Z head ZS and switches Z head ZS from the operating state (focus servo state) to the waiting state (scale servo state). Main controller 20 stops updating offset Oz, after switching to the waiting state.

FIG. 30E shows Z head ZS just after being changed to the waiting state. In the waiting state, sensor main section ZH is driven by the drive section (not shown) so that the focal point of probe beam LB follows the predicted surface position of measurement target surface $S_0$, or more specifically, so that measurement section ZE outputs reading value $E_0$ corresponding to the predicted surface position of measurement target surface $S_0$. At this point, the focal point of probe beam LB matches the predicted surface position of measurement target surface $S_0$, and not surface S of foreign material DW which is the actual reflection surface. Therefore, the cross section of the reflected light on detection surface ZD becomes a non-circular shape, as shown in FIG. 30F. At this points focus error I as expressed in formula (7) of the focus sensor FS is no longer zero, (I≠zero).

After switching to the waiting state, focus error I (formula (7) of focus sensor FS is monitored. In the waiting state, because the focal point of probe beam LB deviates from the actual reflection surface (surface S of foreign material DW) as described above, output I≠0. In this case, if the focal point of probe beam LB returns onto the actual reflection surface, or if the actual reflection surface is displaced and the surface position matches with the focal point of probe beam LB, output I also returns to zero. Accordingly, if output I returns to zero in the waiting state where the focal point of probe beam LB follows the predicted surface position of measurement target surface $S_0$, this indicates that the surface position of the actual reflection surface has matched with the predicted surface position of measurement target surface $S_0$. Accordingly, it can be decided that the influence due to detecting foreign material DW has been resolved.

Therefore, when it has been confirmed that the cross section of the reflected light on detection surface ZD has returned to a circular shape as shown in FIG. 30H, and output I of focus sensor FS has returned to zero or to approximately zero, main controller 20 switches Z head ZS from the waiting state (scale servo state) to the operating state (focus servo state) as shown in FIG. 30G. Main controller 20 then begins to update offset Oz again, after performing the switching to the operating state.

Incidentally, surface position information of measurement target surface $S_0$ cannot be taken out from Z head ZS in the waiting state. Therefore, main controller 20 predicts the measurement value of Z head ZS in the waiting state from the measurement results of interferometer system 118, and by substituting the predicted value, computes the position (Z, θy) of wafer stage WST.

By the handling so that the individual Z heads in which the abnormality described above is generated are made to wait, it becomes possible to perform drive control of wafer stage WST without switching all the Z heads (surface position measurement system 180) to a different sensor system. Incidentally, the threshold value with respect to offset Oz described above should be appropriately changed depending on the state of exposure apparatus 100, such as, for example, at the time of start up, reset, and exposure. Further, as in the method which will be described below, the entire Z heads (surface position measurement system 180) can be switched to another sensor system.

When abnormality is detected in the measuring instrument system, such as the output signal of Z heads $72a$ to $72d$, $74_1$ to $74_5$, and $76_1$ to $76_5$ (refer to FIG. 6) of surface position measurement system 180 being cut off, main controller 20 immediately performs a backup operation so as to switch to a servo control of the position (Z, θy) of wafer stage WST by interferometer system 118 (refer to FIG. 6) in order to prevent the servo control of the position (Z, θy) of wafer stage WST (wafer table WTB) from stopping. More specifically, main controller 20 switches the measuring instrument system used to compute the position coordinates of wafer stage WST (water table WTB) from surface position measurement system 180 (Z heads $72a$ to $72d$, $74_1$ to $74_5$, and $76_1$ to $76_5$) to interferometer system 118. On this operation, a linkage process is performed so that the position coordinates of wafer stage WST that have been computed are successive.

Figure 31:
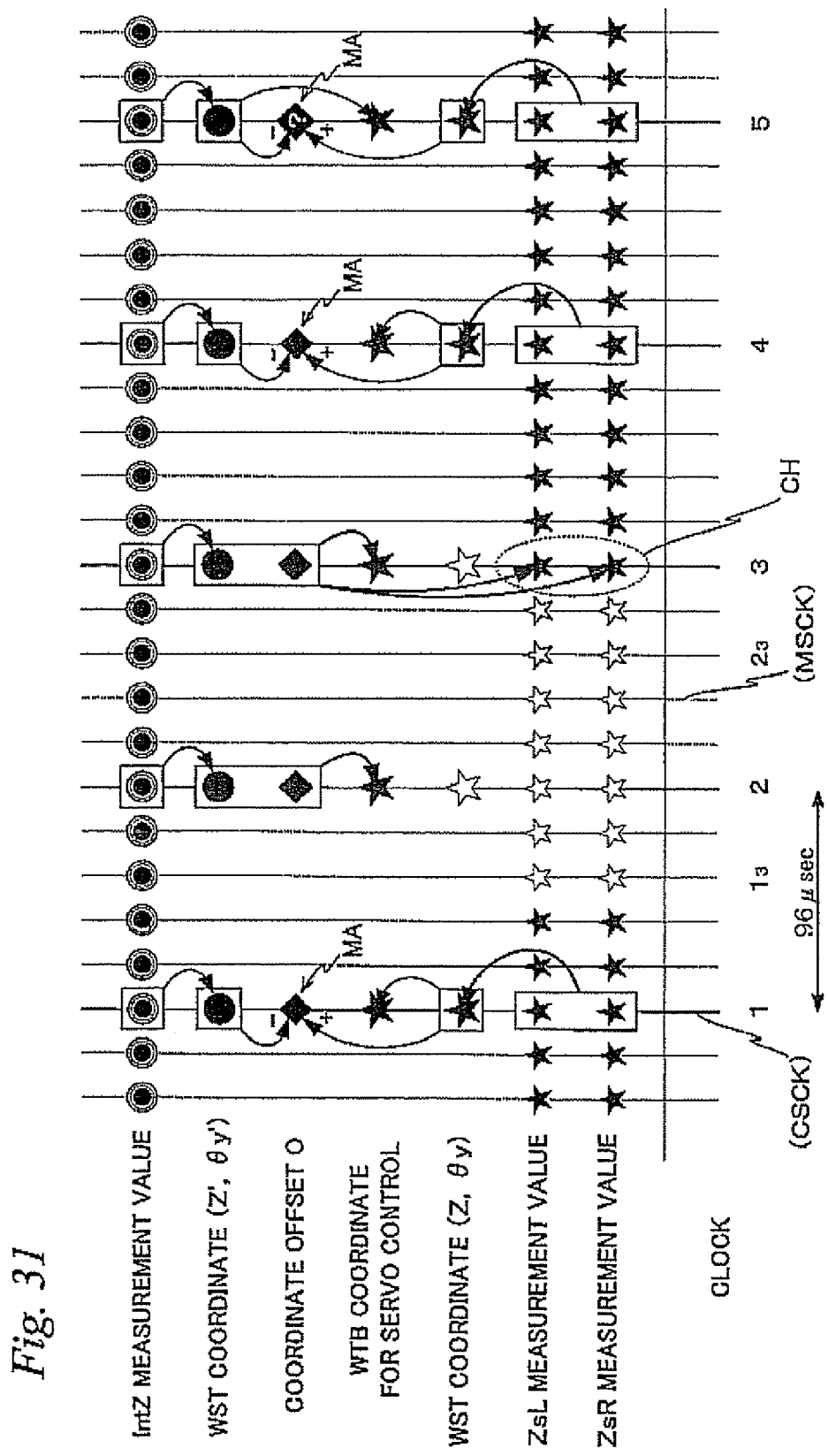
FIG. 31 is a view showing an outline of a linkage process in a switching to servo drive control of the wafer stage, from the Z head system to the interferometer system, and the interferometer system to the Z head system.

FIG. 31 is a view showing an outline of a linkage process in a switching (and a reversed switching) from servo control of the position (Z, θy) of wafer stage WST by surface position measurement system 180 to servo control of the position (Z, θy) of wafer stage WST by interferometer system 118.

First of all, main controller 20 per forms pre-processing for linkage process with respect to each control clock (CSCK). In this case, at the time of the first measurement clock (MSCK) and the like shown in FIG. 31, as shown by a solid black figure, the output signals of both the surface position measurement system 180 and interferometer system 118 are constantly monitored. However, in actual practice, the measurement clock of interferometer system 118 occurs more frequently than the measurement clock of surface position measurement system 180, however, in this case, in order to avoid complication, only the measurement clock which occurs simultaneously is shown. At the time of control clock generation, main controller 20 computes the position coordinate (Z, θy) of wafer stage WST from the measurement result of Z heads (ZsL, ZsR) (hereinafter described as surface position measurement system (ZsL, ZsR)) of surface position measurement system 180 as in FIG. 31 at the time of the first control clock generation, and also computes the position coordinate (Z', θy') of wafer stage WST from the measurement results of the interferometer system (IntZ) corresponding to the Z interferometer of interferometer system 118. Then, main controller 20 obtains the difference between the two position coordinates (Z, θy) and (Z', θy'), and takes a moving average $MA_K\{(Z, \theta y)-(Z', \theta y')\}$ for a predetermined clock number K, and keeps it as a coordinate offset O. However, in FIG. 31, the calculation of the differential moving average is indicated by reference code MA.

As previously described, this coordinate offset O can be used also as an index to judge the abnormality generation in the measurement results of the surface position measurement system (ZsL, ZsR). If an absolute value of coordinate offset O is equal to or under a permissible value decided beforehand, main controller 20 will decide that no abnormality has occurred, and if the absolute value exceeds the permissible value, then main controller 20 will decide that abnormality has occurred. At the time of the first control clock in FIG. 31, main controller 20 decides that no abnormality has occurred, therefore, uses the position coordinate (Z, θy) of wafer stage WST computed from the measurement results of the surface position measurement system (ZsL, ZsR) as the position coordinate used for the servo control of wafer stage WST.

On detecting the abnormality of the output signals of the surface position measurement system (ZsL, ZsR), main controller 20 promptly performs the linkage process to the interferometer system. In this case, assume that at the time of the $1_3$ clock in FIG. 31, abnormality occurs in the output signals of the Z head system (ZsL, ZsR), such as for example, the output signals being cut off. In FIG. 31, the state where the output signals are cut off is shown by an outlined figure. Incidentally, because scale servo previously described is possible with the Z heads of the embodiment, the output signals actually are rarely cut off, however, in this case, to simplify the description, a case is illustrated where the output signals are cut off.

Then, main controller 20 adds the coordinate offset O kept in the first control clock just before to the position coordinate (Z', θy') of wafer stage WST computed from the measurement results of the interferometer system at the time of the second control clock, so that the position coordinate coincides with the position coordinate (Z, θy) of wafer stage WST computed from the measurement results of the surface position measurement system (ZsL, ZsR) at the time of control clock (in this case, at the time of the first control clock) just before. Then, until the recovery of the output signal is detected, main controller 20 performs the servo control of the position (Z, θy) of wafer stage WST, using the position coordinate [(Z', θy')+O] to which this offset cancellation has been performed.

Incidentally, in FIG. 31, the output signals of two Z heads ZsL and ZsR were cut off at the time of the $1_3$ clock. As well as the two output signals, even in the case when one of the output signals is cut off, when the output signals supplied becomes one or less, the position coordinate of wafer stage WST cannot be computed using the theoretical formulas (11) and (12), therefore, main controller 20 performs a similar switching of the servo control of the position (Z, θy) of wafer stage WST.

And, on detecting the recovery of the output signals of the surface position measurement system (ZsL, ZsR), main controller 20 promptly performs a reverse linkage process from the interferometer system 118 to the surface position measurement system (ZsL, ZsR). In this case, assume that the output signals of Z heads ZsL and ZsR are restored at the time of the $2_3$ clock in FIG. 31. At the time of the third control clock after having detected the recovery, main controller 20 substitutes the position coordinate [(Z', θy')+O] supplied from the interferometer system to which offset cancellation has been applied into theoretical formulas (9) and (10) and computes the measurement values that each of the Z heads ZsL and ZsR are to show, and performs initialization. However, in FIG. 31, this process is shown by reference code CH. From the next fourth control clock onward, similar to the time of the first clock, main controller 20 performs the usual servo control by the surface position measurement system (ZsL, ZsR). At the same time, main controller 20 begins to update coordinate offset O again.

As a matter of course, not only in the case when the output signals from the Z heads are cut off as described above, main controller 20 performs a similar switching of the servo control of the position (Z, θy) of wafer stage WST also in the case when the reliability of the output signals is low. In this case, main controller 20 secures the reliability of the output signals by using coordinate offset O previously described as an index. At the time of the fifth control clock in FIG. 31, main controller 20 judges that the reliability has become less than a permissible level, and the position coordinate (Z', θyY) of wafer stage WST computed from the measurement results of the interferometer system is used as the position coordinate used for servo control. Incidentally, because coordinate offset O at this point of time is also unreliable, correction is to be performed using the latest coordinate offset O out of the coordinate offsets O which have been verified in the past. And, in the case when the reliability is sufficiently restored, the position coordinate (Z, θy) of wafer stage WST computed from the measurement results of the surface position measurement system (ZsL, ZsR) is used as the position coordinate used in servo control, similar to the time of the first and the fourth clocks.

When abnormality occurs in surface position measurement system 180, main controller 20 selects a suitable processing method according to the generation timing. As a processing method that can be performed frequently, the following three methods are prepared. First of all, (a) an alert of abnormality generation is issued to a user, however, the control is switched to a servo control of the position of wafer stage WST by interferometer system 118 by automatic operation without interrupting the processing. (b) An alert is issued to a user, and the user is requested to make a judgment such as, whether to continue the process believing that the backup operation has functioned normally, to switch from the servo control of the position of wafer stage WST by interferometer system 118 to the servo control according to surface position measurement system 180 (Z heads 72a to 72d, 74$_1$ to 74$_5$, and 76$_1$ to 76$_5$), to perform the focus calibration and the focus mapping all over again, or to cancel the process. (c) Perform automatic switching of the servo control of the position of wafer stage WST, without issuing an alert. Method (a) should be applied at the time of exposure, whereas method (b) should be applied at the time of focus calibration and focus mapping. Incidentally, method (c) is to be applied at the time of switching of the servo control of the position of wafer stage WST from the control by surface position measurement system 180 (Z head 72a to 72d, 74$_1$ to 74$_5$, and 76$_1$ to 76$_5$) described later on to the control by interferometer system 118.

There is a case when main controller 20 switches to a servo control of the position of wafer stage WST by interferometer system 118 (refer to FIG. 6), besides the case described above when abnormality occurs in the Z heads 72a to 72d, 74$_1$ to 74$_5$, and 76$_1$ to 76$_5$ (refer to FIG. 6). As is previously described, encoder systems 70A to 70F, and Z heads 72a to 72d, 74$_1$ to 74$_5$, and 76$_1$ to 76$_5$ are placed to measure the position coordinates of wafer stage WST (wafer table WTB) in the effective stroke area of wafer stage WST, or more specifically, in the area where the stage moves for alignment and exposure operation, and for focus mapping. However, the areas where the stage moves for loading and unloading of the wafer shown in FIGS. 14 and 15 are not covered. Accordingly, when wafer stage WST is located at the loading/unloading area, servo control of the position of wafer stage WST by interferometer system 118 is executed. Therefore, as shown in FIG. 16, when wafer stage WST passes over the effective stroke area and the loading/unloading area, main controller 20 performs the switching process of the servo control of position (X, Y, θz) and position (Z, θx) of wafer stage WST.

When wafer stage WST moves to the effective stroke area from the loading/unloading area to begin exposure, main controller 20 switches from the servo control of position (X, Y, θz) of wafer stage WST by interferometer system 118 to the servo control of position (X, Y, θz) of wafer stage WST by encoder system 150. On this switching, main controller 20 switches from the servo control of position (Z, θy) of wafer stage WST by interferometer system 118 to the servo control of position (Z, θy) of wafer stage WST by surface position measurement system 180. In this case, main controller 20 applies the coordinate linkage method, and obtains predicted measurement values $Z_L$ and $Z_R$ which the two heads to be used should output by substituting position coordinate (Z, θx, θy) of wafer stage WST computed from the measurement results of interferometer system 118 into theoretical formulas (9) and (10). Next, main controller 20 decides offsets OL and OR from the difference between the predicted measurement value and the measured value that has been obtained, and offsets OL and OR that have been determined are set with respect to two Z heads. This secures continuity of the position coordinate of wafer stage WST before and after the switching. However, because the switching process is to be executed in a state where wafer stage WST (wafer table WTB) is suspended, the continuity of the position coordinate of wafer stage WST is not necessarily required.

Meanwhile, when exposure has been completed and wafer stage WST moves from the loading/unloading area to the effective stroke area to exchange the wafer, main controller 20 switches the servo control of the position (X, Y, θz) of wafer stage WST by encoder system 150 to the servo control of the position (X, Y, θz) of wafer stage WST by interferometer system 118. At this point, main controller 20 switches from the servo control of position (Z, θy) of wafer stage WST by surface position measurement system 180 to the servo control of position (Z, θy) of wafer stage WST by interferometer system 118. The procedure is basically similar to the backup operation to switch to servo control by the interferometer system previously described. However, on the linkage process, the coordinate offset is not used to dissolve the linkage error accumulated in each switching of the Z head. More specifically, the wafer table drive control is performed using uncorrected position coordinates of wafer stage WST that are obtained from the interferometer system.

However, when the coordinate offset grows large, or more specifically, the divergence between the measurement results of interferometer system 118 and the measurement results of surface position measurement system 180 grows large, the position coordinates of wafer stage WST which is computed before and after the switching become discontinuous, and an inconvenience may occur in the servo control of position (Z, θy) of wafer stage WST. To avoid this, the following process can be carried out. (a) After the exposure has been completed, when wafer stage WST stops for the scrum state with measurement stage MST, the control is switched to servo control of position (Z, θy) of wafer stage WST by interferometer system 118. (b) Wafer stage WST moves to the unload position without performing an explicit switching process, and when the Z head output turns to be outside a predicted range (scale servo is not performed at this point), the control is switched to servo control by interferometer system 118. In the process above, as in the backup process by the interferometer system previously described, the linkage method using coordinate offset O is performed so that the position coordinates of wafer stage WST do not become discontinuous. Then, when wafer stage WST stops, such as when the wafer is unloaded, the position coordinates of wafer stage WST are to be reset to uncorrected position coordinates obtained from interferometer system 118 without using coordinate offset O.

Incidentally, at the time of focus calibration and focus mapping, the switching between the servo control of position (Z, θy) of wafer stage WST by Z heads 72a to 72d of surface position measurement system 180 and the servo control of position (Z, θy) of wafer stage WST by interferometer system 118 frequently occurs, due to the movement of wafer stage WST in the X-axis direction. Therefore, by applying the coordinate linkage method to servo control of position (Z, θy) of wafer stage WST, position coordinates of wafer stage WST whose continuity has been secured before and after the switching is used. And, for focus calibration and focus mapping, position coordinates of wafer stage WST obtained from the measured results of surface position measurement system 180 is used. This handling eliminates the influence that the linkage error may have on focus calibration and focus mapping.

Incidentally, so far, in order to simplify the description, while main controller 20 performed the control of each part of the exposure apparatus including the control of the stage system (such as reticle stage RST and wafer stage WST), interferometer system 119, encoder system 150, surface position measurement system 180 and the like, as a matter of course, at least a part of the control of main controller 20 described above can be performed shared by a plurality of controllers. For example, a stage controller which performs operations such as the control of the stage, switching of the heads of encoder system 150 and surface position measurement system 180 can be arranged to operate under main controller 20. Further, the control that main controller 20 performs does not necessarily have to be realized by hardware, and main controller 20 can realize the control by software according to a computer program that sets each operation of some controllers that perform the control sharing as previously described.

As discussed in detail above, according to exposure apparatus 100 of the embodiment, main controller 20 drives wafer stage WST in the Z-axis direction and the tilt direction (θy direction) with respect to the XY planer based on measurement value (detection information) of surface position measurement system 180, and also updates relation information between a first positional information of wafer stage WST computed from measurement values (detection information) of surface position measurement system 180 and a second positional information of wafer stage WST computed from measurement values (detection information) of interferometer system 118 at every predetermined timing, and when main controller 20 detects that abnormality has occurred in the output of surface position measurement system 180, switches the detection device used for drive control (servo control of the position) of wager stage WST in the Z-axis direction and the tilt direction (θy direction) with respect to the XY plane from surface position measurement system 180 to interferometer system 118. Accordingly, backup according to interferometer system 118, in which output abnormality is remarkably hard to occur when compared with surface position measurement system 180 from the measurement principle, becomes possible at the time of generation of output abnormality in surface position measurement system 180.

Further, according to exposure apparatus 100, on switching from servo control of the position related to the X, Y, and θz directions of wafer table WTB (wafer stage WST) using interferometer system 118 (X interferometer 128 and Y interferometer 16) to servo control of the position related to the X, Y, and θz directions of wafer stage WST using encoder system 150, when wafer stage WST is in a suspended state, main controller 20 switches the detection device which detects positional information of wafer stage WST in the Z direction and θy direction from interferometer system 118 (Z interferometers 43R and 43B) to surface position measurement system 180. Further, on switching from servo control of the position related to the X, Y, and θz directions of wafer stage WST using encoder system 150 to servo control of the position related to the X, Y, and θz directions of wafer stage WST using interferometer system 118 (X interferometer 128 and Y interferometer 16), at the point where wafer stage WST is suspended, main controller 20 switches the detection device which detects positional information of wafer stage WST in the Z direction and θy direction from surface position measurement system 180 to interferometer system 118 (Z interferometers 43A and 43B). Therefore, even if discontinuity occurs between the position of wafer stage WST related to the X, Y, and θz directions computed using detection information of surface position measurement system 180 and the position of wafer stage WST related to the X, Y, and θz directions computed using detection information of interferometer system 118 (Z interferometers 43A and 43B), switching from interferometer system 118 (Z interferometers 43A and 43B) to surface position measurement system 180 or switching in a reversed order can be performed without any trouble.

As described above, in exposure apparatus 100 related to the embodiment, normally, on operation which requires precision such as exposure and focus napping, the position of wafer stage WST in the Z-axis direction and θy direction is controlled with high precision using surface position measurement system 180, and when abnormality has occurred in the output of surface position measurement system 180, drive control of wafer stage WST can be continued according to the backup of interferometer system 118.

Further, according to exposure apparatus 100 of the embodiment, by transferring and forming the pattern of reticle R in each shot area on wafer W mounted on wafer stage WST (wafer table WTB) which is driven with good precision as described above, it becomes possible to form a pattern with good precision in each shot area on wafer W. Furthers according to exposure apparatus 100 of the embodiment, by performing the focus leveling control of the wafer with high accuracy during scanning exposure using the Z heads without measuring the surface position information of the wafer W surface during exposure, based on the results of focus mapping performed beforehand, it becomes possible to form a pattern on wafer W with good precision. Furthermore, in the embodiment, because a high-resolution exposure can be realized by liquid immersion exposure, a fine pattern can be transferred with good precision on wafer W also from this viewpoint.

Incidentally, in the embodiment above, when focus sensor FS of each Z head performs the focus-servo previously described, the focal point may be on the cover glass surface protecting the diffraction grating surface formed on Y scales $39Y_1$ and $39Y_2$, however, it is desirable for the focal point to be on a surface further away than the cover glass surface, such as, on the diffraction grating surface. With this arrangement, in the case foreign material (dust) such as particles is on the cover glass surface and the cover glass surface becomes a surface which is defocused by the thickness of the cover glass, the influence of the foreign material is less likely to affect the Z heads.

In the embodiment above, the surface position measurement system which is configured having a plurality of Z heads arranged exterior to wafer stage WST (the upper part) in the operating range (a range where the device moves in the actual sequence in the movement range) of wafer stage WST and detects the Z position of the wafer table WTB (Y scales $39Y_1$ and $39Y_2$) surface with each Z head was employed, however, the present invention is not limited to this. For example, a plurality of Z heads can be placed on the upper surface of a movable body (for example, wafer stage WST in the case of the embodiment above), and a detection device, which faces the heads and has a reflection surface arranged outside the movable body that reflects the probe beam from the Z heads, can be employed, instead of surface position measurement system 180.

Further, in the embodiment above, an example has been described where the encoder system is employed that has a configuration where a grid section (a Y scale and an X scale) is arranged on a wafer table (a wafer stage), and X heads and Y heads facing the grid section are placed external to the wafer stage, however, the present invention is not limited to this, and an encoder system which is configured having an encoder head arranged on the movable body and has a two-dimensional grid (or a linear grid section having a two-dimensional placement) facing the encoder heads placed external to the wafer stage can also be adopted. In this case, when Z heads are also to be placed on the movable body upper surface, the two-dimensional grid (or the linear grid section having a two-dimensional placement) can also be used as a reflection surface that reflects the probe beam from the Z heads.

Further, in the embodiment above, the case has been described where each Z head is equipped with sensor main section ZH (the first sensor) which houses focus sensor FS and is driven in the Z-axis direction by the drive section (not shown), measurement section ZE (the second sensor) which measures the displacement of the first sensor (sensor main section ZH) in the Z-axis direction, and the like as shown in FIG. 7, however, the present invention is not limited to this. More specifically, with the Z head (the sensor head), the first sensor itself does not necessarily have to be movable in the Z-axis direction, as long as a part of the member configuring the first sensor (for example, the focus sensor previously described) is movable, and the part of the member moves according to the movement of the movable body in the Z-axis direction so that the optical positional relation (for example, a conjugate relation of the light receiving elements within the first sensor with the photodetection surface (detection surface)) of the first sensor with the measurement object surface is maintained. In such a case, the second sensor measures the displacement in the movement direction from a reference position of the movable member. As a matter of course, in the case a sensor head is arranged on the movable body, the movable member should be moved so that the optical positional relation of the measurement object of the first sensor, such as, for example, the two-dimensional grid described above (or the linear grid section having a two-dimensional placement) and the like with the first sensor is maintained, according to the position change of the movable body in a direction perpendicular to the two-dimensional plane.

Further, in the embodiment above, while the case has been described where the surface position of the measurement target surface is measured in a focus servo control state, in which the Z head in a first control state, or more specifically, sensor main section ZH (the first sensor) which houses focus sensor FS as shown in FIG. 7 is driven in the Z-axis direction by the drive section (not shown), and displacement in the Z-axis direction of the first sensor in this state is measured, using measurement section ZE (the second sensor), the present invention is not limited to this. More specifically, the surface position of the measurement target surface can be measured in the scale servo control state where the position of the first sensor in the Z-axis direction is controlled according to the second control state, that is, the measurement results of the second sensor, using the drive section (not shown), and the output signals (focus error I) of the first sensor are measured in such a state. In accordance with the same principle, instead of the Z head, a Z head with the first sensor fixed, or a sensor head configured only from the first sensor and does not include the drive section (not shown) and the second sensor can be used. Further, instead of the Z head, as well as the focus sensor by an optical pickup method, a displacement sensor head which can measure the displacement of the subject can be used.

Further, in the embodiment above, while the case has been described where the encoder head and the Z head are separately arranged, besides such a case, for example, a head that has both functions of the encoder head and the Z head can be employed, or an encoder head and a Z head that have a part of the optical system in common can be employed, or a combined head which is integrated by arranging the encoder head and the Z head within the same housing can also be employed.

Incidentally, in the embodiment above, while the lower surface of nozzle unit 32 and the lower end surface of the tip optical element of projection optical system PL were on a substantially flush surface, as well as this, for example, the lower surface of nozzle unit 32 can be placed nearer to the image plane (more specifically, to the wafer) of projection optical system PL than the outgoing surface of the tip optical element. That is, the configuration of local liquid immersion unit 8 is not limited to the configuration described above, and the configurations can be used, which are described in, for example, EP Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), the pamphlet of International Publication No. 2004/086468 (the corresponding U.S. Patent Application Publication No. 2005/0280791), the U.S. Pat. No. 6,952,253, and the like. Further, as disclosed in the pamphlet of International Publication No. 2004/019128 (the corresponding U.S. Patent Application Publication No. 2005/0248856), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) was used as the liquid, however, it is a matter of course that the present invention is not limited to this. As the liquid, liquid that is chemically stable, having high transmittance to illumination light IL and safe to use, such as a fluorine-containing inert liquid may be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decade, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No 2005/059618 can be used.

Further, in the embodiment above, the recovered liquid may be reused, and in this case, a filter that removes impurities from the recovered liquid is preferably arranged in a liquid recovery unit, a recovery pipe or the like.

Incidentally, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

Further, in the embodiment above, the case has been described where the present invention is applied to a scanning exposure apparatus by a step-and-scan method or the like. However, the present invention is not limited to this, but may also be applied to a static exposure apparatus such as a stepper. Further, the present invention can also be applied to a reduction projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with a plurality of wafer stage WSTs, as is disclosed in, for example, the U.S. Pat. No. 6,590,634, the U.S. Pat. No. 5,969, 441, the U.S. Pat. No. 6,208,407 and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catodioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, exposure area IA may also be an off-axis area that does not include optical axis AX, similar to a so-called inline type catodioptric system, in part of which an optical system (catoptric system or catodioptric system) that has plural reflection surfaces and forms an intermediate image at least once is arranged, and which has a single optical axis. Further, the illumination area and exposure area described above are to have a rectangular shape. However, the shape is not limited to rectangular, and can also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating unit of a YAG laser or the like can also be used. Besides the sources above, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm) and uses a total reflection reduction optical system designed under the exposure wavelength (for example, 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micro-machines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body drive system and the movable body drive method of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus of a sample or a wire bonding apparatus in other precision machines.

Incidentally, the disclosures of the various publications (descriptions), the pamphlets of the International Publications, and the U.S. Patent Application Publication descriptions and the U.S. Patent descriptions that are cited in the embodiment above and related to exposure apparatuses and the like are each incorporated herein by reference.

Semiconductor devices are manufactured through the following steps: a step where the function/performance design of the wafer is performed, a step where a wafer is made using silicon materials, a lithography step where the pattern formed on the reticle (mask) by the exposure apparatus (pattern formation apparatus) in the embodiment previously described is transferred onto a wafer, a development step where the wafer that has been exposed is developed, an etching step where an exposed member of an area other than the area where the resist remains is removed by etching, a resist removing step where the resist that is no longer necessary when etching has been completed is removed, a device assembly step (including processes such as a dicing process, a bonding process, and a packaging process), inspection steps and the like.

By using the device manufacturing method of the embodiment described above, because the exposure apparatus (pattern formation apparatus) in the embodiment above and the exposure method (pattern formation method) thereof are used in the exposure step, exposure with high throughput can be performed while maintaining the high overlay accuracy. Accordingly, the productivity of highly integrated microdevices on which fine patterns are formed can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A movable body drive method in which a movable body is driven substantially along a two-dimensional plane, the method comprising:
    a first process in which positional information of the movable body related to at least one of a direction perpendicular to the two-dimensional plane and a tilt direction with respect to the two-dimensional plane is detected, using a first detection device that has one, or more than one detection positions placed in at least a part of an operating area of the movable body, and detects positional information of the movable body in the direction perpendicular to the two-dimensional plane using detection information detected when the movable body is positioned at any one of the detection points, and a second detection device that detects positional information of the movable body in the direction perpendicular to the two-dimensional plane from measurement results using a measurement beam irradiated along the two-dimensional plane between the outside of the operating area of the movable body and the movable body, and the movable body is driven in at least one of the direction perpendicular to the two-dimensional plane and the tilt direction with respect to the two-dimensional plane based on detection results of the first detection device;
    a second process in which relation information between a first positional information of the movable body computed from detection information of the first detection device and a second positional information of the movable body computed from detection in formation of the second detection device is updated at every predetermined timing; and
    a third process in which when abnormality occurring in an output of the first detection device has been detected, the detection device used for drive control of the movable body in at least one of the direction perpendicular to the two-dimensional plane and the tilt direction with respect to the two-dimensional plane is switched from the first detection device to the second detection device.

2. The movable body drive method according to claim 1 wherein
    in the third process, the detection devices is switched from the first detection device to the second detection device whose second position coordinate has been corrected, so that the second position coordinate of the movable body in an $n^{th}$ order coordinate system computed from detection information of the first detection device just before becomes successive to a first position coordinate computed from the detection information of the movable body in at least a direction of one degree of freedom in the $n^{th}$ order coordinate system (n is a natural number of three or less), among a direction perpendicular to the two-dimensional plane and rotational directions around two axes orthogonal to the two-dimensional plane.

3. The movable body drive method according to claim 2 wherein
    the relation information is offset information associated with a difference between the first position coordinate and the second position coordinate of the movable body.

4. The movable body drive method according to claim 3 wherein
    the relation information is a moving average regarding a predetermined number of control clocks of the difference.

5. The movable body drive method according to claim 1, the method further comprising:
    an inspection process in which reliability of the detection information of the first detection device is inspected, using the relation information.

6. The movable body drive method according to claim 5 wherein
    in the third process, when abnormality that has occurred in the output of the first detection device has been detected, the second positional information of the movable body computed by the detection information of the second detection device at the time of occurrence is corrected, using the relation information which has been confirmed normal at the time of a preceding inspection.

7. The movable body drive method according to claim 1, the method further comprising:
    a return process in which the detection device used for drive control of the movable body in at least one of the direction perpendicular to the two-dimensional plane and the tilt direction with respect to the two-dimensional plane is returned from the second detection device to the first detection device at a predetermined timing, when the movable body is driven in at least one of the direction perpendicular to the two-dimensional plane and the tilt direction with respect to the two-dimensional plane based on the detection results of the second detection device.

8. The movable body drive method according to claim 7 wherein
    reliability of the detection information of the first detection device is inspected using the relation information, and as a result of the inspection, when the reliability has been confirmed, return from the second detection device to the first detection device is performed.

9. The movable body drive method according to claim 1 wherein
    the abnormality is absence of output from the first detection device, or the output from the first detection device exceeding a predetermined threshold value.

10. The movable body drive method according to claim 1 wherein
    as the first detection device, a detection device is used that has a plurality of sensor heads detecting positional information of a surface of the movable body substantially parallel to the two-dimensional plane in a direction perpendicular to the two-dimensional plane, with a reference plane parallel to the two-dimensional plane serving as a reference, when the movable body is positioned at each detection position in a plurality of different detection positions within an operating area of the movable body, and each sensor head includes a first sensor including a movable member which moves to maintain an optical positional relation with a measurement subject according to a positional change of the movable member in the direction perpendicular to the two-dimensional plane when the surface of the movable body is located at each detection position, and a second sensor which detects the displacement of the movable member from a reference point.

11. A pattern formation method to form a pattern on an object wherein a movable body on which the object is mounted is driven using the movable body drive method according to claim 1 to perform pattern formation to the object.

12. The pattern formation method according to claim 11 wherein the object has a sensitive layer, and a pattern is formed on the object by an exposure of the sensitive layer by irradiation of an energy beam.

13. A device manufacturing method including a pattern formation process wherein in the pattern formation process, a pattern is formed on a substrate using the pattern formation method according to claim 11.

14. An exposure method in which a pattern is formed on an object by an irradiation of an energy beam wherein for relative movement of the energy beam and the object, a movable body on which the object is mounted is driven, using the movable body drive method according to claim 1.

15. A movable body drive system in which a movable body is driven substantially along a two-dimensional plane, the system comprising:

a first detection device that has ones or more than one detection positions placed in at least a part of an operating area of the movable body, and detects positional information of the movable body in a direction perpendicular to the two-dimensional plane using detection information detected when the movable body is positioned at any one of the detection points;

a second detection device that detects positional information of the movable body in the direction perpendicular to the two-dimensional plane from measurement results using a measurement beam irradiated along the two-dimensional plane between the outside of the operating area of the movable body and the movable body; and a controller that drives the movable body at least one of a direction perpendicular to the two-dimensional plane and a tilt direction with respect to the two-dimensional plane based on detection results of the first detection device, and also updates relation information between a first positional information of the movable body computed from detection information of the first detection device and a second positional information of the movable body computed from detection information of the second detection device at every predetermined timing, and when abnormality occurring in the output of the first detection device is detected, switches a detection device used for drive control of at least one of the direction perpendicular to the two-dimensional plane and a tilt direction with respect to the two-dimensional plane from the first detection device to the second detection device.

16. The movable body drive system according to claim 15 wherein the controller performs switching from the first detection device to the second detection device whose second position coordinate has been corrected, so that the second position coordinate of the movable body in an $n^{th}$ order coordinate system computed from detection information of the first detection device just before becomes successive to a first position coordinate computed from the detection information of the movable body in at least a direction of one degree of freedom in the $n^{th}$ order coordinate system (n is a natural number of three or less), among a direction perpendicular to the two-dimensional plane and rotational directions around two axes orthogonal to the two-dimensional plane.

17. The movable body drive system according to claim 16 wherein the relation information is offset information associated with a difference between the first position coordinate and the second position coordinate of the movable, body.

18. The movable body drive system according to claim 17 wherein the relation information is a moving average regarding a predetermined number of control clocks of the difference.

19. The movable body drive system according to claim 15 wherein the controller inspects reliability of the detection information of the first detection device, using the relation information.

20. The movable body drive system according to claim 19 wherein when abnormality that has occurred in the output of the first detection device has been detected, the controller corrects the second positional information of the movable body computed by the detection information of the second detection device at the time of occurrence, using the relation information which has been confirmed normal at the time of a preceding inspection.

21. The movable body drive system according to claim 15 wherein the controller returns the detection device used for drive control of the movable body in at least one of the direction perpendicular to the two-dimensional plane and the tilt direction with respect to the two-dimensional plane from the second detection device to the first detection device at a predetermined timing, when the movable body is driven in at least one of the direction perpendicular to the two-dimensional plane and the tilt direction with respect to the two-dimensional plane based on the detection results of the second detection device.

22. The movable body drive system according to claim 21 wherein the controller inspects reliability of the detection information of the first detection device using the relation information, and as a result of the inspection, when the reliability has been confirmed, performs return from the second detection device to the first detection device.

23. The movable body drive system according to claim 15 wherein the abnormality is absence of output from the first detection device, or the output from the first detection device exceeding a predetermined threshold value.

24. The movable body drive system according to claim 15 wherein the first detection device has a plurality of sensor heads detecting positional information of a surface of the movable body substantially parallel to the two-dimensional plane in a direction perpendicular to the two-dimensional plane, with a reference plane parallel to the two-dimensional plane serving as a reference, when the movable body is positioned at each detection position in a plurality of different detection positions within an operating area of the movable body, and each sensor head includes a first sensor including a movable member which moves to maintain an optical positional relation with a measurement subject according to a positional change of the movable member in the direction perpendicular to the two-dimensional plane when the surface of the movable body is located at each detection position, and a second sensor which detects the displacement of the movable member from a reference point.

25. A pattern forming apparatus that forms a pattern on an object, the apparatus comprising:
 a patterning device which generates a pattern on the object; and
 a movable body drive system according to claim 16, wherein
 drive of a movable body on which the object is mounted is performed by the movable body drive system for pattern formation with respect to the object.

26. The pattern formation apparatus according to claim 25 wherein
 the object has a sensitive layer, and the patterning device generates a pattern on the object by an exposure of the sensitive layer by irradiation of an energy beam.

27. An exposure apparatus that forms a pattern on an object by an irradiation of an energy beam, the apparatus comprising:
 a patterning device that irradiates the energy beam on the object; and
 a movable body drive system according to claim 15, wherein
 the movable body drive system drives the movable body on which the object is mounted for relative movement of the energy beam and the object.

* * * * *